(12) United States Patent
Suzuki et al.

(10) Patent No.: US 11,903,215 B2
(45) Date of Patent: Feb. 13, 2024

(54) SEMICONDUCTOR MEMORY DEVICE

(71) Applicant: KIOXIA CORPORATION, Tokyo (JP)

(72) Inventors: Kunifumi Suzuki, Yokkaichi (JP); Yuuichi Kamimuta, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 92 days.

(21) Appl. No.: 17/654,654

(22) Filed: Mar. 14, 2022

(65) Prior Publication Data

US 2023/0084292 A1   Mar. 16, 2023

(30) Foreign Application Priority Data

Sep. 10, 2021 (JP) ................................. 2021-147983

(51) Int. Cl.
  *G11C 16/04* (2006.01)
  *H10B 51/20* (2023.01)
  *G11C 11/22* (2006.01)
  *H10B 41/27* (2023.01)
  *H10B 43/27* (2023.01)

(52) U.S. Cl.
  CPC ............ *H10B 51/20* (2023.02); *G11C 11/223* (2013.01); *G11C 11/2275* (2013.01); *H10B 41/27* (2023.02); *H10B 43/27* (2023.02)

(58) Field of Classification Search
  CPC .................................................. G11C 16/0483
  See application file for complete search history.

(56) References Cited

U.S. PATENT DOCUMENTS

| 6,707,082 | B2 | 3/2004 | Haneder et al. |
| 9,362,487 | B2 | 6/2016 | Inumiya et al. |
| 10,453,862 | B1 | 10/2019 | Dong et al. |
| 11,195,858 | B2 | 12/2021 | Suzuki et al. |
| 2018/0331116 | A1* | 11/2018 | Tezuka ................ H01L 29/4234 |
| 2021/0082957 | A1 | 3/2021 | Sakuma et al. |

FOREIGN PATENT DOCUMENTS

| JP | 11-31792 A | 2/1999 |
| JP | 2003-510848 A | 3/2003 |
| JP | 2014-53571 A | 3/2014 |
| JP | 2021-44510 A | 3/2021 |
| JP | 2021-48214 A | 3/2021 |

* cited by examiner

*Primary Examiner* — Jason Lappas
(74) *Attorney, Agent, or Firm* — Oblon, McClelland, Maier & Neustadt, L.L.P.

(57) ABSTRACT

A semiconductor memory device includes: a first semiconductor layer extending in a first direction; a first conductive layer and a second conductive layer that are arranged in the first direction and each opposed to the first semiconductor layer; a first insulating portion disposed between the first semiconductor layer and the first conductive layer, the first insulating portion containing oxygen (O) and hafnium (Hf); a second insulating portion disposed between the first semiconductor layer and the second conductive layer, the second insulating portion containing oxygen (O) and hafnium (Hf); and a first charge storage layer disposed between the first insulating portion and the second insulating portion, the first charge storage layer being spaced from the first conductive layer and the second conductive layer.

15 Claims, 42 Drawing Sheets

SEMICONDUCTOR MEMORY DEVICE

CROSS-REFERENCE TO RELATED APPLICATIONS

This application is based upon and claims the benefit of Japanese Patent Application No. 2021-147983, filed on Sep. 10, 2021, the entire contents of which are incorporated herein by reference.

BACKGROUND

Field

Embodiments described herein relate generally to a semiconductor memory device.

Description of the Related Art

There has been known a semiconductor memory device that includes a plurality of memory transistors. These plurality of memory transistors include gate insulating layers each including, for example, an insulating charge storage layer of silicon nitride ($Si_3N_4$) or the like, a conductive charge storage layer of floating gate or the like, or a memory portion of a ferroelectric layer or the like configured to store data.

DETAILED DESCRIPTION

Figure 1:
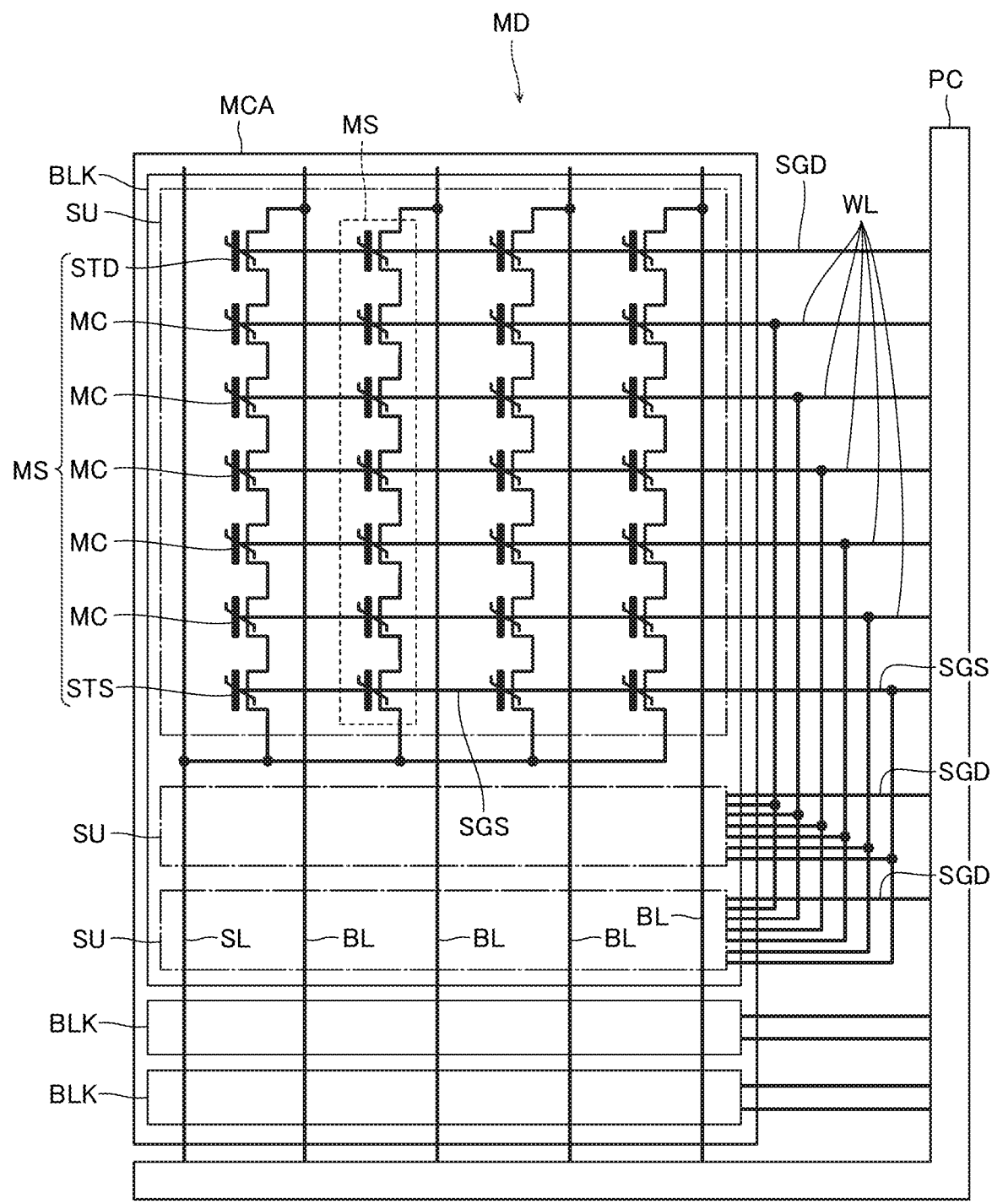
FIG. 1 is a schematic circuit diagram illustrating apart of a configuration of a semiconductor memory device according to a first embodiment.

A semiconductor memory device according to one embodiment comprises: a first semiconductor layer extending in a first direction; a first conductive layer and a second conductive layer that are arranged in the first direction and each opposed to the first semiconductor layer; a first insulating portion disposed between the first semiconductor layer and the first conductive layer, the first insulating portion containing oxygen (O) and hafnium (Hf); a second insulating portion disposed between the first semiconductor layer and the second conductive layer, the second insulating portion containing oxygen (O) and hafnium (Hf); and a first charge storage layer disposed between the first insulating portion and the second insulating portion, the first charge storage layer being spaced from the first conductive layer and the second conductive layer.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

A "control circuit" in this specification may mean a peripheral circuit, such as a sequencer, disposed in a memory die, may mean a controller die, a controller chip, or the like connected to a memory die, and may mean a configuration including both of them.

In this specification, when it is referred that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

In this specification, when referring to a "width", a "length", a "thickness", or the like in a predetermined direction of a configuration, a member, or the like, this may mean a width, a length, a thickness, or the like in a cross-sectional surface or the like observed with a Scanning electron microscopy (SEM), a Transmission electron microscopy (TEM), or the like.

First Embodiment

Circuit Configuration of Memory Die MD

FIG. 1 is a schematic circuit diagram illustrating a part of a configuration of a memory die MD according to the first embodiment. As illustrated in FIG. 1, the memory die MD includes a memory cell array MCA that stores data and a peripheral circuit PC connected to the memory cell array MCA.

As illustrated in FIG. 1, the memory cell array MCA includes a plurality of memory blocks BLK. These plurality of memory blocks BLK each include a plurality of string units SU. These plurality of string units SU each include a plurality of memory strings MS. These plurality of memory strings MS have one ends connected to the peripheral circuit PC via a respective plurality of electrically independent bit lines BL. These plurality of memory strings MS have the other ends each connected to the peripheral circuit PC via electrically common one source line SL.

The memory string MS includes a drain-side select transistor STD, a plurality of memory cells MC (memory transistors), and a source-side select transistor STS, which are connected in series between the bit line BL and the source line SL. Hereinafter, the drain-side select transistor STD and the source-side select transistor STS may be simply referred to as select transistors (STD, STS).

The memory cell MC is a field-effect type transistor including a semiconductor layer that functions as a channel region, a gate insulating layer including a memory portion, and a gate electrode. A threshold voltage of the memory cell MC varies corresponding to the state of the memory portion. The memory cell MC stores data of 1 bit or a plurality of bits. The gate electrodes of the plurality of memory cells MC corresponding to one memory string MS are connected to respective word lines WL. Each of these word lines WL is commonly connected to all of the memory strings MS in one memory block BLK.

The select transistors (STD, STS) are field-effect type transistors each including a semiconductor layer that functions as a channel region, a gate insulating layer, and a gate electrode. The gate electrodes of the select transistors (STD, STS) are connected to select gate lines (SGD, SGS), respectively. The drain-side select gate line SGD is disposed corresponding to the string unit SU, and commonly connected to all of the memory strings MS in one string unit SU. The source-side select gate line SGS is commonly connected to all of the memory strings MS in the memory block BLK.

The peripheral circuit PC includes, for example, a voltage generation circuit that generates an operating voltage and outputs it to a voltage supply line, a decode circuit that electrically conducts a desired voltage supply line with the bit line BL, the source line SL, the word line WL, and the select gate lines (SGD, SGS), a sense amplifier circuit that senses a current or a voltage of the bit line BL, and a sequencer that controls these circuits.

Structure of Memory Die MD

Figure 2:
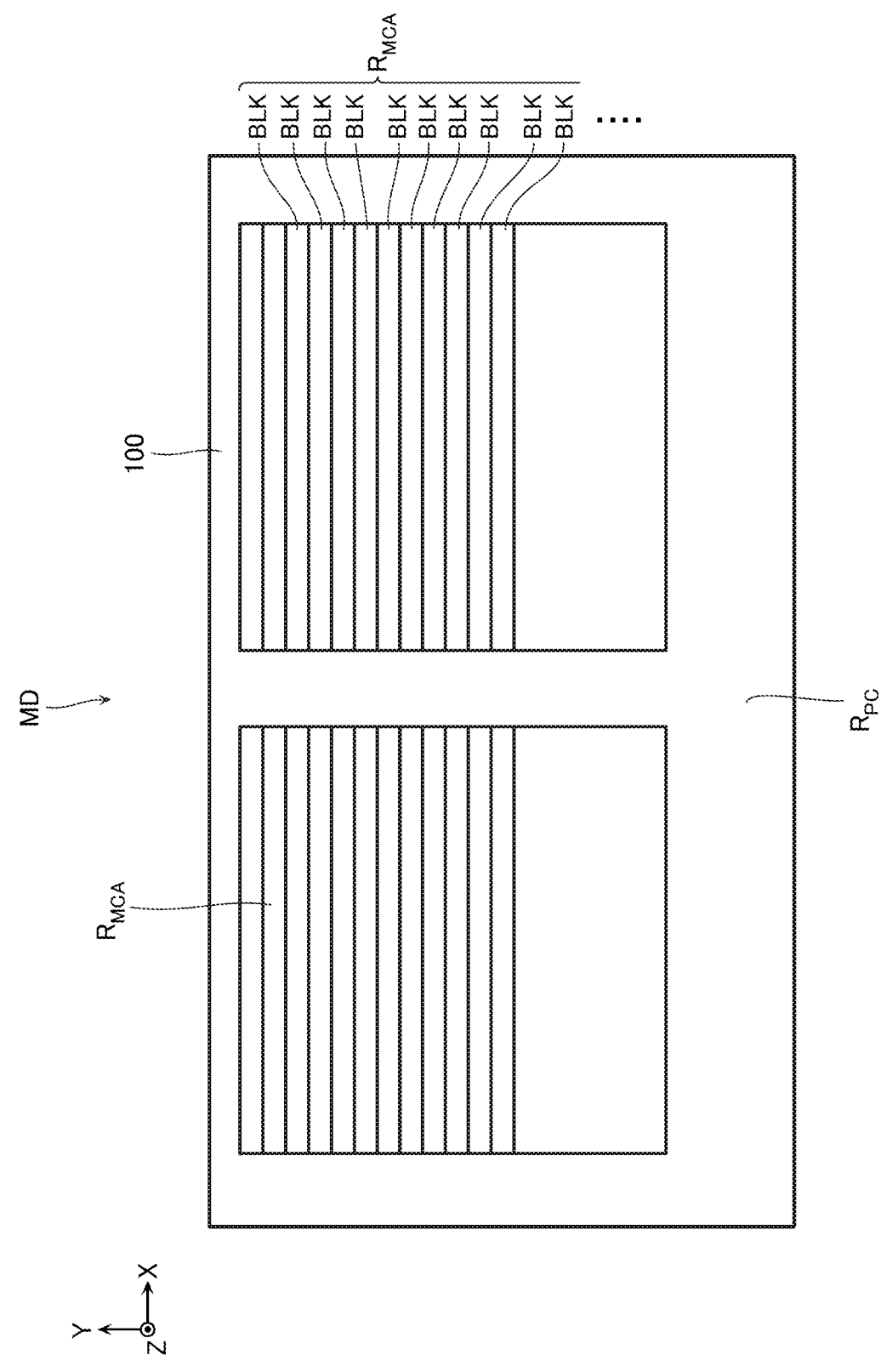
FIG. 2 is a schematic plan view of the semiconductor memory device.

FIG. 2 is a schematic plan view of the memory die MD. As illustrated in FIG. 2, the memory die MD includes a semiconductor substrate 100. In the illustrated example, the semiconductor substrate 100 includes two memory cell array regions $R_{MCA}$ arranged in the X-direction. The memory cell array region $R_{MCA}$ includes a plurality of memory blocks BLK arranged in the Y-direction. At an end portion of the semiconductor substrate 100 in the Y-direction, a peripheral circuit region $R_{PC}$ is disposed.

Figure 3:
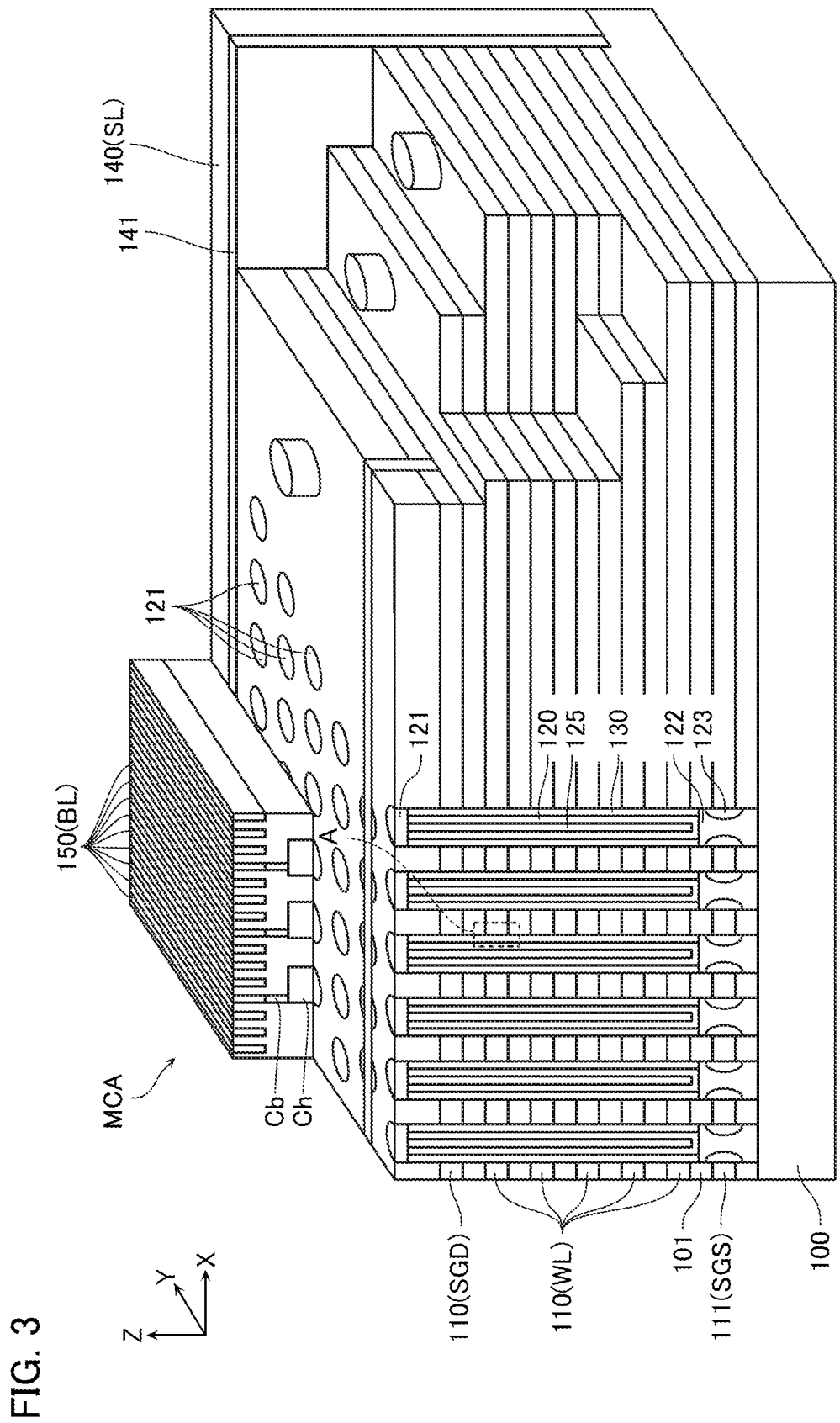
FIG. 3 is a schematic perspective view illustrating a part of the configuration of the semiconductor memory device.
Figure 4:
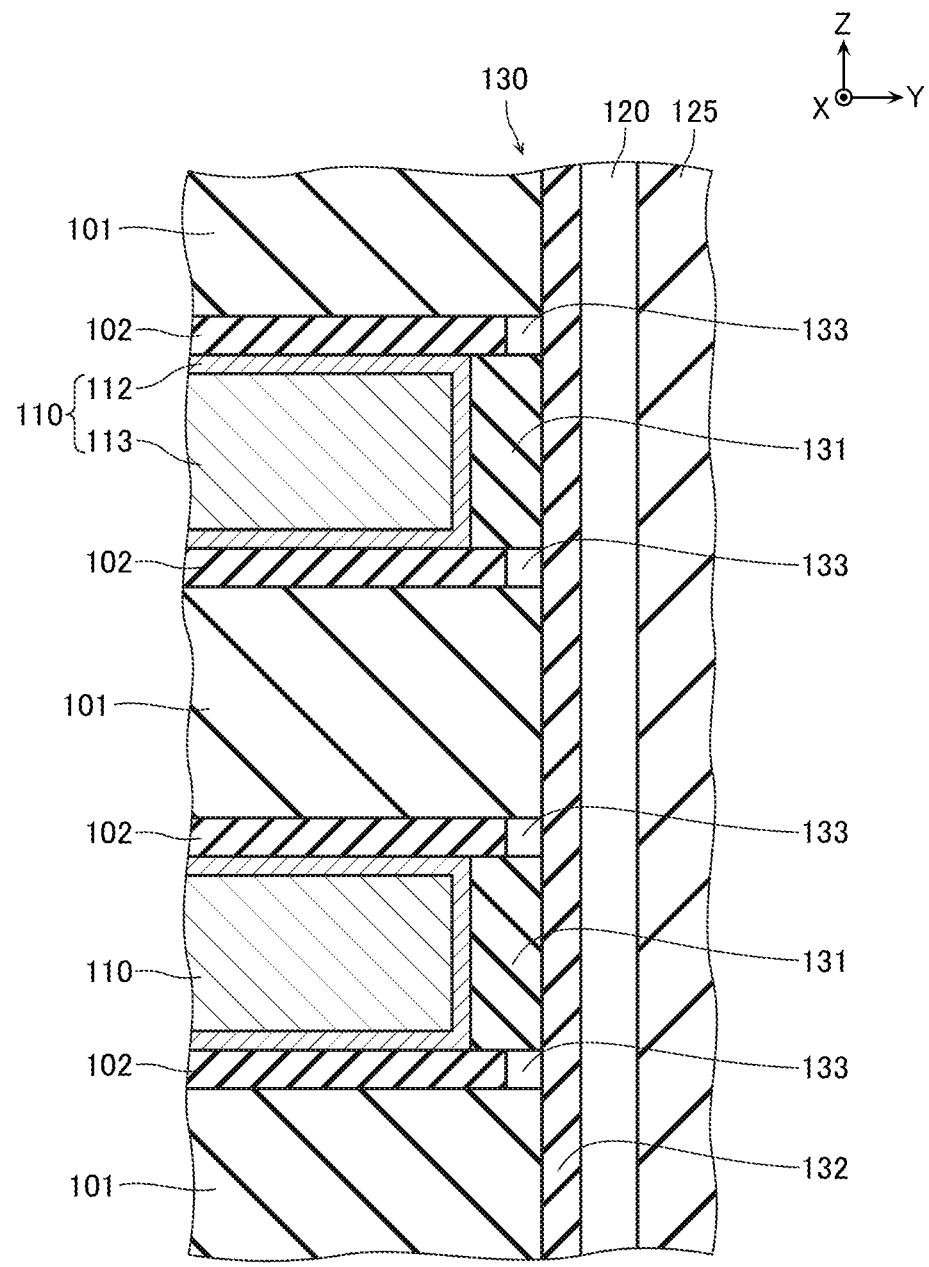
FIG. 4 is a schematic enlarged cross-sectional view of a part indicated by A in FIG. 3.

FIG. 3 is a schematic perspective view illustrating a part of the configuration of the memory die MD. FIG. 4 is a schematic enlarged cross-sectional view of a part indicated by A in FIG. 3.

As illustrated in FIG. 3, the memory die MD according to the embodiment includes a plurality of conductive layers 110 arranged in the Z-direction above the semiconductor substrate 100, a plurality of semiconductor layers 120 extending in the Z-direction, a plurality of gate insulating layers 130 disposed between the plurality of conductive layers 110 and the plurality of semiconductor layers 120 respectively, a conductive layer 140 connected to the semiconductor substrate 100, and a conductive layer 150 disposed above these configurations.

The semiconductor substrate 100 is, for example, a semiconductor substrate formed of P-type silicon (Si) containing P-type impurities, such as boron (B). On a surface of the semiconductor substrate 100, for example, an N-type well region containing N-type impurities, such as phosphorus (P), a P-type well region containing P-type impurities, such as boron (B), and a semiconductor substrate region in which the N-type well region or the P-type well region is not disposed are disposed. The N-type well region, the P-type well region, and the semiconductor substrate region each function as a part of a plurality of transistors, a plurality of capacitors, and the like constituting the peripheral circuit PC.

The conductive layer 110 is an approximately plate-shaped conductive layer extending in the X-direction. The conductive layer 110 may include, for example, as illustrated in FIG. 4, a stacked film of a barrier conductive film 112 of titanium nitride (TiN) or the like and a metal film 113 of tungsten (W) or the like. For example, the conductive layer 110 may contain polycrystalline silicon containing impurities, such as phosphorus (P) or boron (B). Between the respective adjacent conductive layers 110 arranged in the Z-direction, insulating layers 101 of silicon oxide ($SiO_2$) or the like are disposed. As illustrated in FIG. 4, in this embodiment, insulating layers 102 are each disposed between the conductive layer 110 and the insulating layer 101.

As illustrated in FIG. 3, some of the conductive layers 110 each function as the word line WL (FIG. 1) and the gate electrodes of the plurality of memory cells MC (FIG. 1) connected to the word line WL. Some of the conductive layers 110 each function as the drain-side select gate line SGD (FIG. 1) and the gate electrodes of the plurality of drain-side select transistors STD (FIG. 1) connected to the drain-side select gate line SGD.

A conductive layer 111 is disposed below the conductive layers 110. The conductive layer 111 may include, for example, a stacked film of a barrier conductive film of titanium nitride (TiN) or the like and a metal film of tungsten (W) or the like. An insulating layer 101 of silicon oxide ($SiO_2$) or the like is disposed between the conductive layer 111 and the conductive layer 110.

The semiconductor layers 120 are arranged in a predetermined pattern in the X-direction and the Y-direction. The semiconductor layer 120 functions as channel regions of the plurality of memory cells MC and the drain-side select transistor STD included in one memory string MS (FIG. 1). The semiconductor layer 120 is, for example, a semiconductor layer of polycrystalline silicon (Si) or the like. The semiconductor layer 120 has an approximately closed-bottomed cylindrical shape and includes an insulating layer 125 of silicon oxide or the like at its center part. The semiconductor layers 120 have outer peripheral surfaces each surrounded by the conductive layers 110 and opposed to the conductive layers 110.

An impurity region 121 containing N-type impurities, such as phosphorus (P), is disposed at an upper end portion of the semiconductor layer 120. The impurity region 121 is connected to the bit line BL via a contact Ch and a contact Cb.

The semiconductor layer 120 has a lower end connected to the P-type well region of the semiconductor substrate 100 via a semiconductor layer 122 containing single-crystal silicon (Si) or the like. The semiconductor layer 122 functions as a channel region of the source-side select transistor STS. The semiconductor layer 122 has an outer peripheral surface surrounded by the conductive layer 111 and opposed to the conductive layer 111. An insulating layer 123 of silicon oxide or the like is disposed between the semiconductor layer 122 and the conductive layer 111.

The gate insulating layer 130 has an approximately cylindrical shape covering the outer peripheral surface of the semiconductor layer 120. For example, as illustrated in FIG. 4, the gate insulating layer 130 includes a plurality of ferroelectric layers 131 arranged in the Z-direction corresponding to the plurality of conductive layers 110, an insulating layer 132 extending in the Z-direction, and charge storage layers 133 disposed between the ferroelectric layers 131 and the insulating layers 101.

The plurality of ferroelectric layers 131 are each disposed between the conductive layer 110 and the semiconductor layer 120. In the illustrated example, the ferroelectric layer 131 is in contact with the conductive layer 110. In the illustrated example, the plurality of ferroelectric layers 131 arranged in the Z-direction are separated in the Z-direction and mutually spaced in the Z-direction.

The ferroelectric layer 131 may contain, for example, orthorhombic hafnium oxide. The hafnium oxide contained in the ferroelectric layer 131 may mainly contain orthorhombic crystals. More specifically, the hafnium oxide contained in the ferroelectric layer 131 may mainly contain a third orthorhombic crystal (orthorhombic III, space group Pbc21, space group number 29). Among crystals in the hafnium oxide contained in the ferroelectric layer 131, a proportion of the orthorhombic crystals may be the largest. The orthorhombic crystal is also referred to as a rhombic crystal.

The ferroelectric layer 131 can contain at least one additive element selected from the group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba).

From the aspect of causing the hafnium oxide to exhibit ferroelectricity, a concentration of the additive element is preferably from 0.1 atomic percent or more to 60 atomic percent or less. The appropriate range of the concentration of the additive element to cause the hafnium oxide to exhibit the ferroelectricity differs depending on the kind of the additive element. For example, in the case of the additive element being silicon (Si), the appropriate range of the concentration of the additive element to exhibit the ferroelectricity is from 3 atomic percent or more to 7 atomic percent or less. For example, in the case of the additive element being barium (Ba), the appropriate range of the concentration of the additive element to exhibit the ferroelectricity is from 0.1 atomic percent or more to 3 atomic percent or less. For example, in the case of the additive element being zirconium (Zr), the appropriate range of the concentration of the additive element to exhibit the ferroelectricity is from 10 atomic percent or more to 60 atomic percent or less.

The insulating layer 132 is disposed between the plurality of ferroelectric layers 131 and the semiconductor layer 120. In the illustrated example, the insulating layer 132 is in contact with the plurality of ferroelectric layers 131 arranged in the Z-direction and the semiconductor layer 120. The insulating layer 132 contains, for example, silicon oxide ($SiO_2$).

Two charge storage layers 133 are disposed between the two ferroelectric layers 131 mutually adjacent in the Z-direction. The charge storage layer 133 is disposed between the insulating layer 102 and the insulating layer 132. The charge storage layer 133 is spaced from the conductive layer 110. The charge storage layer 133 is in contact with the ferroelectric layer 131, the insulating layer 132, the insulating layer 101, and the insulating layer 102. The charge storage layer 133 may be a floating gate, and may be an insulating charge storage layer. When the charge storage layer 133 is a floating gate, the charge storage layer 133 may contain silicon (Si) or the like. The charge storage layer 133 may contain N-type impurities, such as phosphorus (P), or P-type impurities, such as boron (B). When the charge storage layer 133 is an insulating charge storage layer, the charge storage layer 133 may contain silicon nitride ($Si_3N_4$) or the like.

For example, as illustrated in FIG. 3, the conductive layer 140 extends in the Z-direction and the X-direction. The conductive layer 140 is connected to an N-type impurity region disposed in the P-type well region of the semiconductor substrate 100. The conductive layer 140 may include, for example, a stacked film of a barrier conductive film of titanium nitride (TiN) or the like and a metal film of tungsten (W) or the like. The conductive layer 140 functions as, for example, apart of the source line SL (FIG. 1). An insulating layer 141 of silicon oxide ($SiO_2$) or the like is disposed on a side surface of the conductive layer 140 in the Y-direction.

The conductive layer 150 is arranged in the X-direction and extends in the Y-direction. The conductive layer 150 may include, for example, a stacked film of a barrier conductive film of titanium nitride (TiN) or the like and a metal film of copper (Cu) or the like. The conductive layer 150 functions as, for example, the bit line BL (FIG. 1).

Threshold Voltage of Memory Cell MC

Figure 5:
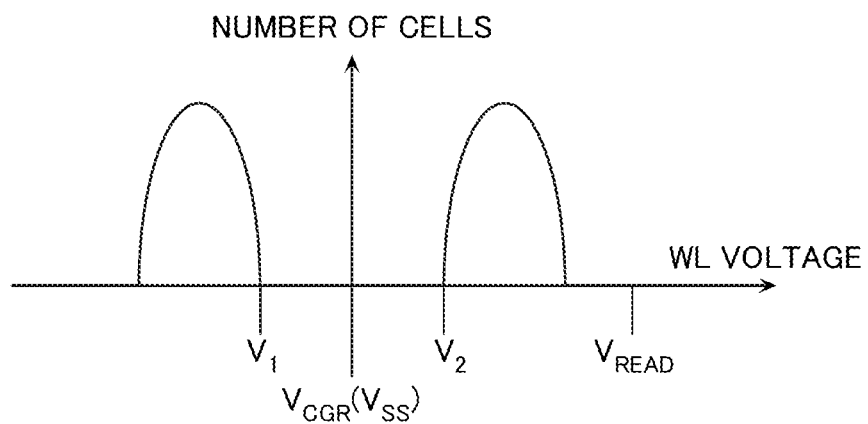
FIG. 5 is a schematic histogram for describing a threshold voltage of a memory cell MC.

Next, with reference to FIG. 5, a threshold voltage of the memory cell MC will be described. FIG. 5 is a schematic histogram for describing the threshold voltage of the memory cell MC. The horizontal axis indicates a voltage of the word line WL. And the vertical axis indicates the number of the memory cells MC. Here, the threshold voltage is a threshold voltage when the memory cell MC is operated as an NMOS transistor.

In the example of FIG. 5, the threshold voltages of the memory cells MC are controlled in states of two patterns. For example, the threshold voltages of the memory cells MC controlled in the lower state have negative polarity, and absolute values of these threshold voltages are larger than an absolute value of a voltage $V_1$ of negative polarity in FIG. 5. The threshold voltages of the memory cells MC controlled in the upper state have positive polarity, and absolute values of these threshold voltages are larger than an absolute value of a voltage $V_2$ of positive polarity in FIG. 5.

In a read operation, for example, a selected word line WL is applied with a read voltage $V_{CGR}$ between the voltage $V_1$ of negative polarity and the voltage $V_2$ of positive polarity. In the example of FIG. 5, the read voltage $V_{CGR}$ has a magnitude of approximately a ground voltage $V_{SS}$. Accordingly, electron channels are formed in the channel regions of selected memory cells MC controlled in the lower state, and any channel is not formed in the channel regions of selected memory cells MC controlled in the upper state.

In the read operation, for example, unselected word lines WL are applied with a read pass voltage $V_{READ}$ larger than the threshold voltages of the memory cells MC controlled in the upper state. Accordingly, unselected memory cells MC turn ON regardless of data to be stored. Thus, the selected memory cells MC are electrically conducted with the bit lines BL (FIG. 1) and the source line SL (FIG. 1). Accordingly, by applying the voltage between the bit lines BL and the source line SL in this state and detecting whether the current flows in the bit lines BL or not, the data stored in the selected memory cells MC can be read out.

Figure 6:
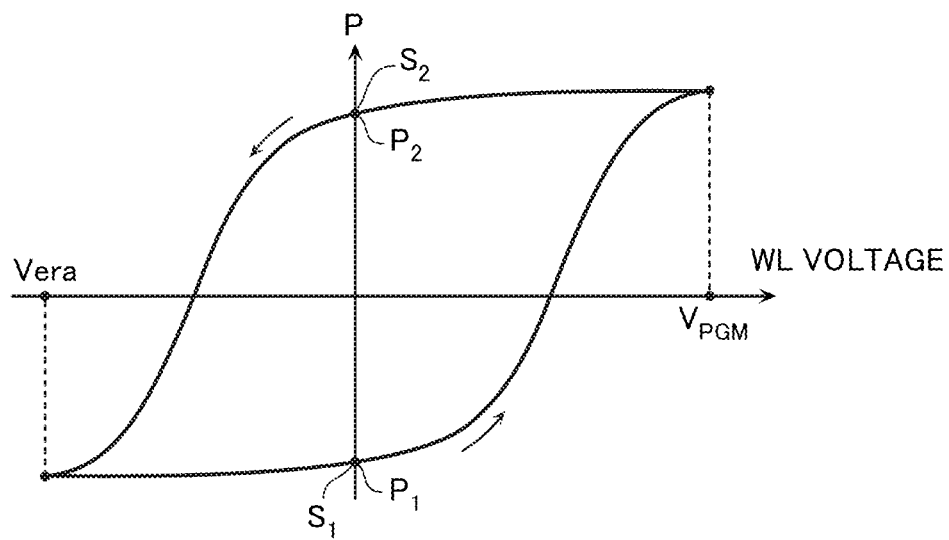
FIG. 6 is a schematic graph for describing a polarizability of the memory cell MC.
Figure 7:
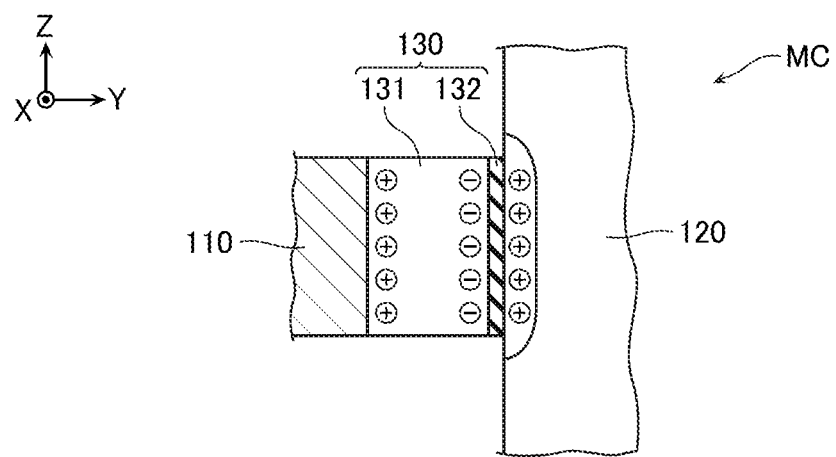
FIG. 7 is a schematic cross-sectional view for describing a state of the memory cell MC.
Figure 8:
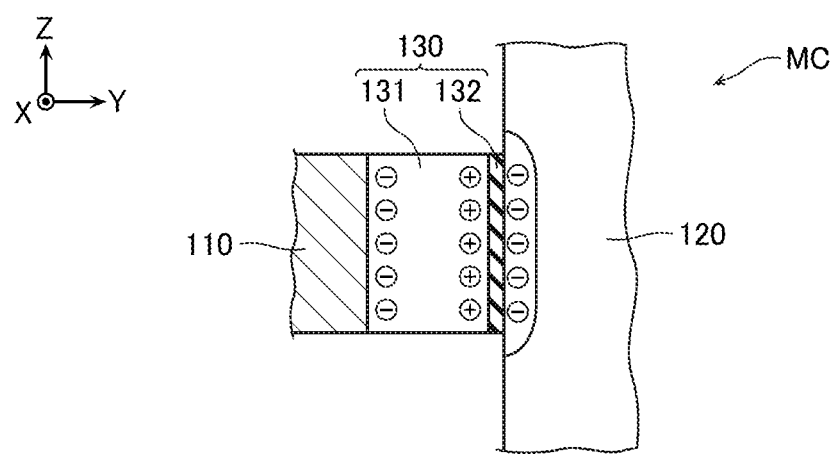
FIG. 8 is a schematic cross-sectional view for describing a state of the memory cell MC.

Next, with reference to FIG. 6 to FIG. 8, a method for controlling the threshold voltage of the memory cell MC will be described. FIG. 6 is a schematic graph for describing a polarizability of the memory cell MC. The horizontal axis of the graph illustrated in FIG. 6 indicates the voltage of the word line WL. The vertical axis of the graph illustrated in FIG. 6 indicates a polarizability P of the ferroelectric layer 131. FIG. 7 and FIG. 8 are schematic cross-sectional views for describing the states of the memory cell MC.

As described with reference to FIG. 4, the gate insulating layer 130 of the memory cell MC according to the embodiment includes the ferroelectric layer 131. When a voltage of positive polarity and a voltage of negative polarity having magnitudes equal to or more than a predetermined magnitude are alternately applied to the word line WL connected to such memory cell MC, a hysteresis curve as illustrated in FIG. 6 is observed. In FIG. 6, states $S_1$, $S_2$ are indicated on this hysteresis curve.

The state $S_1$ is a state of the memory cell MC controlled in the upper state. The state $S_1$ is a state where the polarizability P is a negative polarizability $P_1$ and the voltage of the word line WL is the ground voltage $V_{SS}$. In this state, as illustrated in FIG. 7, a negative electric charge is induced on the surface of the ferroelectric layer 131 in the semiconductor layer 120 side. In this state, since a positive electric charge is induced in the semiconductor layer 120, an electron channel is less likely to be formed in the semiconductor layer 120. Therefore, the threshold voltage of the memory cell MC has a positive value.

When a voltage having a magnitude of approximately the read pass voltage is applied to the gate electrode of the memory cell MC in the state $S_1$, the polarization state of the ferroelectric layer 131 does not change. When the voltage application to the gate electrode is halted in this state, the memory cell MC returns to the state $S_1$.

When a voltage of positive polarity having a magnitude equal to or more than a predetermined magnitude is applied to the gate electrode of the memory cell MC in the state $S_1$, a direction of the polarization in the ferroelectric layer 131 is inverted by an electric field between the conductive layer 110 and the semiconductor layer 120, and as illustrated in FIG. 6, the polarizability P in the ferroelectric layer 131 increases. When the voltage of the gate electrode reaches a write voltage $V_{PGM}$, the polarizability P of the memory cell MC changes to a certain magnitude and is saturated. When the voltage application to the gate electrode is halted in this state, the memory cell MC transitions to the state $S_2$.

The state $S_2$ is a state of the memory cell MC controlled in the lower state. The state $S_2$ is a state where the polarizability P is a positive polarizability $P_2$ and the voltage of the word line WL is the ground voltage $V_{SS}$. In this state, as illustrated in FIG. 8, a positive electric charge is induced on the surface of the ferroelectric layer 131 in the semiconductor layer 120 side. In this state, a negative electric charge is induced in the semiconductor layer 120. That is, an electron channel is formed in the semiconductor layer 120. Therefore, the threshold voltage of the memory cell MC has a negative value.

When a voltage of negative polarity having a magnitude equal to or more than a predetermined magnitude is applied to the gate electrode of the memory cell MC in the state $S_2$, the direction of the polarization in the ferroelectric layer 131 is inverted by the electric field between the conductive layer 110 and the semiconductor layer 120, and as illustrated in FIG. 6, the polarizability P in the ferroelectric layer 131 decreases. When the voltage of the gate electrode reaches an erase voltage $V_{era}$, the polarizability P of the memory cell MC changes to a certain magnitude and is saturated. When the voltage application to the gate electrode is halted in this state, the memory cell MC transitions to the state $S_1$.

Current Generated in Association with Polarization Inversion

Figure 9:
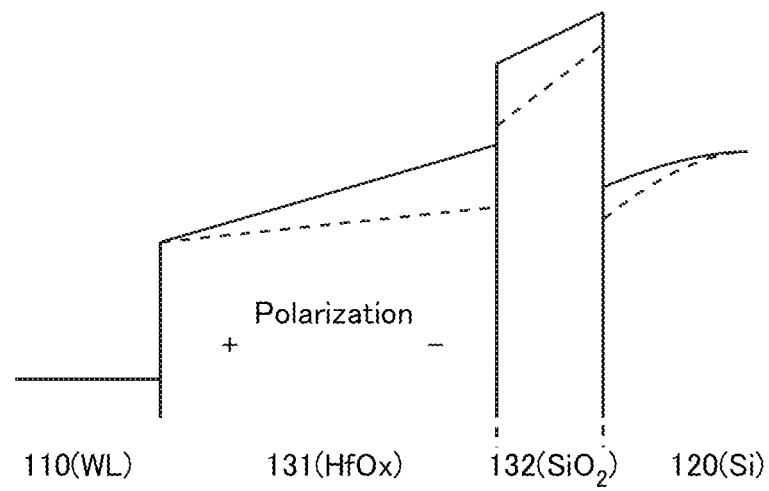
FIG. 9 is a schematic energy band diagram for describing a state of the memory cell MC.
Figure 10:
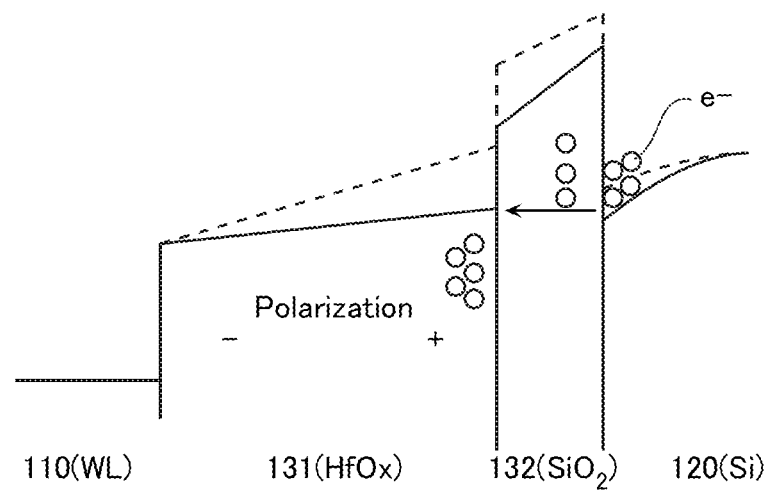
FIG. 10 is a schematic energy band diagram for describing a state of the memory cell MC.

Next, with reference to FIG. 9 and FIG. 10, a current generated in association with the polarization inversion will be described. FIG. 9 and FIG. 10 are energy band diagrams of the memory cell MC.

As illustrated in FIG. 9, when a voltage of positive polarity is applied to the gate electrode (conductive layer 110) of the memory cell MC in the state $S_1$ (FIG. 7), and the polarization inversion in the ferroelectric layer 131 has not occurred, an energy level on an interface between the ferroelectric layer 131 and the insulating layer 132 is higher than an energy level on an interface between the insulating layer 132 and the semiconductor layer 120.

When the polarization inversion in the ferroelectric layer 131 occurs from the state as illustrated in FIG. 9, the energy level on the interface between the ferroelectric layer 131 and the insulating layer 132 possibly decreases to a height similar to that of the energy level on the interface between the insulating layer 132 and the semiconductor layer 120 as illustrated in FIG. 10. In this case, the electrons in the channel formed at the semiconductor layer 120 tunnel through the insulating layer 132 to reach the ferroelectric layer 131 in some cases. In this case, the electrons reached to the ferroelectric layer 131 are trapped in a trap level on the interface between the ferroelectric layer 131 and the insulating layer 132. Accordingly, the above-described difference between the energy levels is reduced.

Here, when such tunneling current has a magnitude equal to or more than a predetermined magnitude, this tunneling current possibly causes a crystal defect in the insulating layer 132, the interface between the ferroelectric layer 131 and the insulating layer 132, and the like. The crystal defect acts as the trap level in some cases. In such trap level, the electrons are accumulated to reduce the threshold voltages of the memory cell MC in the states $S_1$, $S_2$ in some cases. Additionally, the crystal defect is accumulated in the insulating layer 132, the interface between the ferroelectric layer 131 and the insulating layer 132, and the like due to repeated execution of a write operation and an erase operation of the semiconductor memory device in some cases.

Therefore, in this embodiment, as described with reference to FIG. 4, the charge storage layer 133 is disposed in the proximity of the interface between the ferroelectric layer 131 and the insulating layer 132.

In this configuration, for example, when a voltage of positive polarity is started to be applied the gate electrode of the memory cell MC in the state $S_1$ (FIG. 7), first, the electrons in the channel formed at the semiconductor layer 120 tunnel through the insulating layer 132 to reach the charge storage layer 133, and are accumulated in the charge storage layer 133. When the polarization inversion occurs in the ferroelectric layer 131, the electrons accumulated in the charge storage layer 133 are supplied to the trap level in the interface between the ferroelectric layer 131 and the insulating layer 132. Thus, the difference between the energy level in the interface between the ferroelectric layer 131 and the insulating layer 132 and the energy level in the interface between the insulating layer 132 and the semiconductor layer 120 is reduced. Accordingly, the tunneling current as described above is reduced, and the accumulation of the trap level is reduced, thus allowing the extension of the product life of the semiconductor memory device.

Manufacturing Method

Next, with reference to FIG. 11 to FIG. 24, a method for manufacturing the memory die MD will be described. FIG. 11 to FIG. 24 are schematic cross-sectional views for describing the manufacturing method.

In the manufacture of the memory die MD according to the embodiment, first, a plurality of transistors constituting the peripheral circuit PC are formed in the peripheral circuit region $R_{PC}$ (FIG. 2) of the semiconductor substrate 100.

Figure 11:
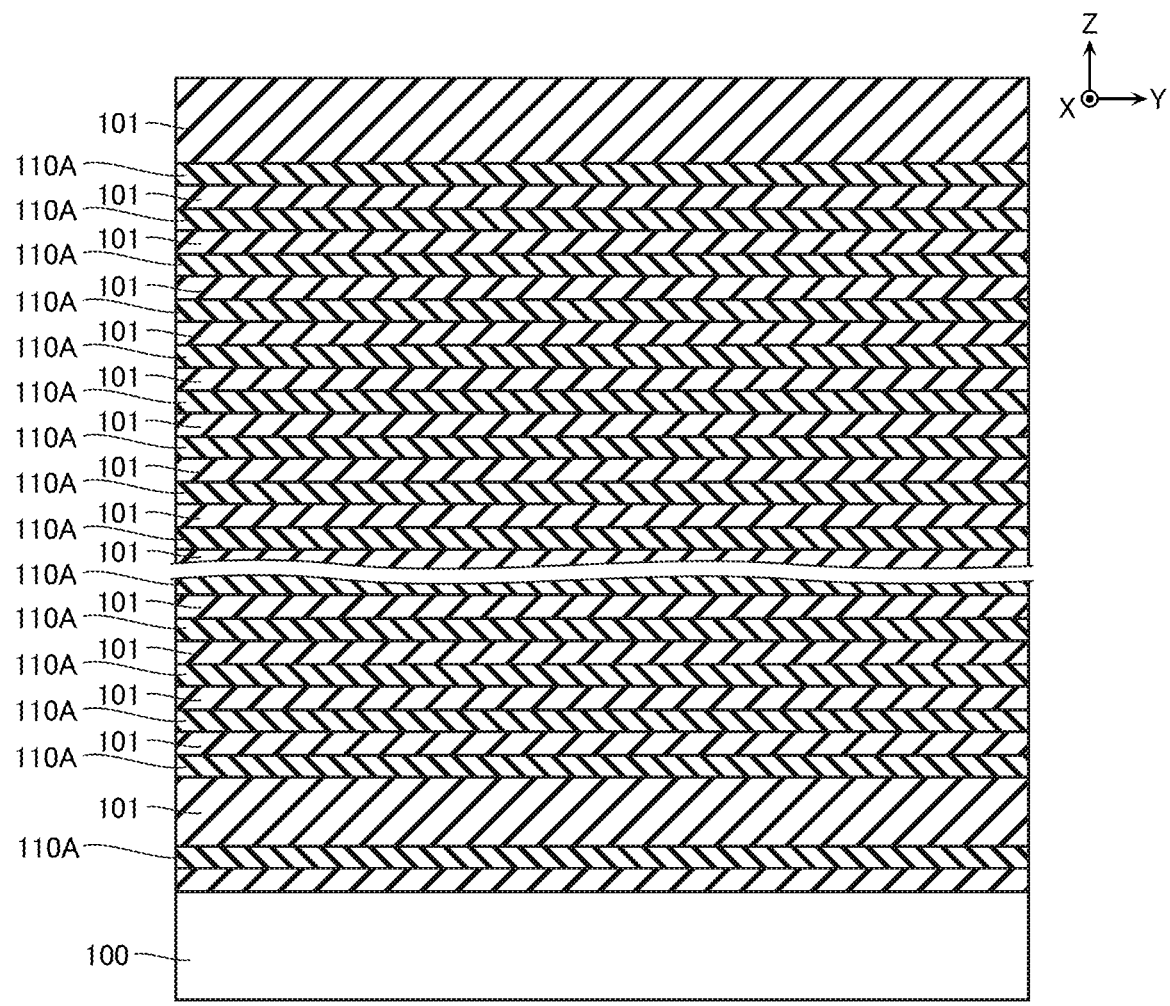
FIG. 11 is a schematic cross-sectional view for describing a method for manufacturing the semiconductor memory device according to the first embodiment.

Next, for example, as illustrated in FIG. 11, a plurality of sacrifice layers 110A and a plurality of insulating layers 101 are formed on the semiconductor substrate 100. The sacrifice layer 110A contains silicon nitride ($Si_3N_4$) or the like. This process is performed by a method such as Chemical Vapor Deposition (CVD). While the illustration is omitted in FIG. 11, in this process, the insulating layers 102 (FIG. 4) are formed between the plurality of sacrifice layers 110A and the plurality of insulating layers 101.

Figure 12:
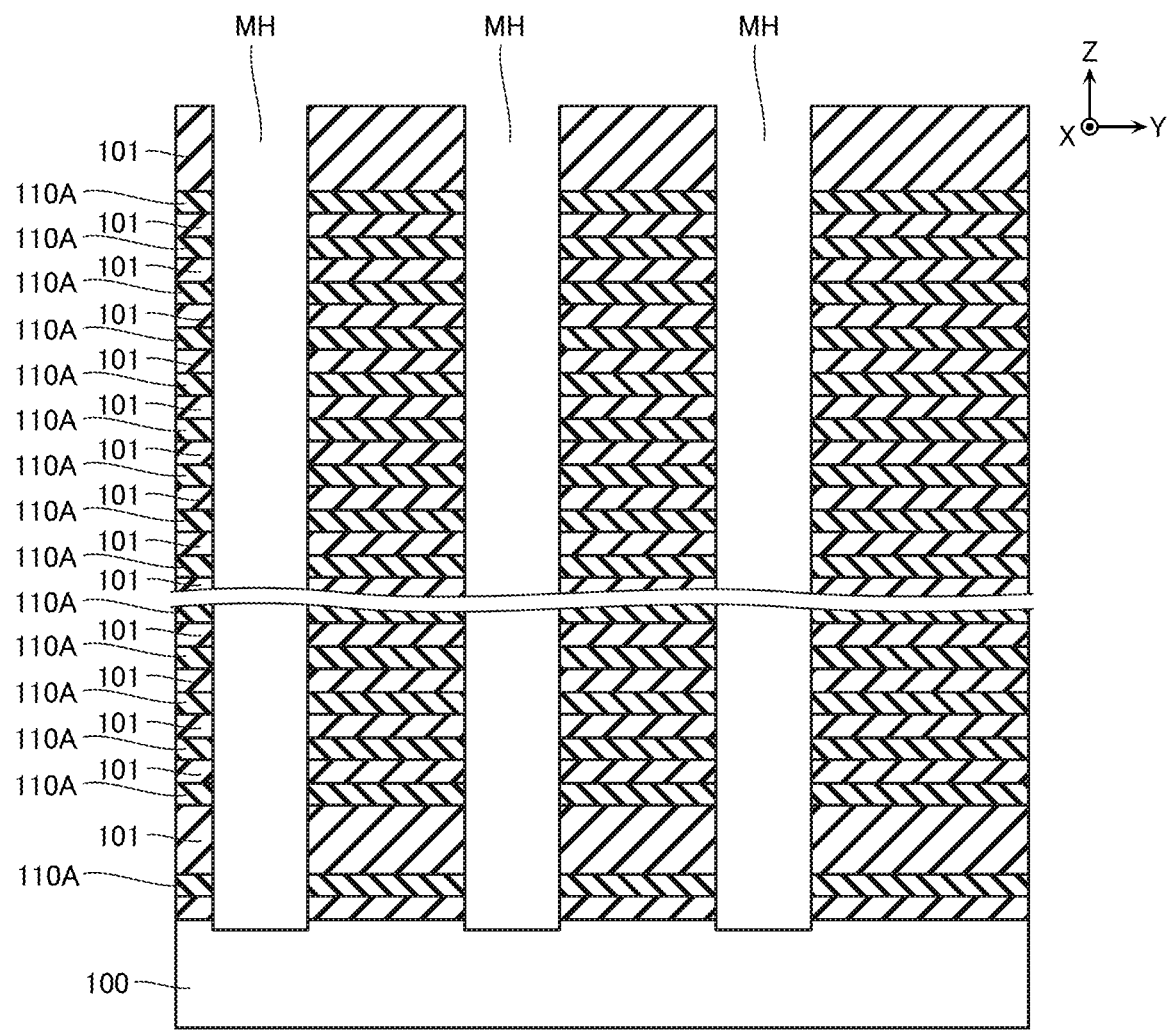
FIG. 12 is a schematic cross-sectional view for describing the manufacturing method.
Figure 13:
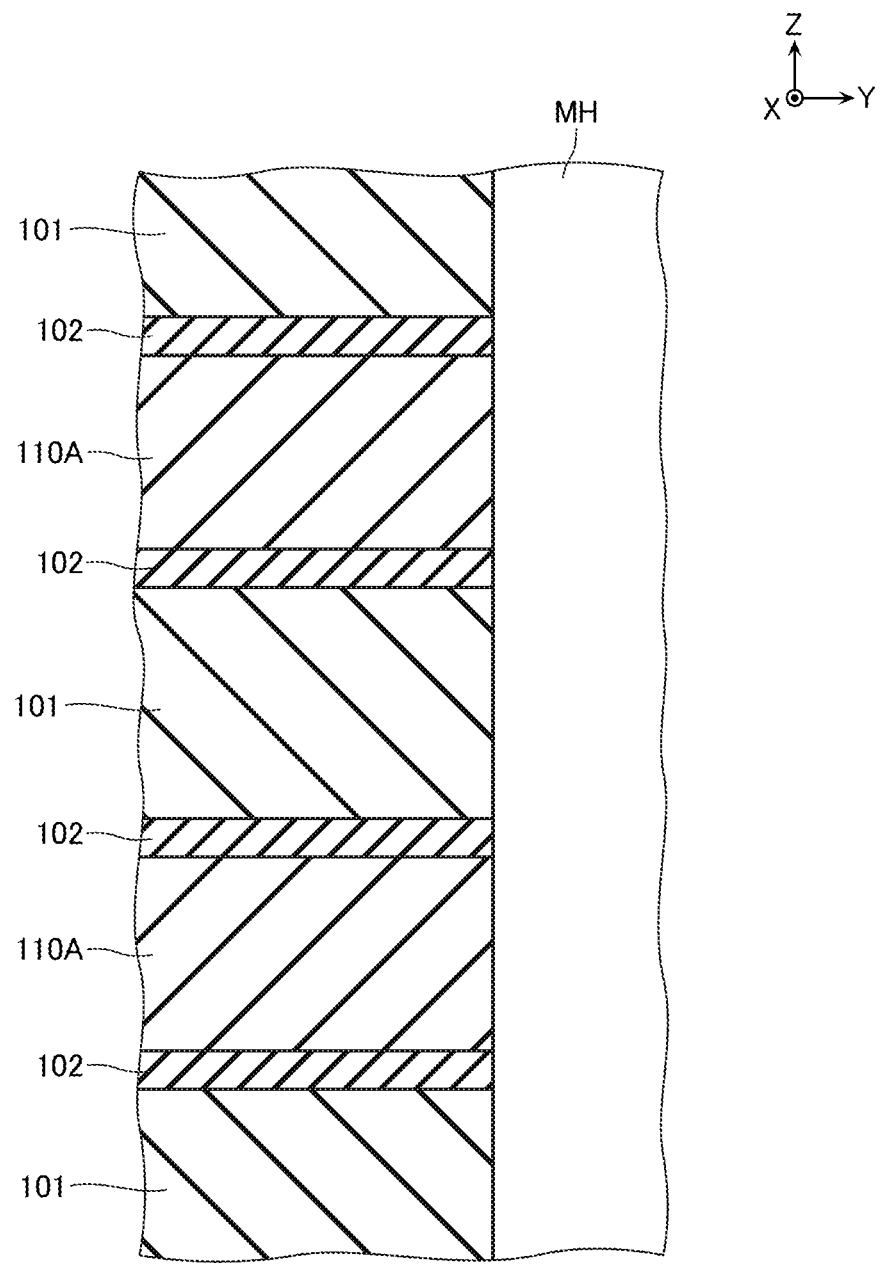
FIG. 13 is a schematic cross-sectional view for describing the manufacturing method.

Next, for example, as illustrated in FIG. 12 and FIG. 13, a plurality of memory holes MH are formed at positions corresponding to the plurality of semiconductor layers 120. The memory hole MH is a through hole that extends in the Z-direction and penetrates the insulating layers 101, the sacrifice layers 110A, and the insulating layers 102 to expose the upper surface of the semiconductor substrate 100. This process is performed by a method such as Reactive Ion Etching (RIE).

After the process illustrated in FIG. 12 and FIG. 13, the semiconductor layer 122 described with reference to FIG. 3 may be formed in the bottom surface of the memory hole MH. This process is performed by a method such as epitaxial growth.

Figure 14:
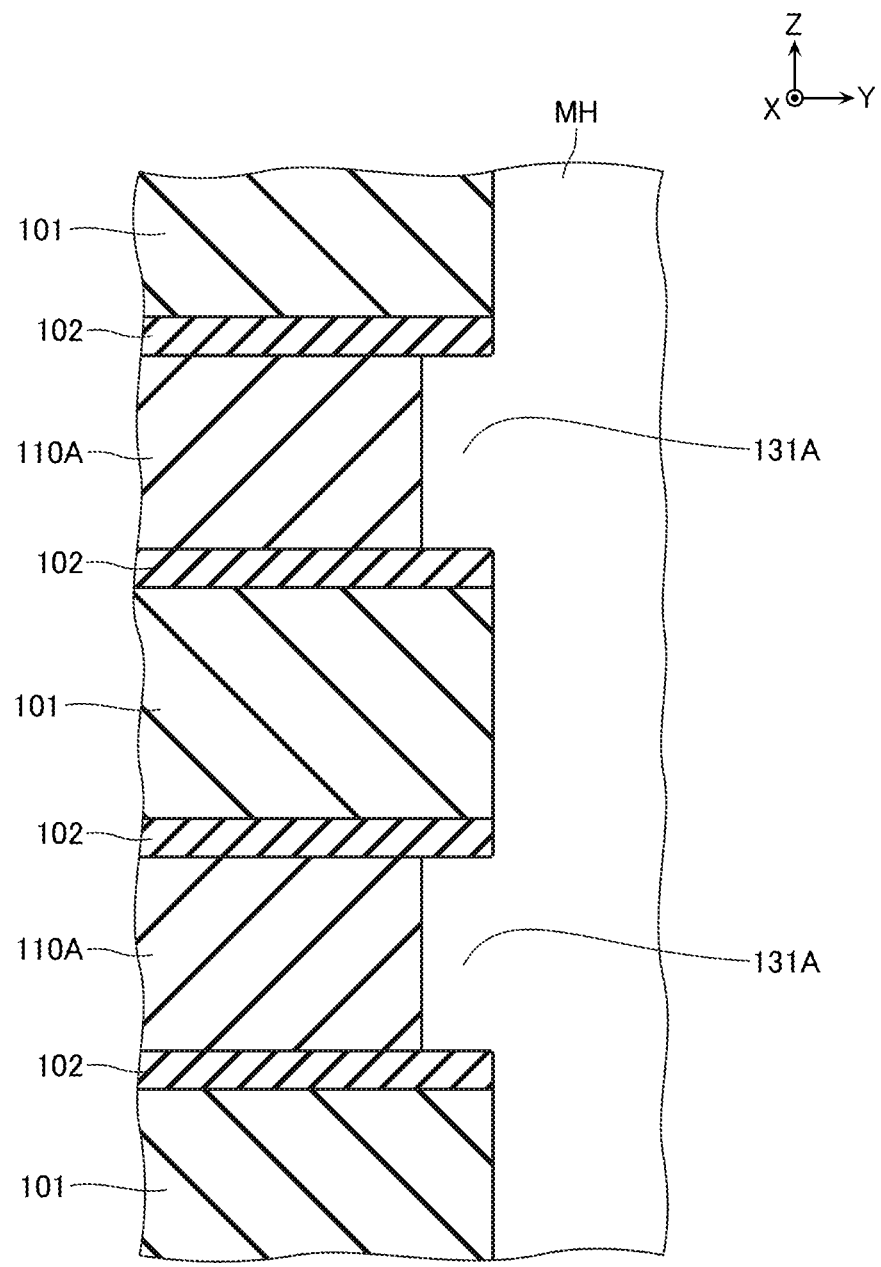
FIG. 14 is a schematic cross-sectional view for describing the manufacturing method.

Next, for example, as illustrated in FIG. 14, the sacrifice layers 110A are partially removed via the memory hole MH, thus forming cavities 131A at positions corresponding to the ferroelectric layers 131 (FIG. 4). This process is performed by wet etching or the like.

Figure 15:
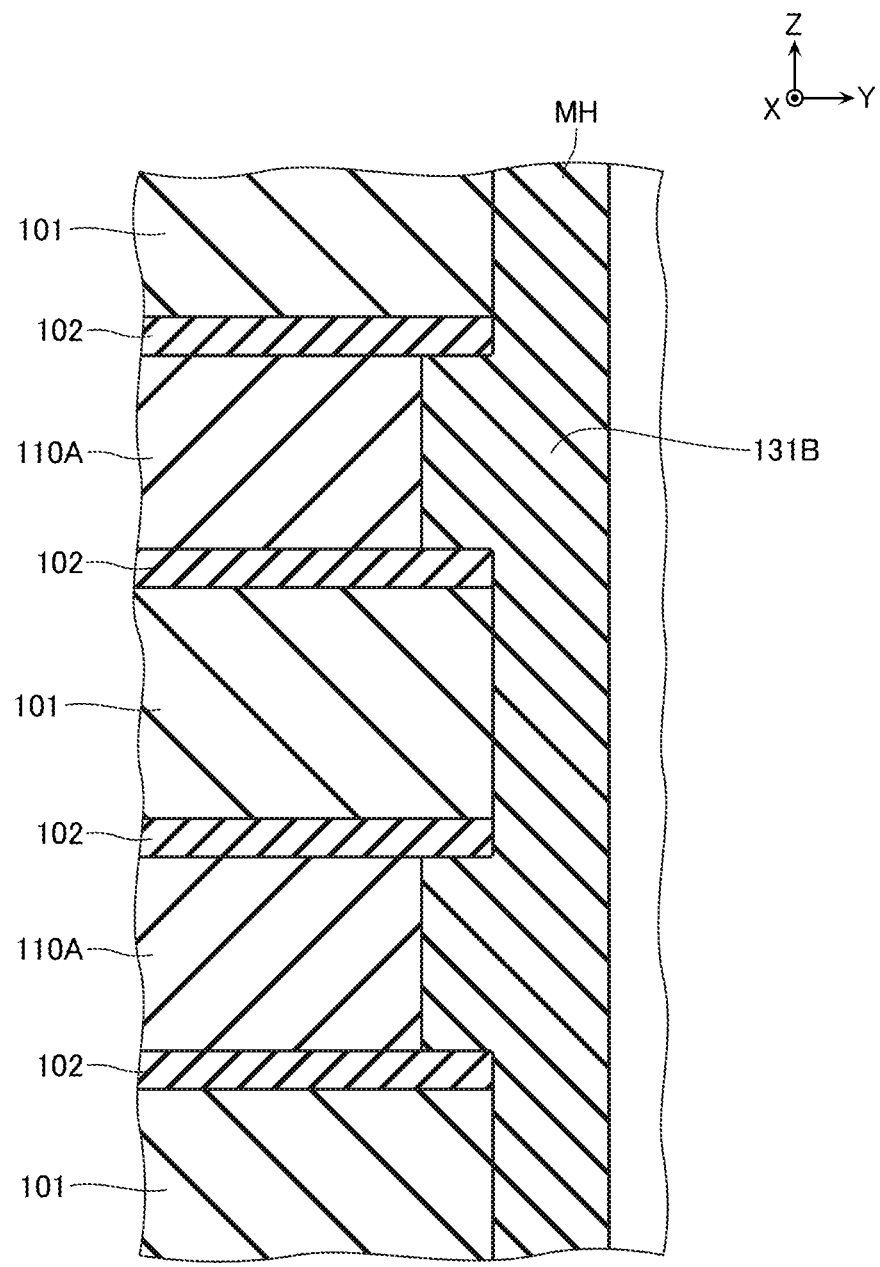
FIG. 15 is a schematic cross-sectional view for describing the manufacturing method.

Next, for example, as illustrated in FIG. 15, a ferroelectric layer 131B is formed on an inner peripheral surface of the memory hole MH. The ferroelectric layer 131B is formed, for example, to be thick enough to fill the cavities 131A (FIG. 14). The ferroelectric layer 131B is formed to be thin so as not to fill the memory hole MH. This process is performed by the method such as CVD.

Figure 16:
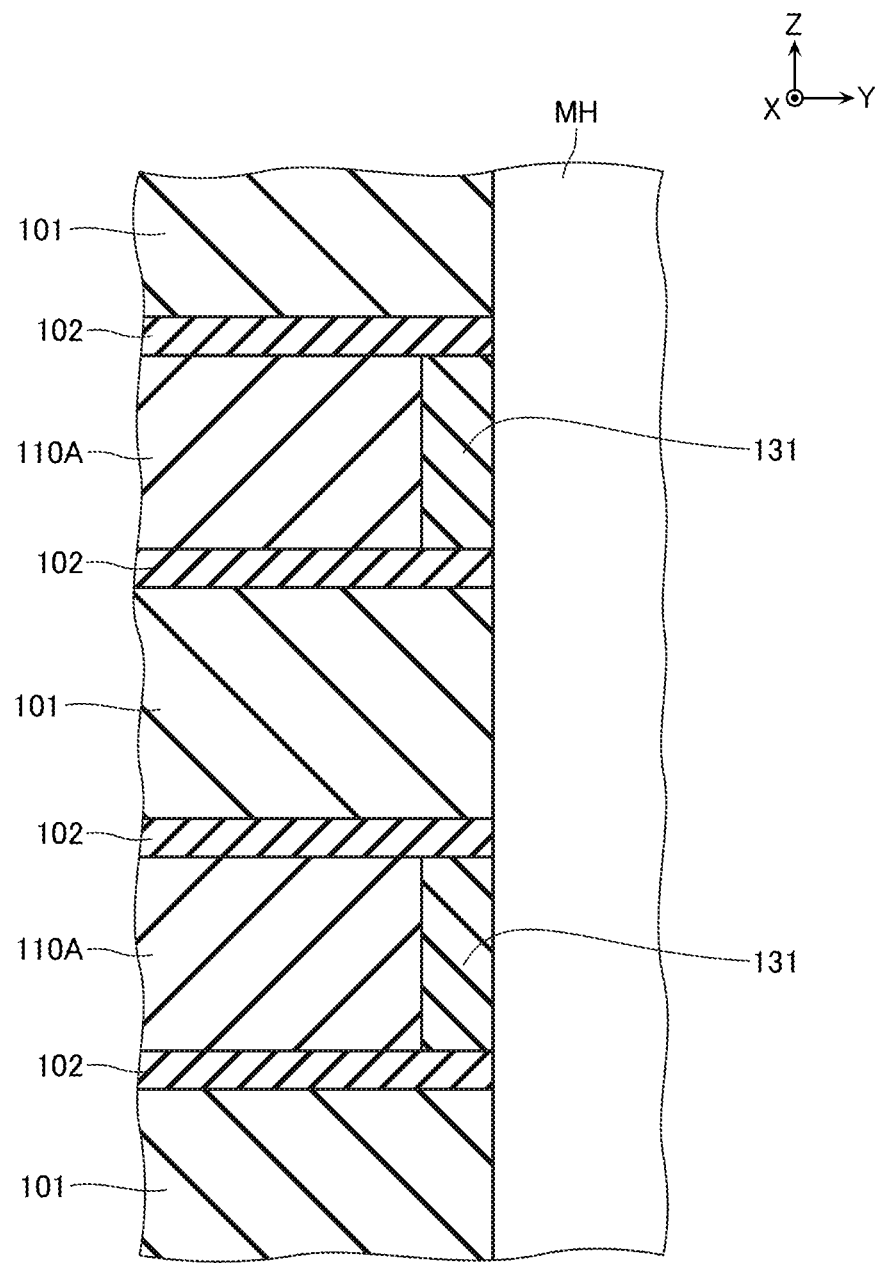
FIG. 16 is a schematic cross-sectional view for describing the manufacturing method.

Next, for example, as illustrated in FIG. 16, the ferroelectric layer 131B is partially removed to expose side surfaces of the plurality of insulating layers 101. A plurality of the ferroelectric layers 131 are formed through this process. This process is performed by, for example, wet etching.

Figure 17:
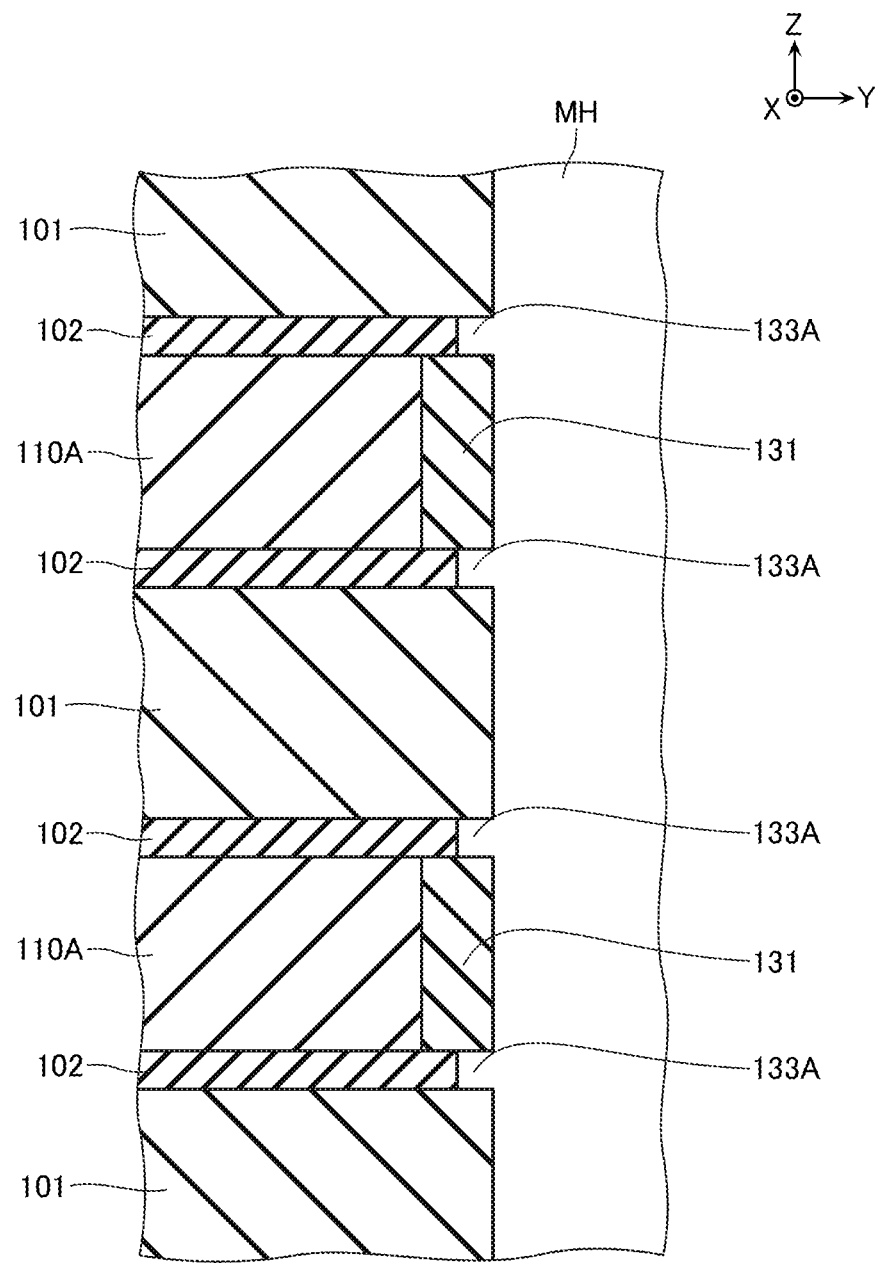
FIG. 17 is a schematic cross-sectional view for describing the manufacturing method.

Next, for example, as illustrated in FIG. 17, the insulating layers 102 are partially removed via the memory hole MH to form cavities 133A at positions corresponding to the charge storage layers 133 (FIG. 4). This process is performed by, for example, wet etching.

Figure 18:
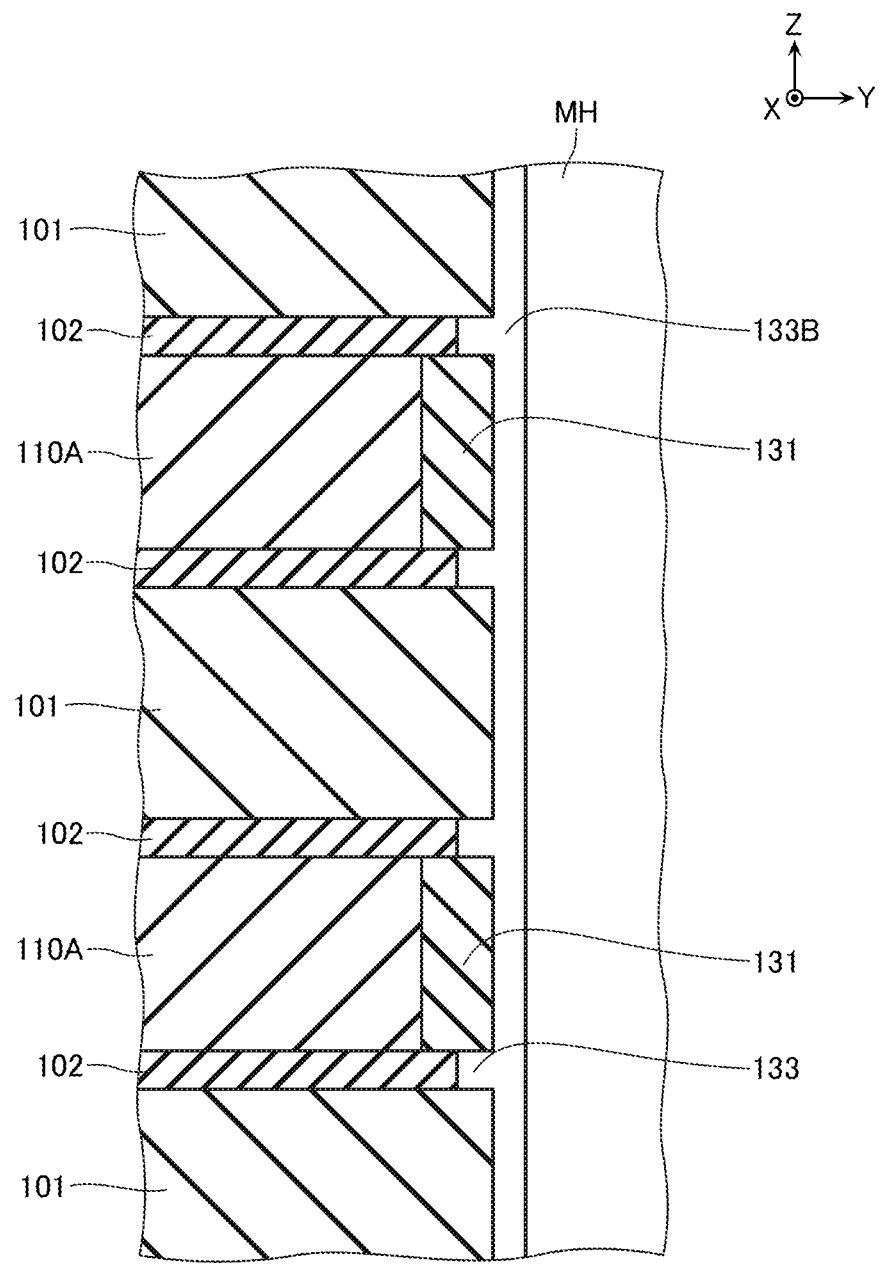
FIG. 18 is a schematic cross-sectional view for describing the manufacturing method.

Next, for example, as illustrated in FIG. 18, a charge storage layer 133B is formed on the inner peripheral surface of the memory hole MH. The charge storage layer 133B is formed, for example, to be thick enough to fill the cavities 133A (FIG. 17). The charge storage layer 133B is formed to be thin so as not to fill the memory hole MH. This process is performed by the method such as CVD.

Figure 19:
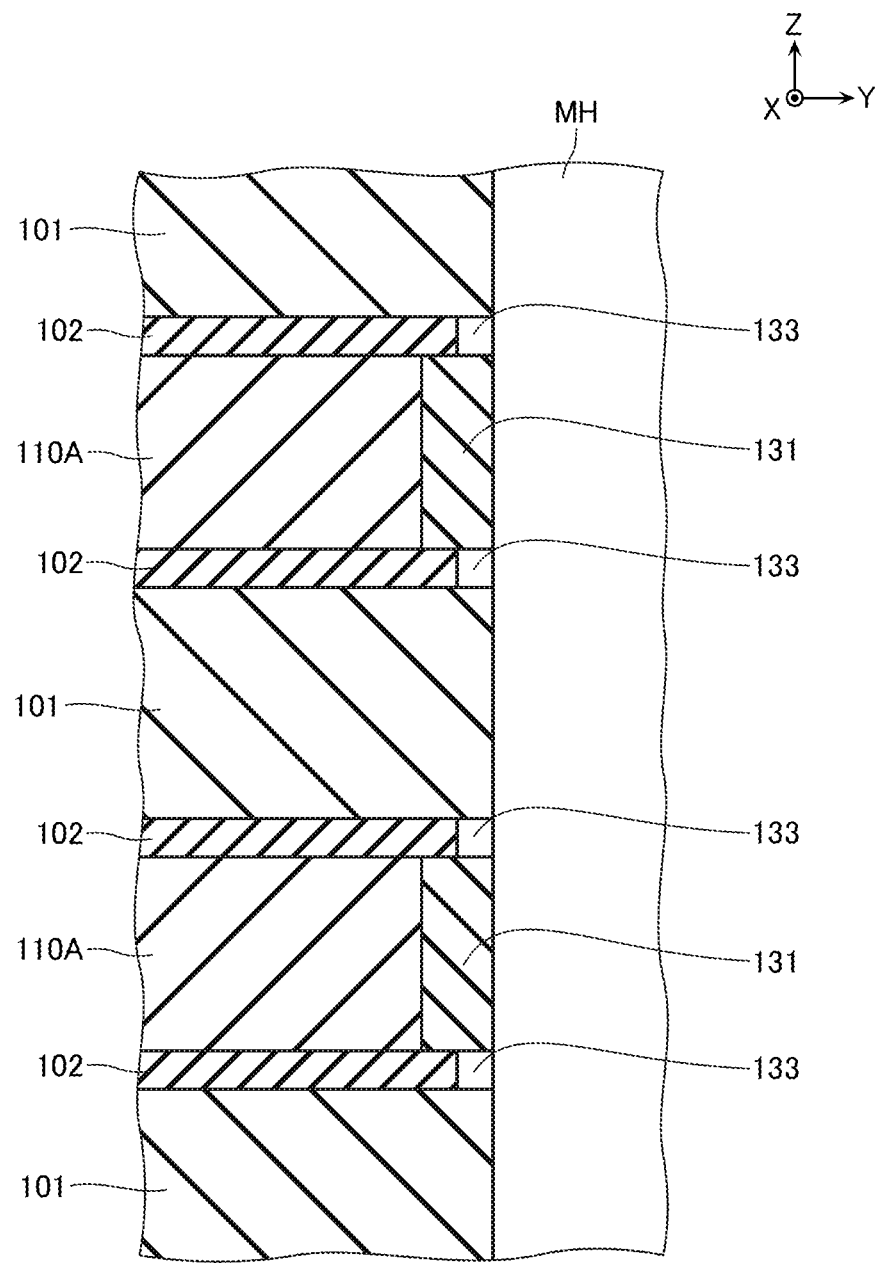
FIG. 19 is a schematic cross-sectional view for describing the manufacturing method.

Next, for example, as illustrated in FIG. 19, the charge storage layer 133B is partially removed to expose side surfaces of the plurality of insulating layers 101. A plurality of the charge storage layers 133 are formed through this process. This process is performed by, for example, wet etching.

Figure 20:
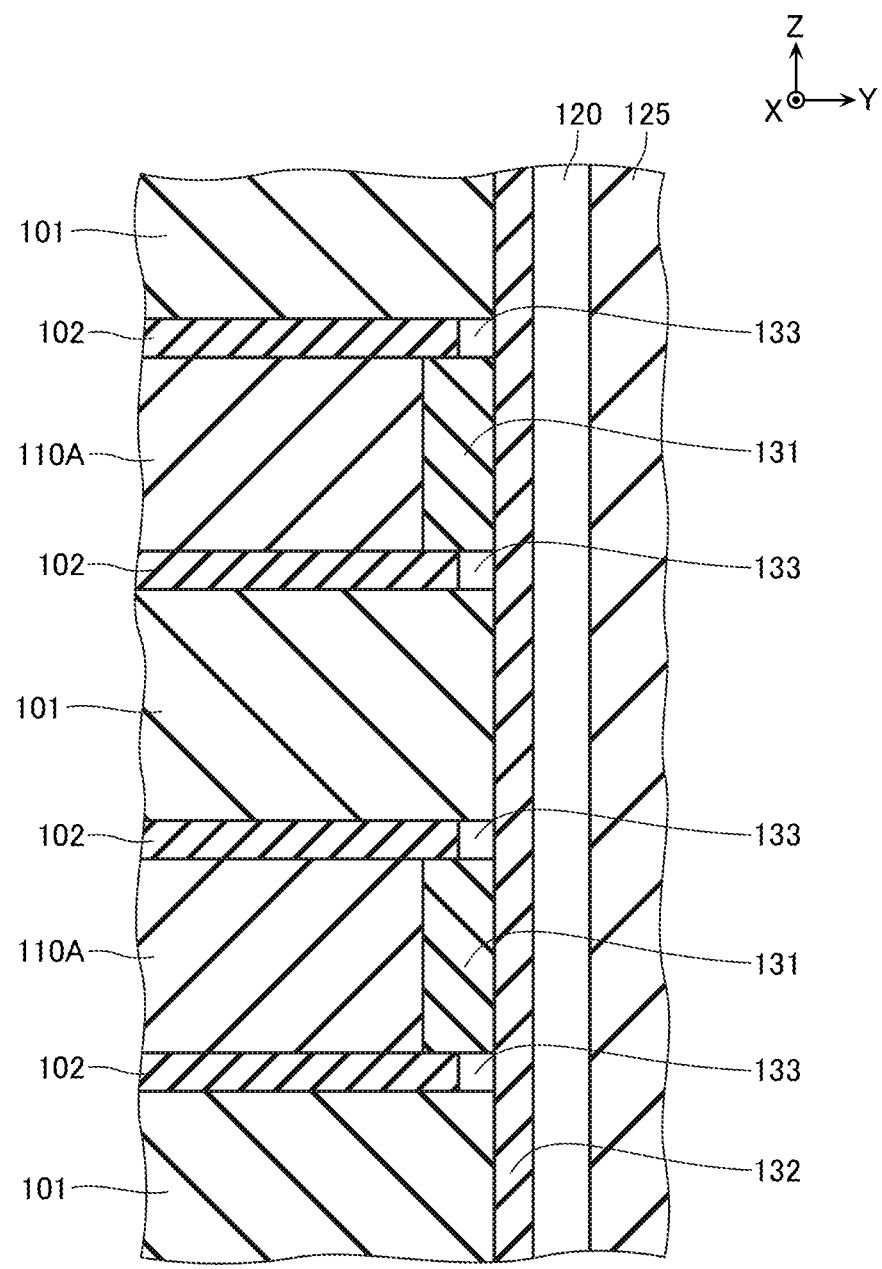
FIG. 20 is a schematic cross-sectional view for describing the manufacturing method.

Next, for example, as illustrated in FIG. 20, the insulating layer 132, the semiconductor layer 120, and the insulating layer 125 are formed on the inner peripheral surface of the memory hole MH. This process is performed by the method such as CVD.

Figure 21:
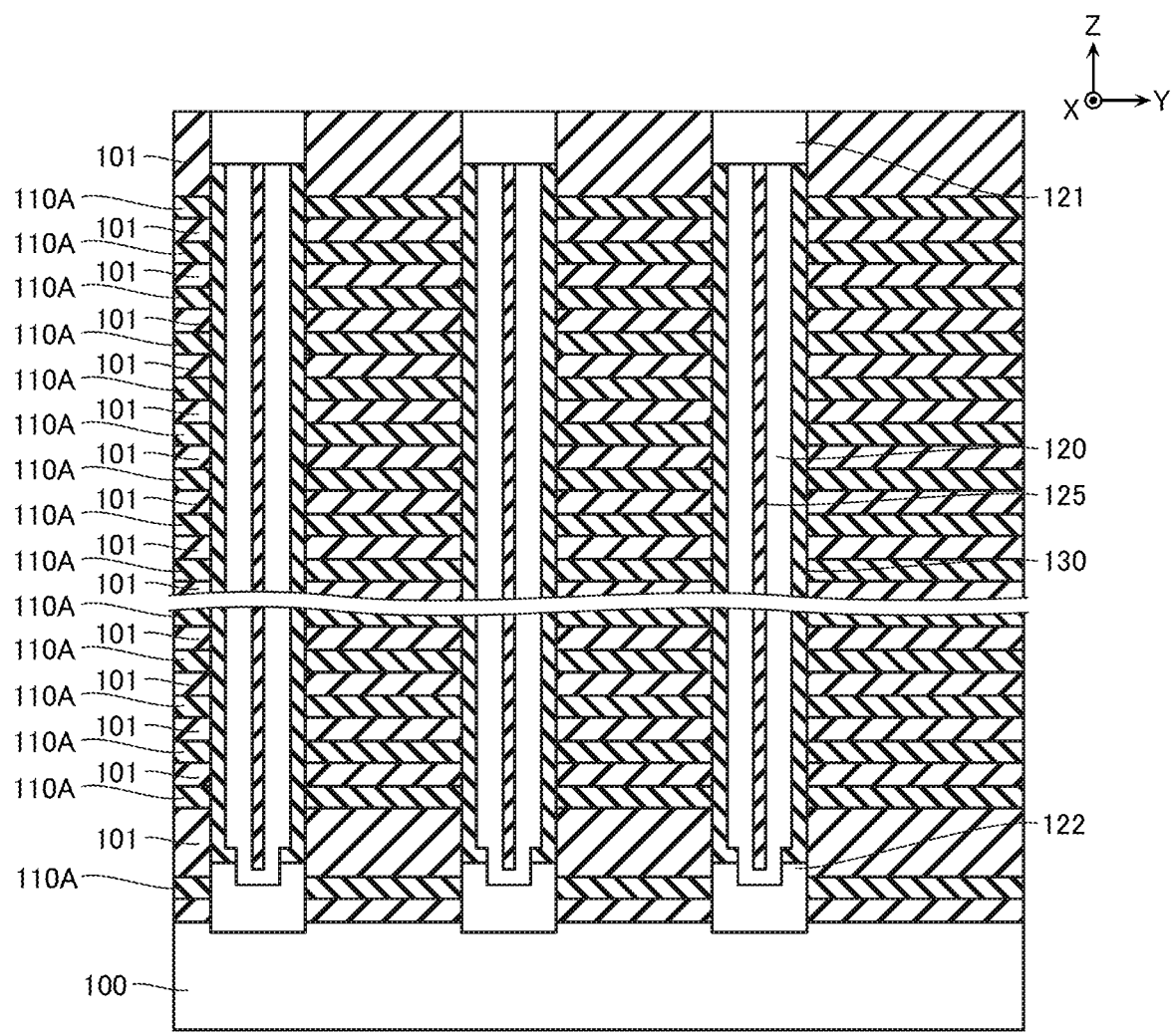
FIG. 21 is a schematic cross-sectional view for describing the manufacturing method.

Next, for example, as illustrated in FIG. 21, the impurity regions 121 containing N-type impurities, such as phosphorus (P), are formed at upper end portions of the memory holes MH. This process is performed by the method such as CVD.

Figure 22:
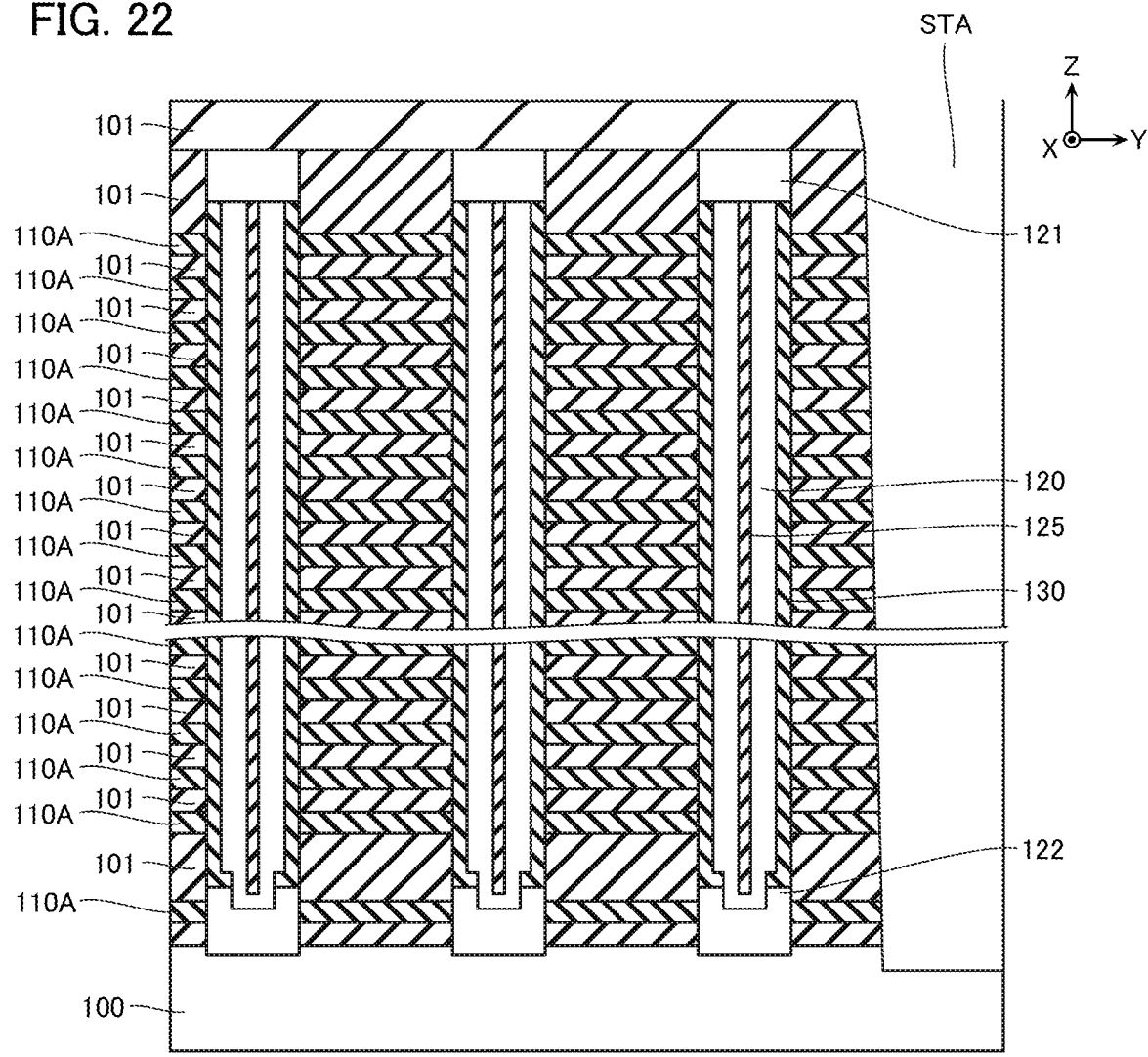
FIG. 22 is a schematic cross-sectional view for describing the manufacturing method.

Next, for example, as illustrated in FIG. 22, a trench STA is formed. The trench STA is a trench that extends in the Z-direction and the X-direction, and separates the insulating layers 101, the sacrifice layers 110A, and the insulating layers 102 in the Y-direction to expose the upper surface of the semiconductor substrate 100. This process is performed by the method such as RIE.

Figure 23:
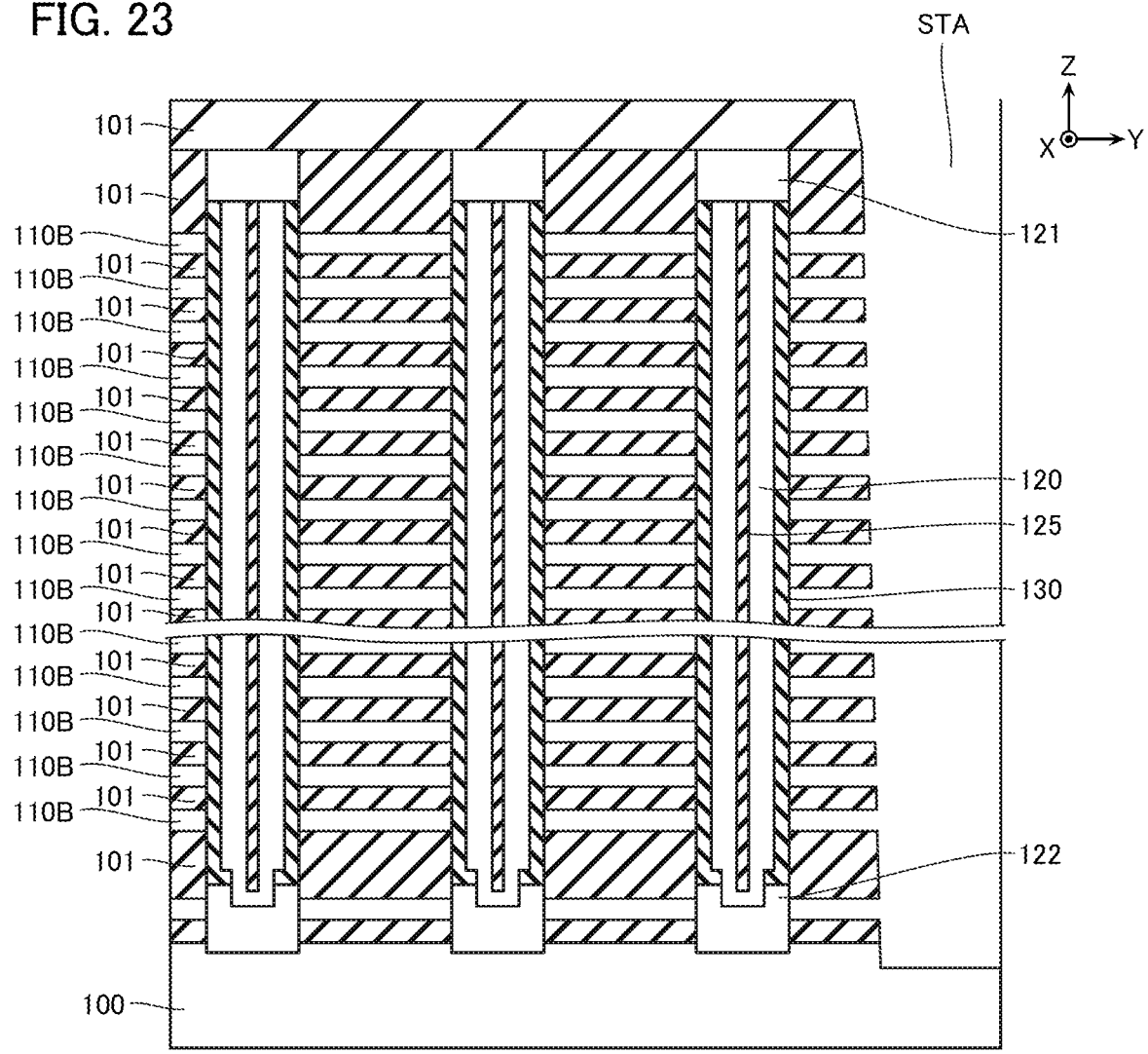
FIG. 23 is a schematic cross-sectional view for describing the manufacturing method.
Figure 24:
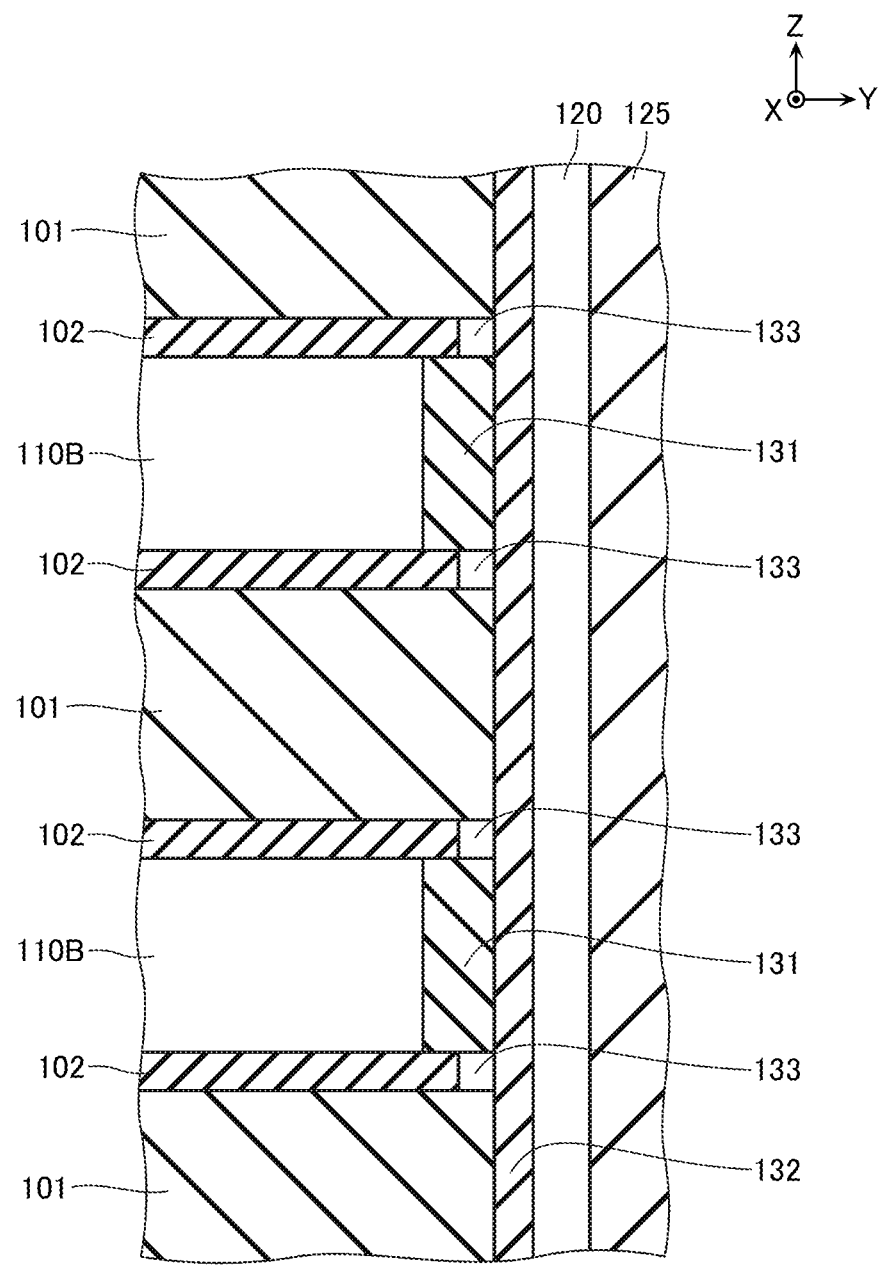
FIG. 24 is a schematic cross-sectional view for describing the manufacturing method.

Next, for example, as illustrated in FIG. 23 and FIG. 24, the sacrifice layers 110A are removed via the trench STA to form cavities 110B. Thus, a hollow structure including a plurality of insulating layers 101 arranged in the Z-direction and a structure (semiconductor layer 120, gate insulating layer 130, and insulating layer 125) inside the memory hole MH to support the insulating layers 101 is formed. This process is performed by the method such as wet etching.

After the process illustrated in FIG. 23 and FIG. 24, the insulating layer 123 (FIG. 3) may be formed on the outer peripheral surface of the semiconductor layer 122. This process is performed by a method such as an oxidation process.

Next, for example, as illustrated in FIG. 3 and FIG. 4, the conductive layers 110, 111 are formed. This process is performed by the method such as CVD.

Read Operation

Figure 25:
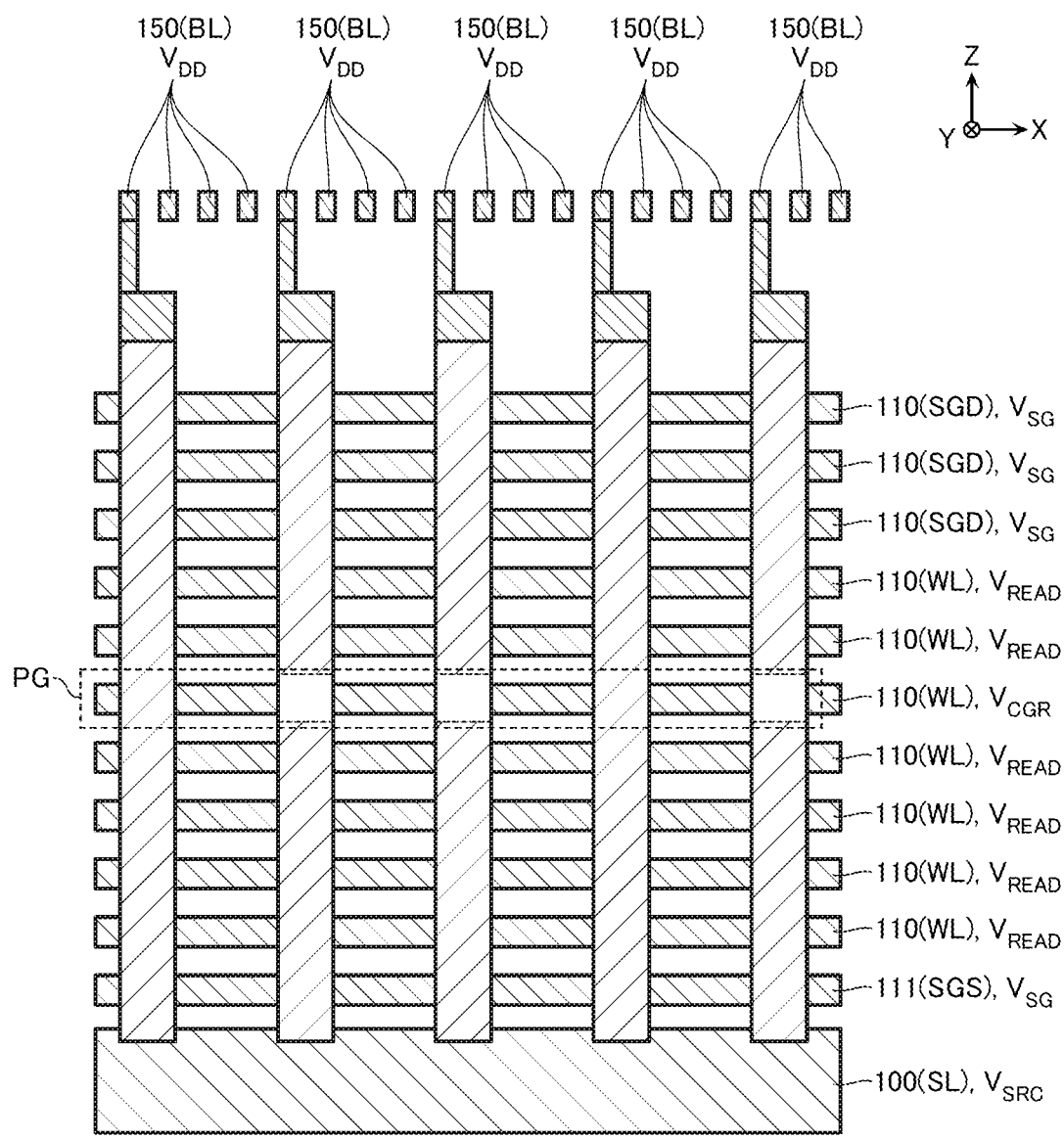
FIG. 25 is a schematic cross-sectional view for describing a read operation of the semiconductor memory device according to the first embodiment.

Next, with reference to FIG. 25, the read operation of the semiconductor memory device according to the embodiment will be more specifically described. FIG. 25 is a schematic cross-sectional view for describing the read operation.

In the following description, a configuration that includes all the memory cells MC included in one string unit SU and connected to one word line WL is referred to as a page PG in some cases. In FIG. 25, an example of collectively reading out data from one page PG will be described.

In the read operation, for example, a voltage $V_{DD}$ is applied to the bit lines BL, and a voltage $V_{SRC}$ is applied to the source line SL. The voltage $V_{SRC}$ has a magnitude, for example, similar to that of the ground voltage $V_{SS}$. The voltage $V_{SRC}$ is, for example, larger than the ground voltage $V_{SS}$ and smaller than the voltage $V_{DD}$. The voltage $V_{DD}$ is, for example, larger than the ground voltage $V_{SS}$.

The plurality of memory cells MC connected to the selected word line WL are electrically conducted with the bit lines BL and the source line SL. For example, a voltage $V_{SG}$ is applied to the select gate lines (SGD, SGS). A difference between the voltage $V_{SG}$ and the voltage $V_{DD}$ is larger than the threshold voltage when the select transistors (STD, STS) are operated as NMOS transistors. Therefore, electron channels are formed in the channel regions of the select transistors (STD, STS). The read pass voltage $V_{READ}$ is applied to the unselected word lines WL. Thus, electron channels are formed in the channel regions of the unselected word lines WL.

The read voltage $V_{CGR}$ is applied to the selected word line WL. Thus, electron channels are formed in the channel regions of the memory cells MC corresponding to the lower state, and any channel is not formed in the channel regions of the memory cells MC corresponding to the upper state.

A sense operation is executed by a sense amplifier unit in the peripheral circuit PC. In the sense operation, the current flowing in the bit line BL is measured, thereby obtaining the data stored in the memory cell MC.

The example of collectively reading out the data from all of the memory cells MC included in one page PG in the read operation has been described above. However, in the read operation, the data may be read from only one memory cell MC, and the data may be collectively read from only a part of the memory cells MC included in one page PG. In this case, for example, the voltage $V_{DD}$ may be applied to the bit line BL connected to the memory cell MC as a target of the read operation, and the voltage $V_{SRC}$ may be applied to the other bit lines BL.

Write Operation

Figure 26:
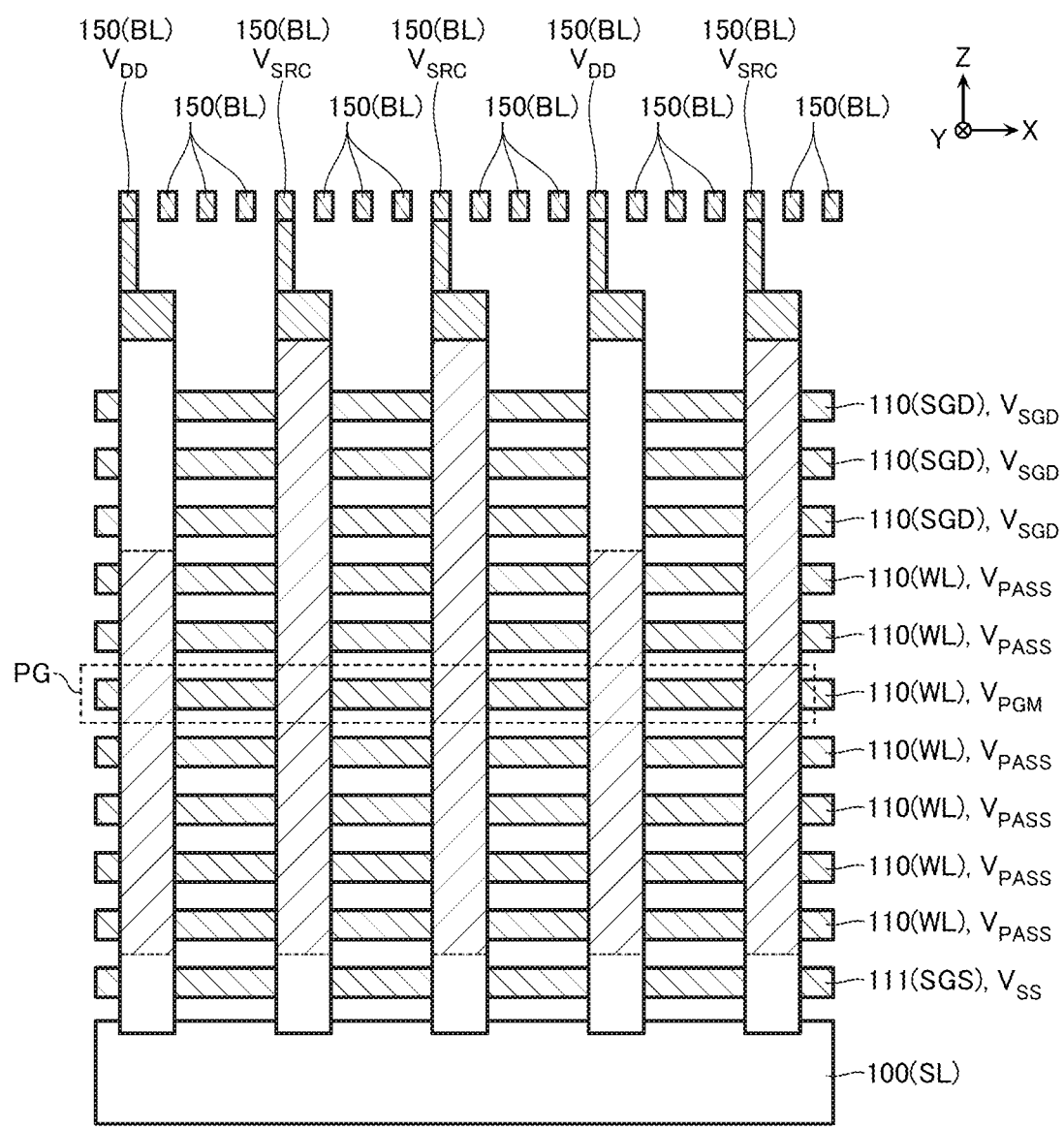
FIG. 26 is a schematic cross-sectional view for describing a write operation of the semiconductor memory device according to the first embodiment.

Next, with reference to FIG. 26, the write operation will be described. FIG. 26 is a schematic cross-sectional view for describing the write operation.

In FIG. 26, an example of collectively writing data on one page PG will be described.

In the write operation, for example, the voltage $V_{SRC}$ is applied to the bit lines BL connected to selected memory cells MC that adjust the threshold voltage (hereinafter referred to as "write memory cells MC") among a plurality of selected memory cells MC, and the voltage $V_{DD}$ is applied to the bit lines BL connected to selected memory cells MC that does not adjust the threshold voltage (hereinafter referred to as "inhibited memory cells MC") among the plurality of selected memory cells MC.

The write memory cells MC are selectively electrically conducted with the bit lines BL. For example, a voltage $V_{SGD}$ is applied to the drain-side select gate line SGD. The voltage $V_{SGD}$ is, for example, smaller than the voltage $V_{SG}$ of FIG. 25.

A difference between the voltage $V_{SGD}$ and the voltage $V_{SRC}$ is larger than the threshold voltage when the drain-side select transistor STD is operated as an NMOS transistor. Therefore, electron channels are formed in the channel regions of the drain-side select transistors STD connected to the bit lines BL to which the voltage $V_{SRC}$ is applied.

Meanwhile, a difference between the voltage $V_{SGD}$ and the voltage $V_{DD}$ is smaller than the threshold voltage when the drain-side select transistor STD is operated as an NMOS transistor. Therefore, any channel is not formed in the channel regions of the drain-side select transistors STD connected to the bit lines BL to which the voltage $V_{DD}$ is applied.

The memory cells MC are electrically separated from the source line SL. For example, the ground voltage $V_{SS}$ is applied to the source-side select gate line SGS.

A write pass voltage $V_{PASS}$ is applied to the unselected word lines WL. For example, the write pass voltage $V_{PASS}$ may be larger than the read pass voltage $V_{READ}$ in FIG. 25, or may be similar to the read pass voltage $V_{READ}$. Thus, electron channels are formed in the channel regions of the memory cells MC connected to the unselected word lines WL.

The write voltage $V_{PGM}$ is applied to the selected word line WL. The write voltage $V_{PGM}$ is larger than the write pass voltage $V_{PASS}$.

Here, since the voltage $V_{SRC}$ is applied to the channel regions of the write memory cells MC, a voltage similar to the write voltage $V_{PGM}$ is applied to the gate insulating layers 130 of the write memory cells MC. Accordingly, the polarization states of the ferroelectric layers 131 in the write memory cells MC can be changed.

Meanwhile, the channel regions of the inhibited memory cells MC are separated from both the bit lines BL and the source line SL, thus being in an electrically floating state. Voltages of the channels of the inhibited memory cells MC have magnitudes approximately the same as that of the write pass voltage $V_{PASS}$ because of the capacitive coupling with the unselected word lines WL. Accordingly, a voltage approximately the same as a difference between the write voltage $V_{PGM}$ and the write pass voltage $V_{PASS}$ is applied to the gate insulating layers 130 of the inhibited memory cells MC. Thus, the polarization states of the ferroelectric layers 131 in the inhibited memory cells MC can be maintained.

The example of collectively writing the data on all of the memory cells MC included in one page PG in the write operation has been described above. However, in the write operation, the data may be written to only one memory cell MC, and the data may be collectively written to only a part of the memory cells MC included in one page PG. In this case, for example, the voltage $V_{DD}$ may be applied to the bit line BL connected to the memory cell MC not a target of the write operation.

Erase Operation

Figure 27:
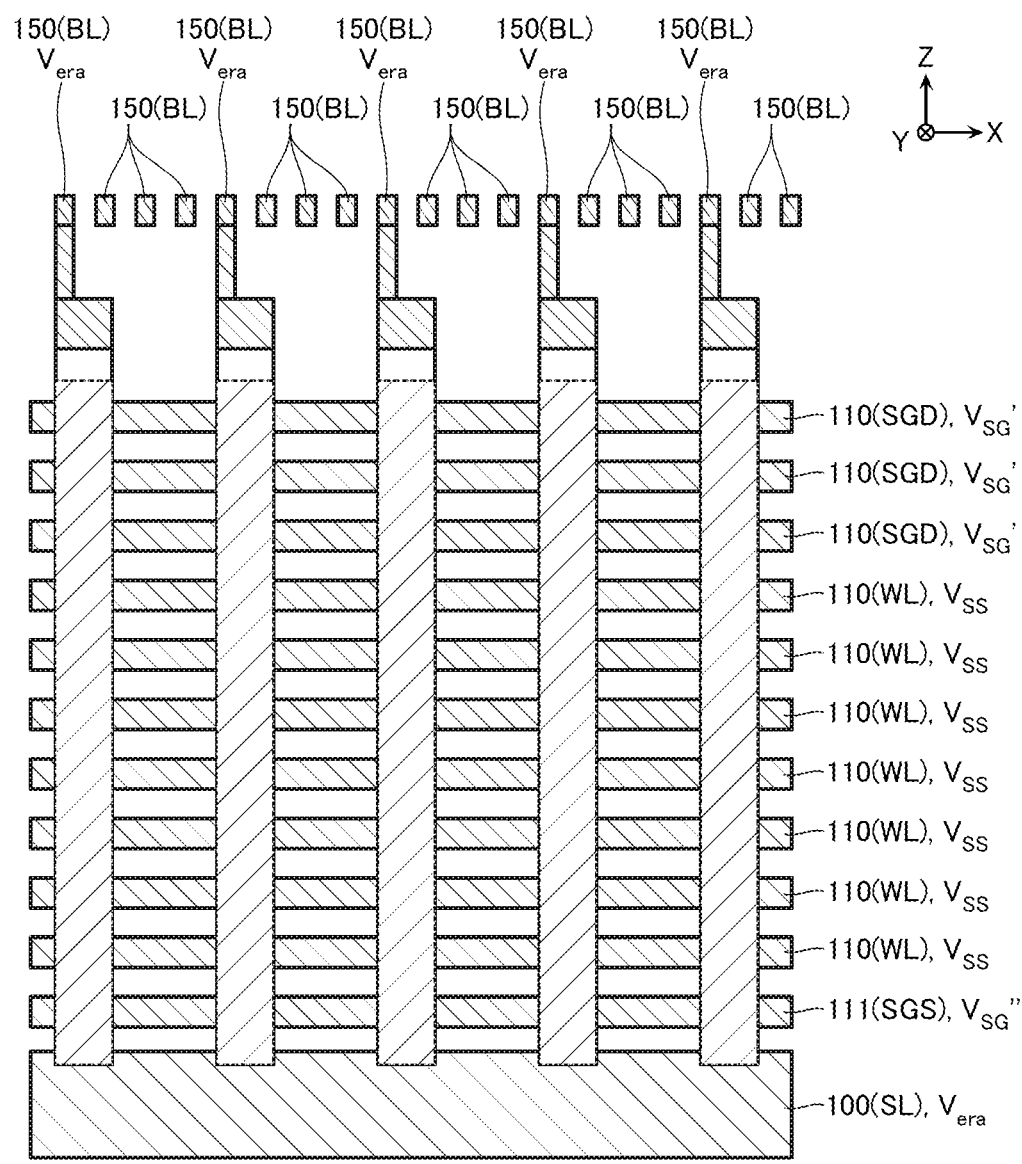
FIG. 27 is a schematic cross-sectional view for describing an erase operation of the semiconductor memory device according to the first embodiment.

Next, with reference to FIG. 27, the erase operation will be described. FIG. 27 is a schematic cross-sectional view for describing the erase operation.

In FIG. 27, an example of collectively erasing the data from one memory block BLK will be described.

In the erase operation, for example, the erase voltage $V_{era}$ is applied to the bit lines BL and the source line SL.

Holes are provided to the semiconductor layers 120.

For example, in the illustrated example, a voltage $V_{SG}'$ is applied to the drain-side select gate lines SGD. The voltage $V_{SG}'$ is at least smaller than the erase voltage $V_{era}$. The voltage $V_{SG}'$ is a voltage, for example, having a magnitude enough to cause Gate Induced Drain Leakage (GIDL) in the drain-side select transistor STD. Thus, electron and hole pairs are generated in the channel regions of the drain-side select transistors STD, and the generated holes are supplied to the semiconductor layers 120.

For example, in the illustrated example, a voltage $V_{SG}''$ is applied to the source-side select gate line SGS. The voltage $V_{SG}''$ is at least smaller than the erase voltage $V_{era}$. A difference between the voltage $V_{SG}''$ and the erase voltage $V_{era}$ is larger than the threshold voltage when the source-side select gate line SGS is operated as a PMOS transistor. Therefore, hole channels are formed in the channel regions of the source-side select transistors STS. Thus, the holes in the semiconductor substrate 100 are supplied to the semiconductor layers 120.

The ground voltage $V_{SS}$ is applied to the word lines WL. Here, since the erase voltage $V_{era}$ is applied to the channel regions of the memory cells MC, a voltage similar to the erase voltage $V_{era}$ is applied to the gate insulating layers 130 of the memory cells MC. Thus, the polarization states of the ferroelectric layers 131 in the memory cells MC can be changed.

The example of collectively erasing the data from all of the memory cells MC included in one memory block BLK in the erase operation has been described above. However, in the erase operation, the data may be erased from only one memory cell MC, the erase operation may be collectively executed to all of or a part of the memory cells MC included in one page PG, and the data may be collectively erased from only a part of the memory cells MC included in one memory block BLK. In this case, for example, the source-side select transistor STS may be turned OFF and a voltage smaller than the erase voltage $V_{era}$ may be applied to the bit line BL connected to the memory cell MC not the target of the erase operation. In this case, for example, the erase voltage $V_{era}$ or another voltage larger than the ground voltage $V_{SS}$ may be applied to the word lines WL other than the selected word line WL.

The example in which the holes are generated by GIDL in the drain-side select transistors STD to supply the holes to the semiconductor layers 120 and the holes are supplied to the semiconductor layers 120 also from the source-side select transistors STS has been described above. However, in the erase operation, one of them can be omitted.

Threshold Voltage Adjustment Operation

Figure 28:
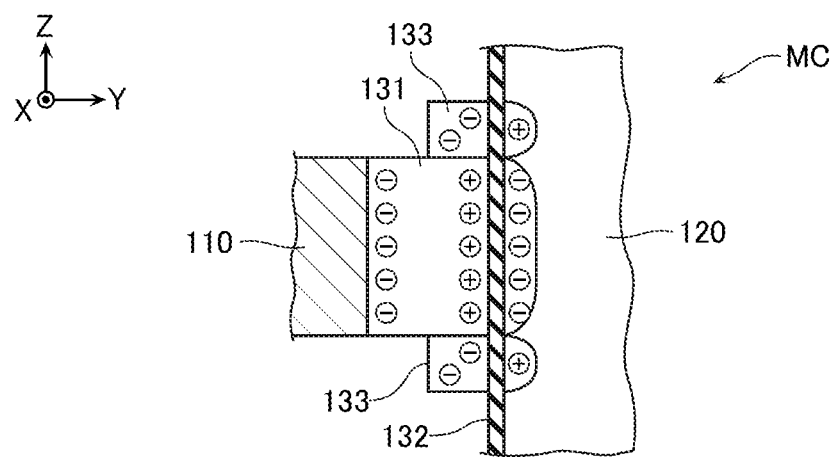
FIG. 28 is a schematic cross-sectional view for describing a state of the memory cell MC.
Figure 29:
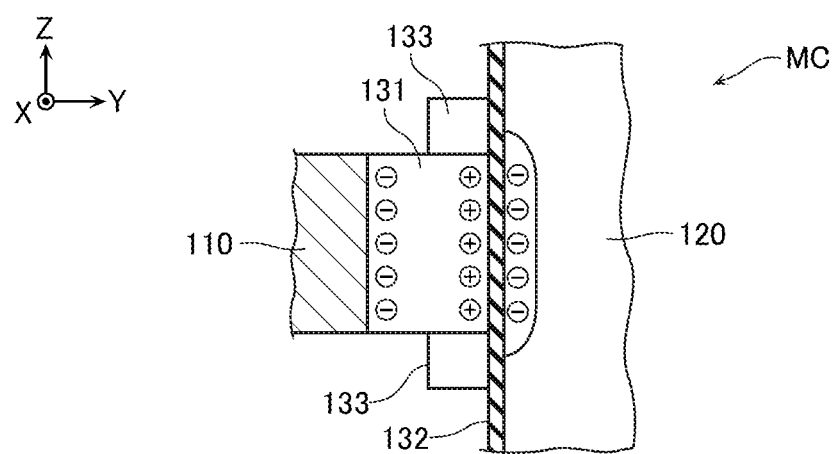
FIG. 29 is a schematic cross-sectional view for describing a state of the memory cell MC.

As described above, in the semiconductor memory device according to the embodiment, when the voltage of positive polarity is applied to the gate electrode of the memory cell MC in the state $S_1$ (FIG. 7), the electrons in the channel formed in the semiconductor layer 120 tunnel through the insulating layer 132 to reach the charge storage layer 133, thus being accumulated in the charge storage layer 133. Here, immediately after the end of the write operation, for example, as illustrated in FIG. 28, the electrons remain in the charge storage layer 133 in some cases. In this case, a positive electric charge is induced in the surface of the semiconductor layer 120 by the electrons in the charge storage layer 133, thereby separating the electron channel formed in the surface of the semiconductor layer 120 in some cases. In this case, the state of the memory cell MC cannot be appropriately read out in some cases. Therefore, the semiconductor memory device according to the embodiment is configured to be able to perform an operation of extracting the electrons accumulated in the charge storage layer 133 to the semiconductor layer 120 side in a period from the execution of the write operation to the execution of the read operation. Accordingly, as illustrated in FIG. 29, separating the electron channel can be reduced. Hereinafter, such an operation is referred to as a threshold voltage adjustment operation.

Figure 30:
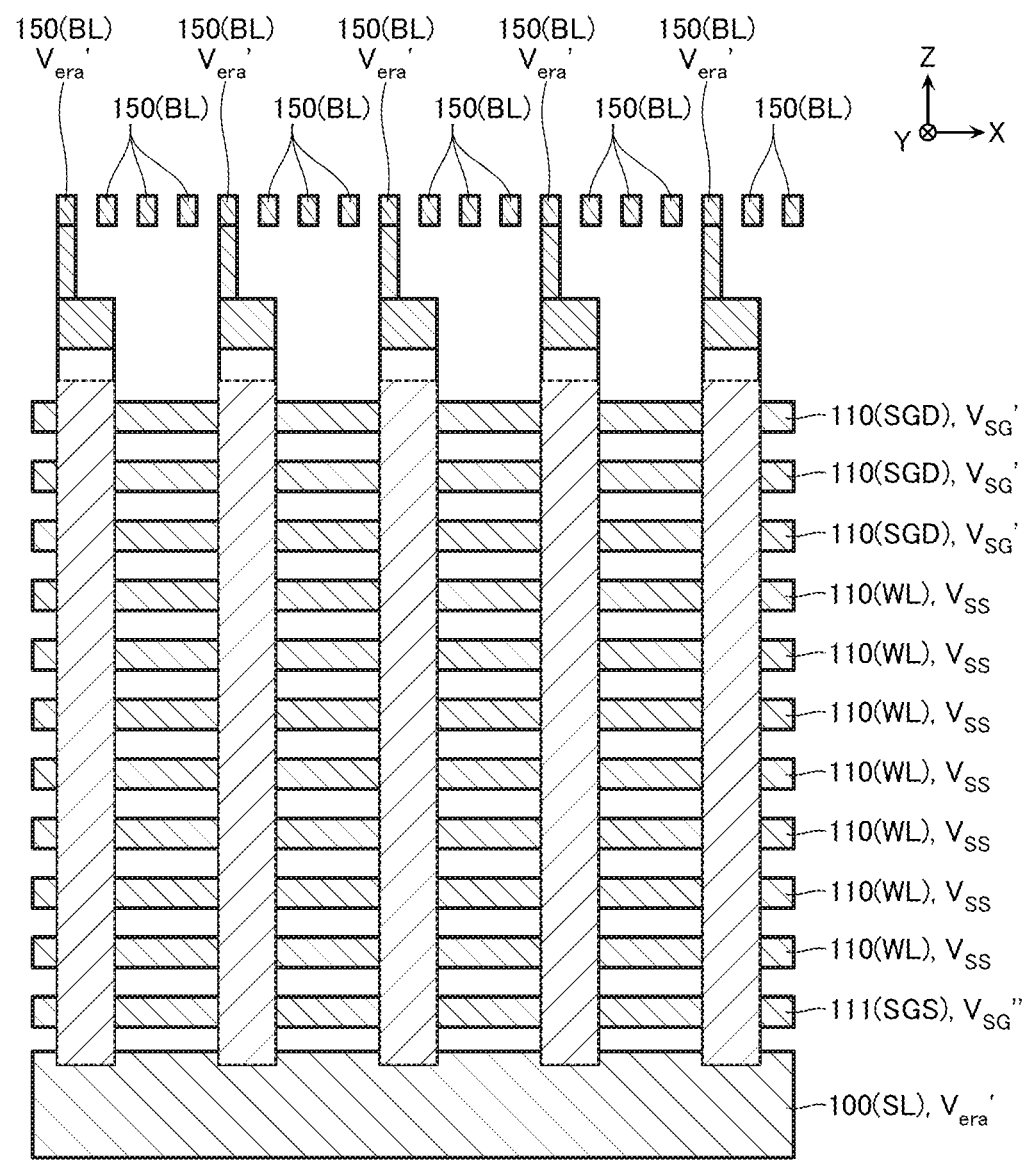
FIG. 30 is a schematic cross-sectional view for describing a threshold voltage adjustment operation of the semiconductor memory device according to the first embodiment.

Next, with reference to FIG. 30, the threshold voltage adjustment operation will be described. FIG. 30 is a schematic cross-sectional view for describing the threshold voltage adjustment operation.

In FIG. 30, an example of collectively executing the threshold voltage adjustment to a plurality of memory cells MC included in one memory block BLK will be described.

The threshold voltage adjustment is basically executed similarly to the erase operation described with reference to FIG. 27. However, in the threshold voltage adjustment operation, a voltage $V_{era}'$ is applied to the bit lines BL and the source line SL instead of the erase voltage $V_{era}$. The voltage $V_{era}'$ is large enough to extract the electrons from the charge storage layer 133. The voltage $V_{era}'$ is small so as not to cause the polarization inversion in the ferroelectric layer 131 of the memory cell MC in the state $S_2$. For example, the voltage $V_{era}'$ is at least smaller than the erase voltage $V_{era}$.

The example of collectively executing the threshold voltage adjustment operation to all of the memory cells MC included in one memory block BLK has been described above. However, the threshold voltage adjustment operation may be executed to only one memory cell MC, may be collectively executed to all of or a part of the memory cells MC included in one page PG, and may be collectively executed to a part of the memory cells MC included in one memory block BLK. In this case, for example, the source-side select transistor STS may be turned OFF and a voltage smaller than the voltage $V_{era}'$ may be applied to the bit line BL connected to the memory cell MC not the target of the threshold voltage adjustment operation. In this case, for example, the voltage $V_{era}'$ or another voltage larger than the ground voltage $V_{SS}$ may be applied to the word lines WL other than the selected word line WL.

The example in which the holes are generated by GIDL in the drain-side select transistors STD to supply the holes to the semiconductor layers 120 and the holes are supplied to the semiconductor layers 120 also from the source-side select transistors STS has been described above. However, in the threshold voltage adjustment operation, one of them can be omitted.

The threshold voltage adjustment operation only needs to be executed after the execution of the write operation to the execution of the read operation.

For example, after the execution of the write operation to a plurality of pages PG, the threshold voltage adjustment operation may be collectively executed to all of the memory cells MC in the memory block BLK corresponding to these plurality of pages PG as described with reference to FIG. 30. With this method, the time necessary for executing the threshold voltage adjustment operation can be reduced.

The threshold voltage adjustment operation may be collectively executed to all of the memory cells MC in one page PG every time when the write operation is executed to this page PG. When the read operation is executed to one page PG, the threshold voltage adjustment operation may be collectively executed to all of the memory cells MC in this page PG immediately before executing the read operation. Since it is not necessary to latch information on the memory block BLK to which the threshold voltage adjustment operation has been executed or information on the memory block BLK to which the threshold voltage adjustment operation has not been executed, this method can be relatively easily achieved.

Second Embodiment

Configuration

Figure 31:
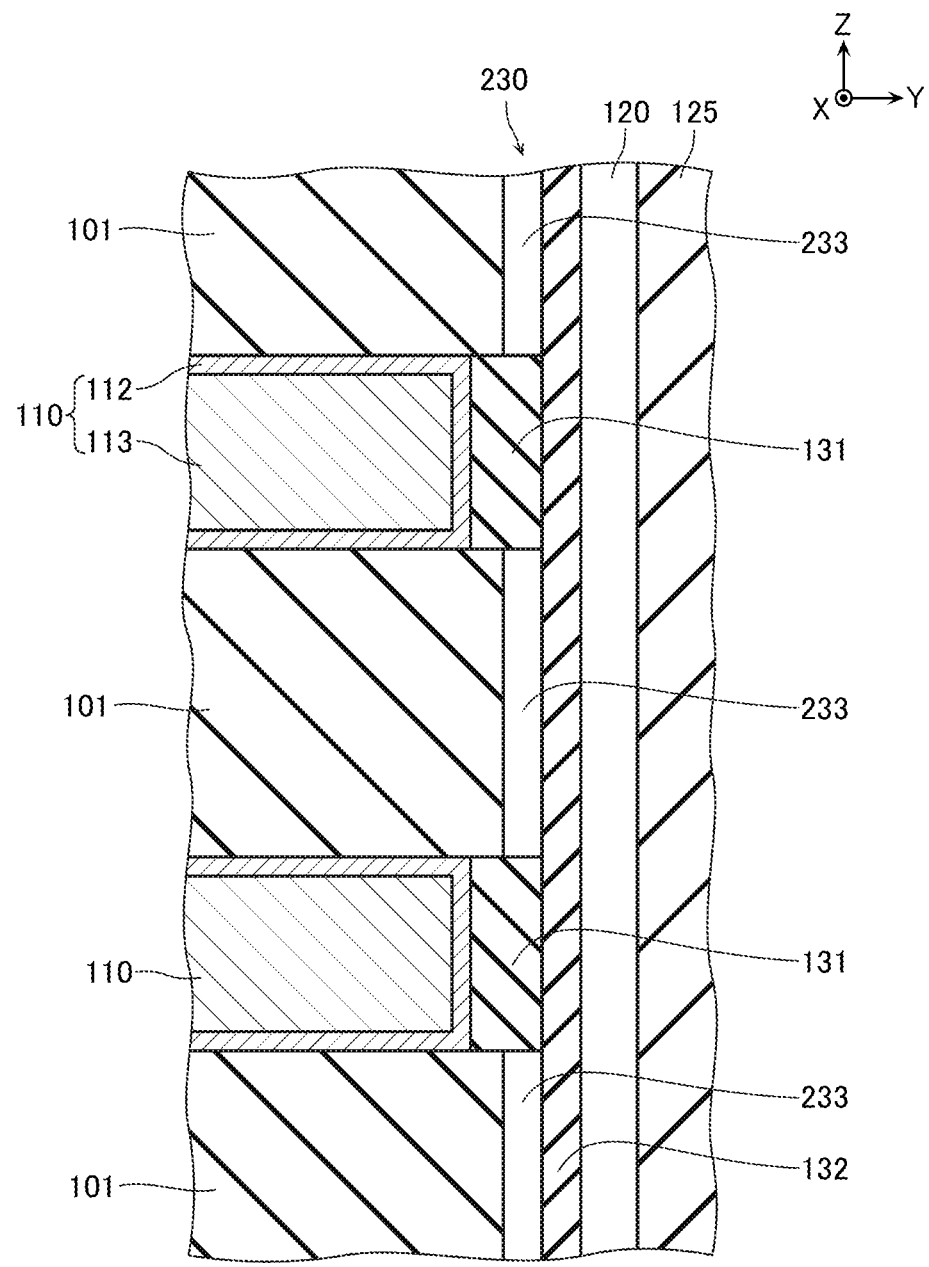
FIG. 31 is a schematic cross-sectional view illustrating a part of a configuration of a semiconductor memory device according to a second embodiment.

Next, with reference to FIG. 31, a semiconductor memory device according to the second embodiment will be described. FIG. 31 is a schematic cross-sectional view illustrating a part of a configuration of the semiconductor memory device according to the second embodiment.

In the semiconductor memory device according to the first embodiment, for example, as described with reference to FIG. 4, the charge storage layers 133 corresponding to the two memory cells MC mutually adjacent in the Z-direction are separated in the Z-direction and mutually spaced in the Z-direction. However, such a configuration is merely an example, the charge storage layers corresponding to the two memory cells MC mutually adjacent in the Z-direction may be mutually connected.

For example, the semiconductor memory device according to the second embodiment is basically configured similarly to the semiconductor memory device according to the first embodiment. However, the semiconductor memory device according to the second embodiment does not include the insulating layers 102 (FIG. 4). The semiconductor memory device according to the second embodiment includes a gate insulating layer 230 instead of the gate insulating layer 130 (FIG. 4).

The gate insulating layer 230 is basically configured similarly to the gate insulating layer 130. However, the gate insulating layer 230 includes a plurality of charge storage layers 233 instead of the plurality of charge storage layers 133 (FIG. 4).

The charge storage layer 233 is basically configured similarly to the charge storage layer 133. However, the charge storage layers 133 are disposed between the two ferroelectric layers 131 mutually adjacent in the Z-direction two by two. Meanwhile, the charge storage layers 233 are disposed between the two ferroelectric layers 131 mutually adjacent in the Z-direction one by one.

In the illustrated example, the charge storage layer 233 is in contact with the insulating layer 101, the two ferroelectric layers 131 mutually adjacent in the Z-direction, and the insulating layer 132.

Manufacturing Method

The semiconductor memory device according to the second embodiment is basically manufactured similarly to the semiconductor memory device according to the first embodiment.

However, in the manufacture of the semiconductor memory device according to the second embodiment, the insulating layers 102 are not formed in the process described with reference to FIG. 11.

In the process described with reference to FIG. 17, not the insulating layers 102 but the insulating layers 101 are partially removed to form cavities at positions corresponding to the charge storage layers 233.

In the process described with reference to FIG. 18, layers constituting the charge storage layers 233 are formed in the cavities.

Third Embodiment

Configuration

Figure 32:
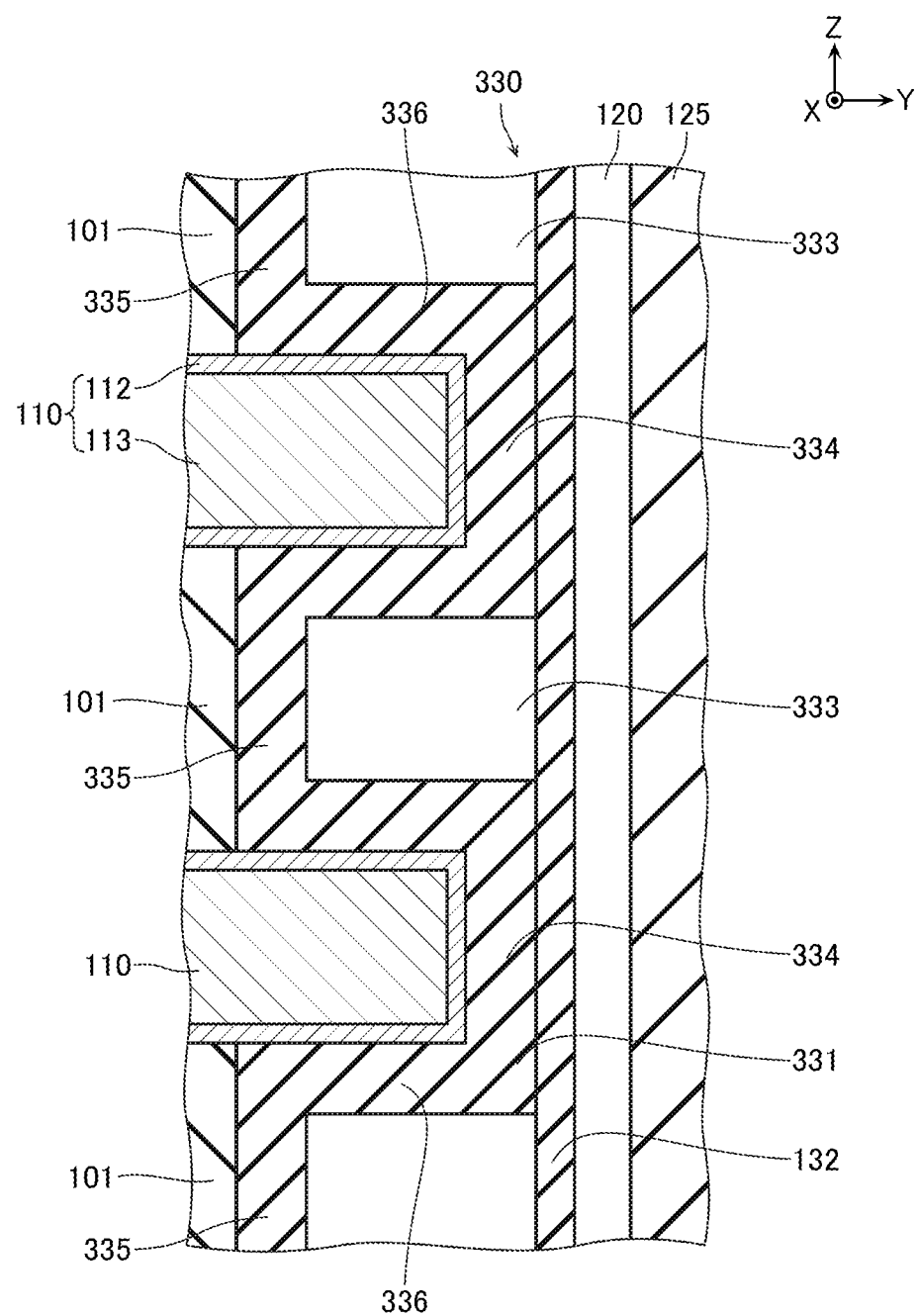
FIG. 32 is a schematic cross-sectional view illustrating a part of a configuration of a semiconductor memory device according to a third embodiment.

Next, with reference to FIG. 32, a semiconductor memory device according to the third embodiment will be described. FIG. 32 is a schematic cross-sectional view illustrating a part of a configuration of the semiconductor memory device according to the third embodiment.

In the semiconductor memory device according to the first embodiment, for example, as described with reference to FIG. 4, a plurality of the ferroelectric layers 131 are disposed corresponding to a plurality of the conductive layers 110. The plurality of ferroelectric layers 131 arranged in the Z-direction are separated in the Z-direction and mutually spaced in the Z-direction. However, the plurality of ferroelectric layers 131 arranged in the Z-direction may be mutually connected.

For example, the semiconductor memory device according to the third embodiment is basically configured similarly to the semiconductor memory device according to the first embodiment. However, the semiconductor memory device according to the third embodiment does not include the insulating layers 102 (FIG. 4). The semiconductor memory device according to the third embodiment includes a gate insulating layer 330 instead of the gate insulating layer 130 (FIG. 4).

For example, as illustrated in FIG. 32, the gate insulating layer 330 includes a ferroelectric layer 331 extending in the Z-direction, an insulating layer 132 extending in the Z-direction, and a plurality of charge storage layers 333 arranged in the Z-direction.

The ferroelectric layer 331 is basically configured similarly to the ferroelectric layer 131. However, the ferroelectric layer 331 includes a plurality of parts 334 arranged in the Z-direction corresponding to the plurality of conductive layers 110, a plurality of parts 335 arranged in the Z-direction corresponding to the plurality of insulating layers 101, and a plurality of parts 336 connected to these plurality of parts 334, 335.

The plurality of parts 334 are each disposed between the conductive layer 110 and the insulating layer 132. In the illustrated example, the part 334 is in contact with the conductive layer 110 and the insulating layer 132.

The plurality of parts 335 are each disposed between the insulating layer 101 and the charge storage layer 333. In the illustrated example, the part 335 is in contact with the insulating layer 101 and the charge storage layer 333.

The plurality of parts 336 are each disposed between the conductive layer 110 and the charge storage layer 333. In the illustrated example, the odd-numbered parts 336 counting from one side in the Z-direction are in contact with lower surfaces of the conductive layers 110 and upper surfaces of the charge storage layers 333. These parts 336 are connected to lower ends of the parts 334 and upper ends of the parts 335. In the illustrated example, the even-numbered parts 336 counting from the one side in the Z-direction are in contact with upper surfaces of the conductive layers 110 and lower surfaces of the charge storage layers 333. These parts 336 are connected to upper ends of the parts 334 and lower ends of the parts 335.

The charge storage layer 333 is basically configured similarly to the charge storage layer 133. However, the charge storage layers 333 are disposed between the two parts 334 mutually adjacent in the Z-direction one by one.

Manufacturing Method

Next, with reference to FIG. 33 to FIG. 37, a method for manufacturing the semiconductor memory device according to the third embodiment will be described. FIG. 33 to FIG. 37 are schematic cross-sectional views for describing the manufacturing method.

In the manufacture of the semiconductor memory device according to the third embodiment, in the manufacturing process of the semiconductor memory device according to the first embodiment, the processes up to the processes described with reference to FIG. 12 and FIG. 13 are performed. However, in the manufacture of the semiconductor memory device according to the third embodiment, in the process described with reference to FIG. 11, the insulating layers 102 are not formed.

Figure 33:
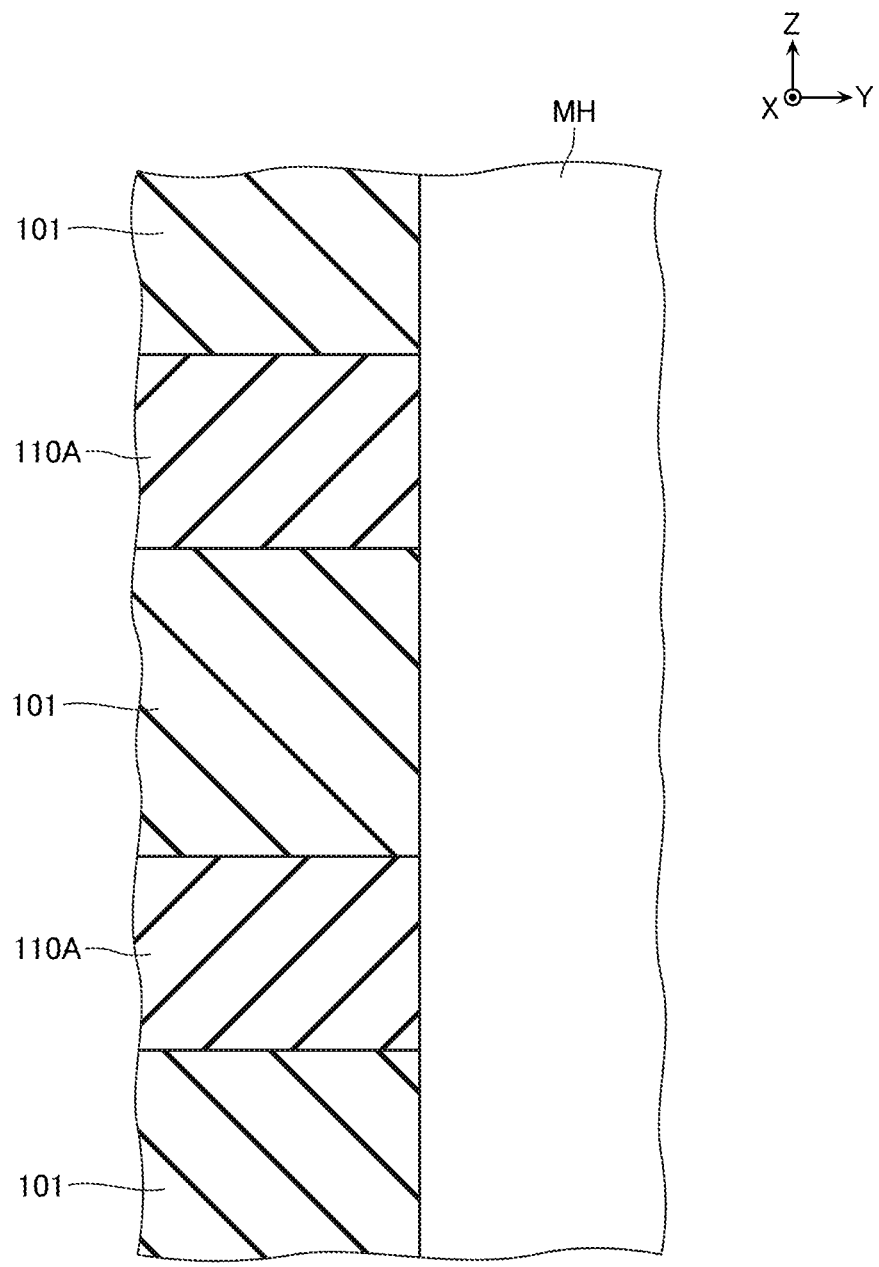
FIG. 33 is a schematic cross-sectional view for describing a method for manufacturing the semiconductor memory device according to the third embodiment.
Figure 34:
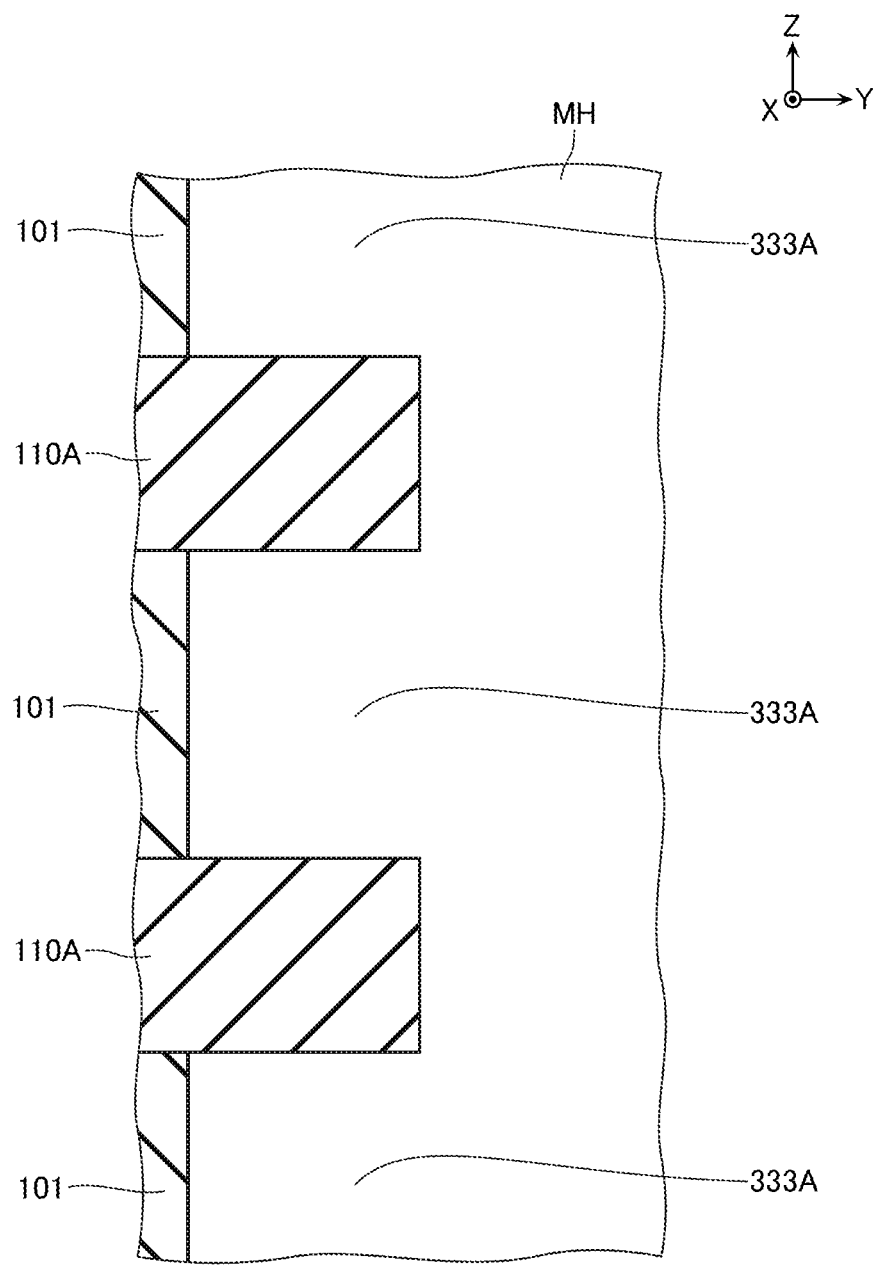
FIG. 34 is a schematic cross-sectional view for describing the manufacturing method.

Next, for example, as illustrated in FIG. 33 and FIG. 34, the insulating layers 101 are partially removed via the memory hole MH to form cavities 333A at positions corresponding to the ferroelectric layer 331 (FIG. 32) and the charge storage layers 333. This process is performed by, for example, wet etching.

Figure 35:
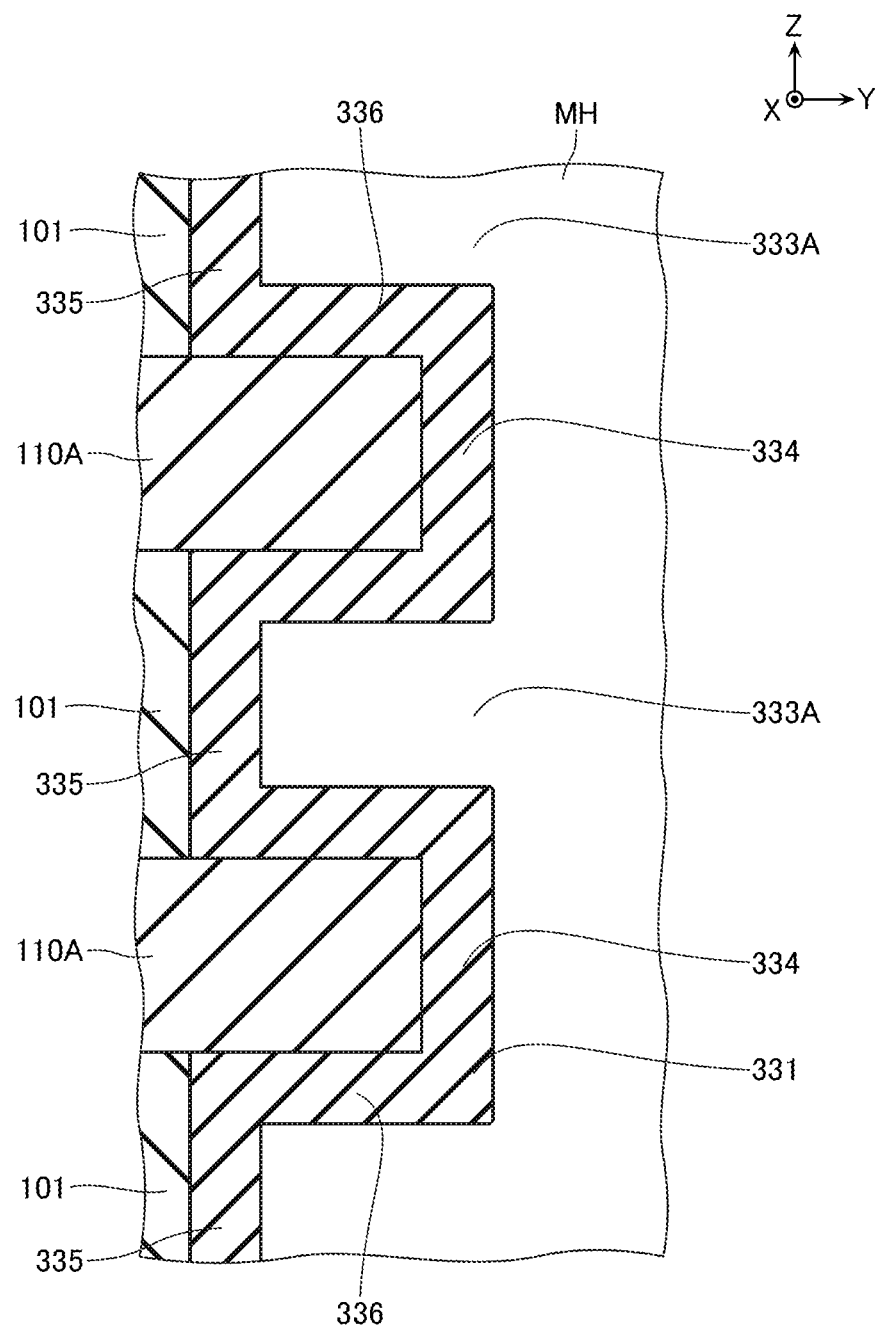
FIG. 35 is a schematic cross-sectional view for describing the manufacturing method.

Next, for example, as illustrated in FIG. 35, the ferroelectric layer 331 is formed on the inner peripheral surface of the memory hole MH. The ferroelectric layer 331 is formed to be thin, for example, so as not to fill the cavities 333A and the memory hole MH. This process is performed by the method such as CVD.

Figure 36:
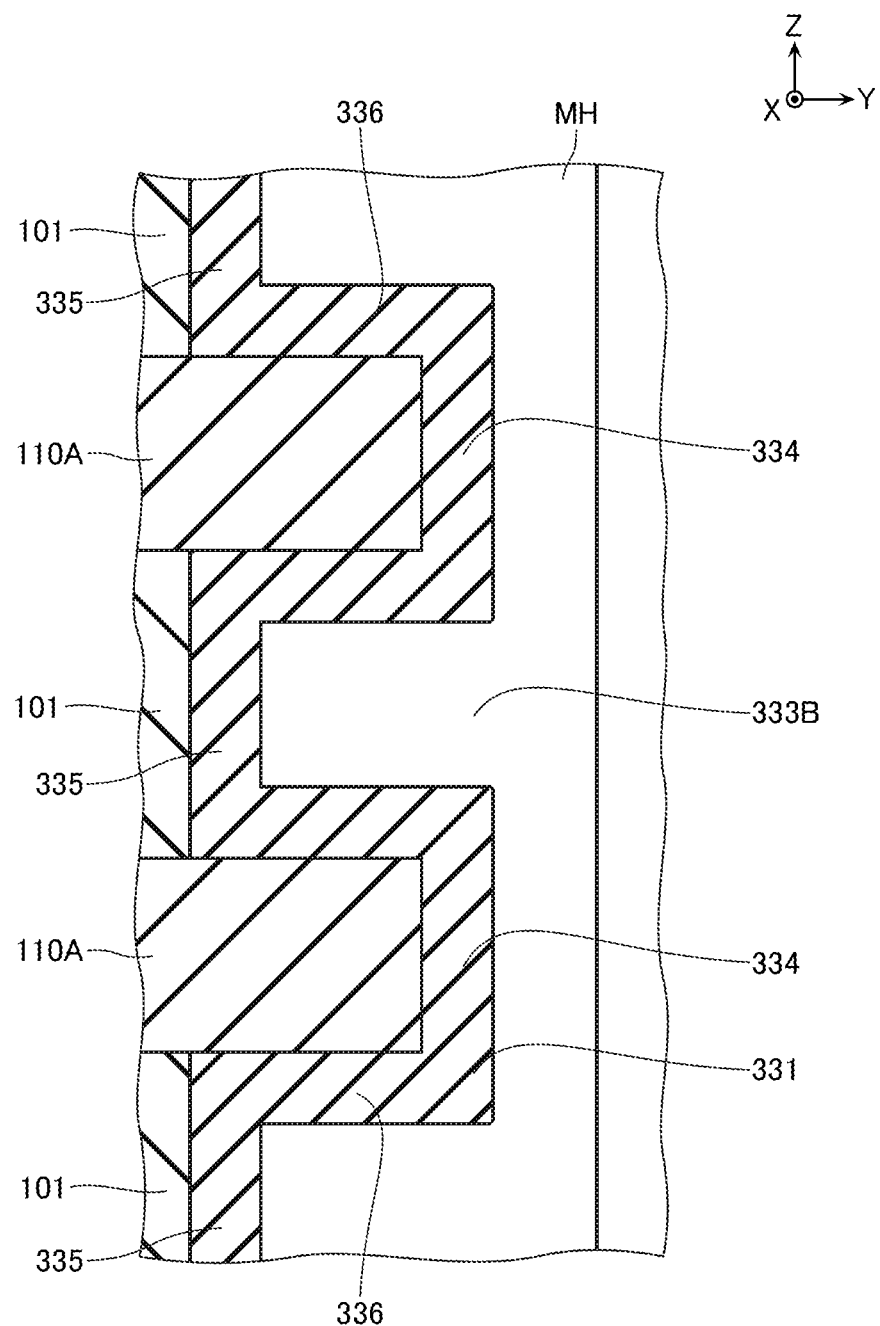
FIG. 36 is a schematic cross-sectional view for describing the manufacturing method.

Next, for example, as illustrated in FIG. 36, a charge storage layer 333B is formed on the inner peripheral surface of the memory hole MH. The charge storage layer 333B is formed to be thick, for example, enough to fill the cavities 333A (FIG. 35). The charge storage layer 333B is formed to be thin so as not to fill the memory hole MH. This process is performed by the method such as CVD.

Figure 37:
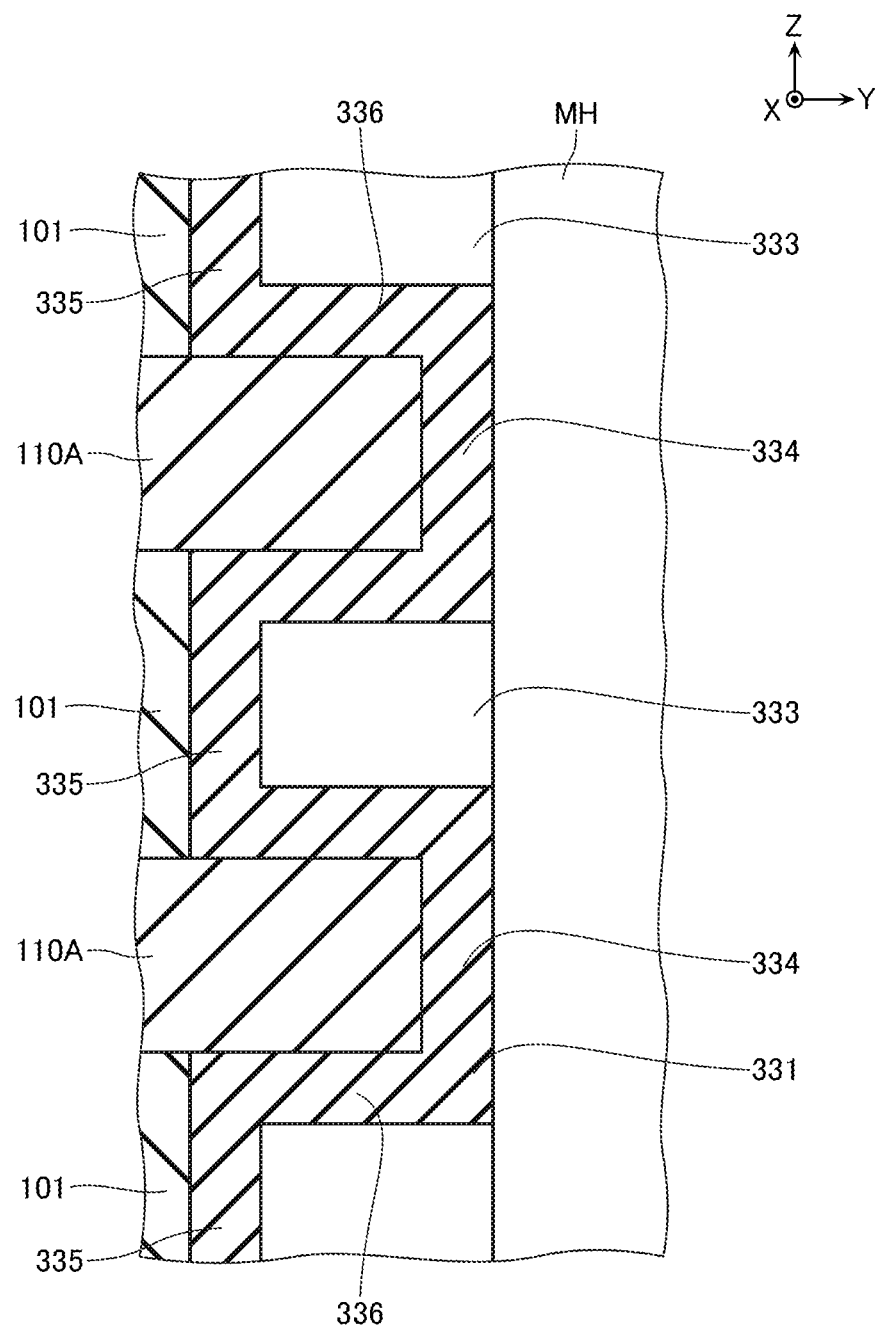
FIG. 37 is a schematic cross-sectional view for describing the manufacturing method.

Next, for example, as illustrated in FIG. 37, the charge storage layer 333B is partially removed to expose side surfaces of the plurality of parts 334 in the ferroelectric layer 331. A plurality of the charge storage layers 333 are formed through this process. This process is performed by, for example, wet etching.

Then, the processes after the process described with reference to FIG. 20 in the manufacturing process of the semiconductor memory device according to the first embodiment are performed.

Fourth Embodiment

Configuration

Figure 38:
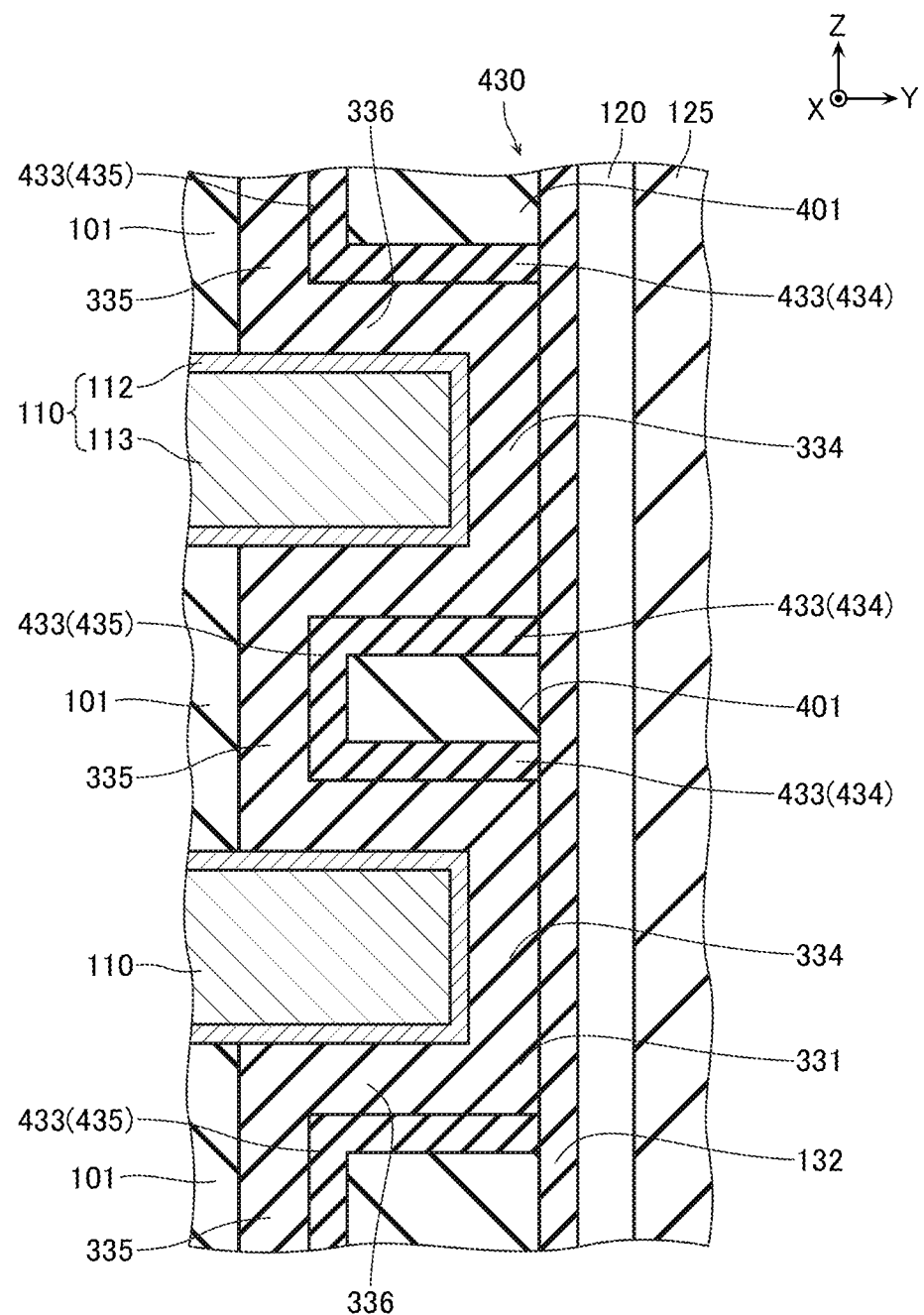
FIG. 38 is a schematic cross-sectional view illustrating a part of a configuration of a semiconductor memory device according to a fourth embodiment.

Next, with reference to FIG. 38, a semiconductor memory device according to the fourth embodiment will be described. FIG. 38 is a schematic cross-sectional view illustrating a part of a configuration of the semiconductor memory device according to the fourth embodiment.

The semiconductor memory device according to the fourth embodiment is basically configured similarly to the semiconductor memory device according to the third embodiment. However, the semiconductor memory device according to the fourth embodiment includes a gate insulating layer 430 instead of the gate insulating layer 330 (FIG. 32).

The gate insulating layer 430 is basically configured similarly to the gate insulating layer 330. However, the gate insulating layer 430 includes a plurality of charge storage layers 433 and a plurality of insulating layers 401 instead of the plurality of charge storage layers 333.

The insulating layer 401 is disposed between the two conductive layers 110 arranged in the Z-direction. In the illustrated example, the insulating layer 401 is in contact with the insulating layer 132. The insulating layer 401 contains silicon oxide ($SiO_2$) or the like.

The charge storage layer 433 is basically configured similarly to charge storage layer 333. However, the charge storage layer 433 includes two parts 434 and a part 435 connected to these two parts 434.

The part 434 is disposed between the insulating layer 401 and the part 336 of the ferroelectric layer 331. In the illustrated example, one part 434 is in contact with a lower surface of the insulating layer 401, an upper surface of the part 336, and the insulating layer 132. In the illustrated example, the other part 434 is in contact with an upper surface of the insulating layer 401, a lower surface of the part 336, and the insulating layer 132.

The part 435 is disposed between the insulating layer 401 and the part 335 of the ferroelectric layer 331. In the illustrated example, the part 435 is in contact with the insulating layer 401 and the part 335 of the ferroelectric layer 331. An upper end and a lower end of the part 435 are connected to the respective parts 434.

Manufacturing Method

The semiconductor memory device according to the fourth embodiment is basically manufactured similarly to the semiconductor memory device according to the third embodiment.

However, in the manufacture of the semiconductor memory device according to the fourth embodiment, in the process described with reference to FIG. 36, layers constituting the charge storage layers 433 and layers constituting the insulating layers 401 are formed on the inner peripheral surface of the memory hole MH instead of the charge storage layer 333B. These layers are formed to be thick, for example, enough to fill the cavities 333A (FIG. 35). These layers are formed to be thin so as not to fill the memory hole MH.

In the process described with reference to FIG. 37, these layers are partially removed to expose the side surfaces of the plurality of parts 334 in the ferroelectric layer 331. A plurality of charge storage layers 433 and insulating layers 401 are formed through this process.

Fifth Embodiment

Configuration

Figure 39:
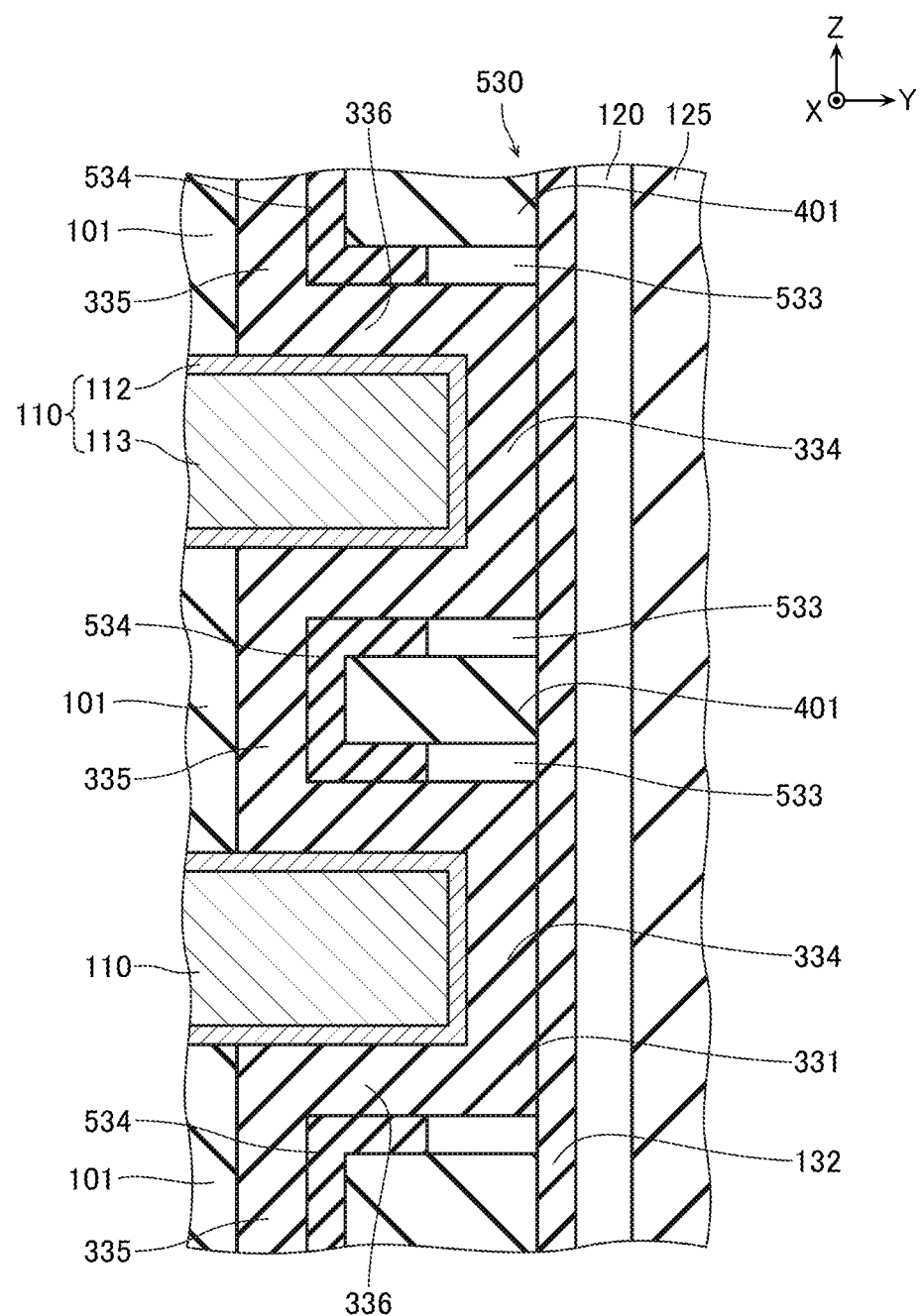
FIG. 39 is a schematic cross-sectional view illustrating a part of a configuration of a semiconductor memory device according to a fifth embodiment.

Next, with reference to FIG. 39, a semiconductor memory device according to the fifth embodiment will be described. FIG. 39 is a schematic cross-sectional view illustrating a part of a configuration of the semiconductor memory device according to the fifth embodiment.

The semiconductor memory device according to the fifth embodiment is basically configured similarly to the semiconductor memory device according to the fourth embodiment. However, the semiconductor memory device according to the fifth embodiment includes a gate insulating layer 530 instead of the gate insulating layer 430 (FIG. 38).

The gate insulating layer 530 is basically configured similarly to the gate insulating layer 430. However, the gate insulating layer 530 includes a plurality of charge storage layers 533 and a plurality of insulating layers 534 instead of the plurality of charge storage layers 433.

The charge storage layer 533 is basically configured similarly to the charge storage layer 433. However, the charge storage layer 533 is disposed between the insulating layer 401 and the part 336 of the ferroelectric layer 331. In the illustrated example, the odd-numbered charge storage layers 533 counting from one side in the Z-direction are in contact with the upper surfaces of the insulating layers 401, the lower surfaces of the parts 336, and the insulating layer 132. In the illustrated example, the even-numbered charge storage layers 533 counting from the one side in the Z-direction are in contact with the lower surfaces of the insulating layers 401, the upper surfaces of the parts 336, and the insulating layer 132. The charge storage layer 533 contains, for example, silicon (Si) containing impurities such as phosphorus (P) or boron (B).

The insulating layer 534 is disposed between the insulating layer 401 and the part 335 of the ferroelectric layer 331. In the illustrated example, the insulating layer 534 is in contact with the insulating layer 401 and the part 335 of the ferroelectric layer 331. An upper end and a lower end of the insulating layer 534 are connected to the respective charge storage layers 533. The insulating layer 534 contains silicon nitride ($Si_3N_4$) or the like.

Manufacturing Method

The semiconductor memory device according to the fifth embodiment is basically manufactured similarly to the semiconductor memory device according to the fourth embodiment.

However, in the manufacture of the semiconductor memory device according to the fifth embodiment, the insulating layer 534 is formed instead of the charge storage layer 433.

After the formation of the plurality of insulating layers 534 and insulating layers 401, the insulating layers 534 are partially removed to form cavities at positions corresponding to the charge storage layers 533 before the formation of the insulating layer 132.

Layers constituting the charge storage layers 533 are formed in these cavities. These layers are formed to be thick enough to fill these cavities. These layers are formed to be thin so as not to fill the memory hole MH. This process is performed by the method such as CVD.

These layers are partially removed to expose the side surfaces of the plurality of parts 334 in the ferroelectric layer 331. A plurality of the charge storage layers 533 are formed through this process.

Sixth Embodiment

Configuration

Figure 40:
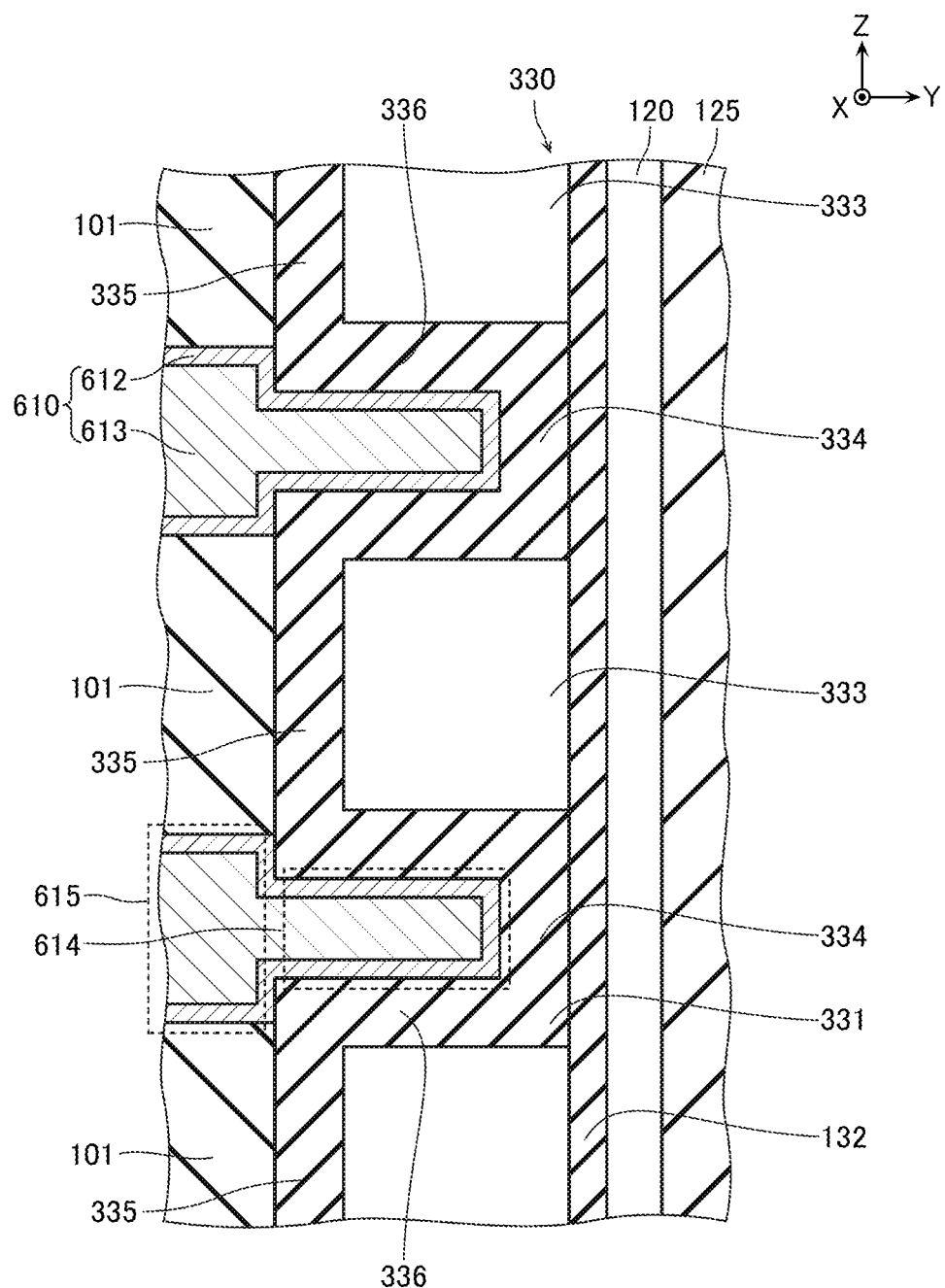
FIG. 40 is a schematic cross-sectional view illustrating a part of a configuration of a semiconductor memory device according to a sixth embodiment.

Next, with reference to FIG. 40, a semiconductor memory device according to the sixth embodiment will be described. FIG. 40 is a schematic cross-sectional view illustrating a part of a configuration of the semiconductor memory device according to the sixth embodiment.

The semiconductor memory device according to the sixth embodiment is basically configured similarly to the semiconductor memory device according to the third embodiment. However, the semiconductor memory device according to the sixth embodiment includes conductive layers 610 instead of the conductive layers 110.

The conductive layer 610 is basically configured similarly to the conductive layer 110. For example, in the illustrated example, the conductive layer 610 includes a stacked film of a barrier conductive film 612 of titanium nitride (TiN) or the like and a metal film 613 of tungsten (W) or the like. However, the conductive layer 610 includes a part 614 having a distance from the semiconductor layer 120 within a certain range and a part 615 having a distance from the semiconductor layer 120 out of the certain range. An upper surface and a lower surface of the part 614 are in contact with the ferroelectric layer 331. An upper surface and a lower surface of the part 615 are in contact with the insulating layers 101. A thickness of the part 614 in the Z-direction is smaller than a thickness of the part 615 in the Z-direction.

Manufacturing Method

The semiconductor memory device according to the sixth embodiment is basically manufactured similarly to the semiconductor memory device according to the third embodiment.

However, in the manufacture of the semiconductor memory device according to the sixth embodiment, after performing the process described with reference to FIG. 34, the sacrifice layers 110A are partially removed before performing the process described with reference to FIG. 35. This process is performed by, for example, wet etching.

Seventh Embodiment

Configuration

Figure 41:
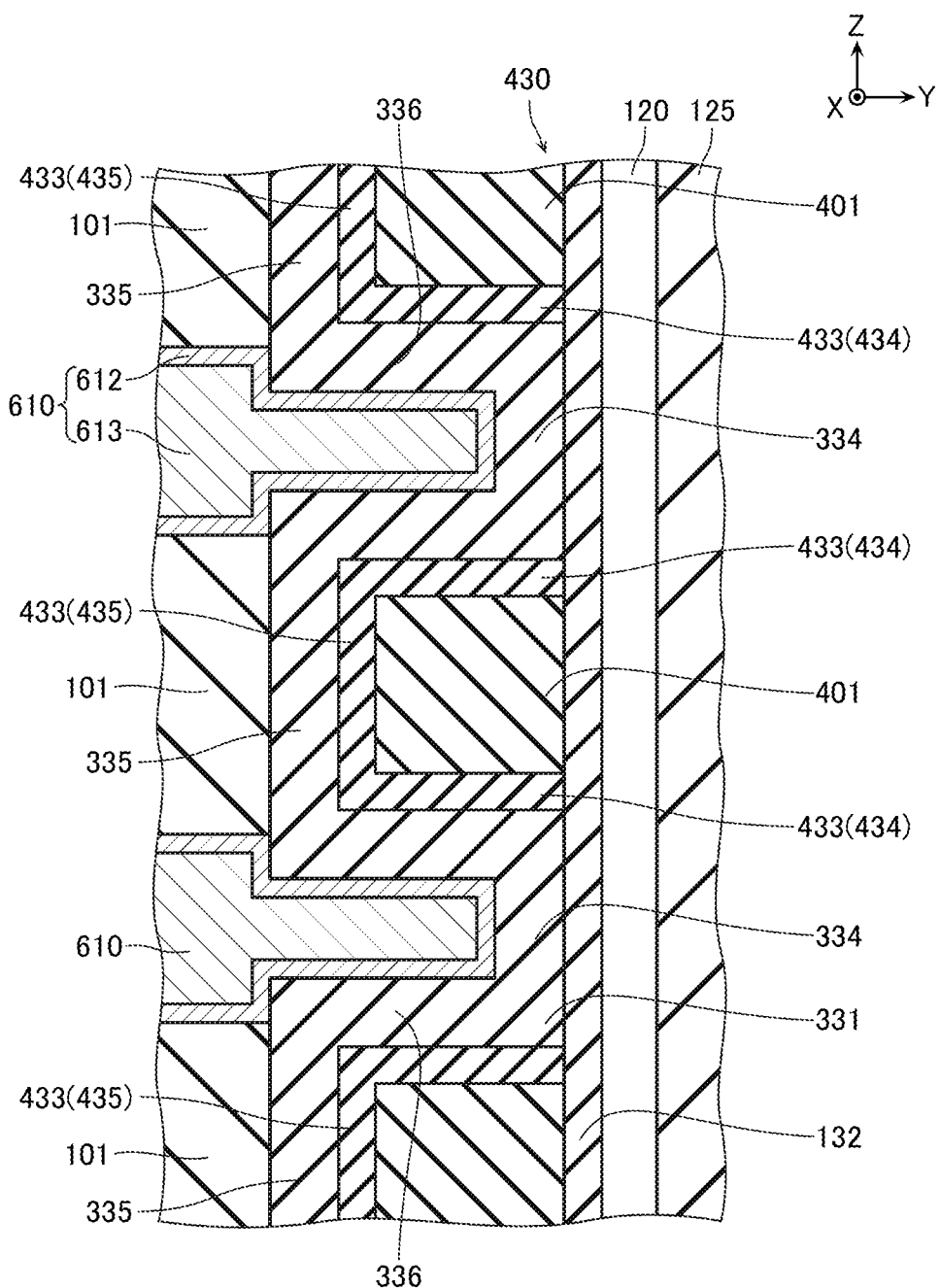
FIG. 41 is a schematic cross-sectional view illustrating a part of a configuration of a semiconductor memory device according to a seventh embodiment.

Next, with reference to FIG. 41, a semiconductor memory device according to the seventh embodiment will be described. FIG. 41 is a schematic cross-sectional view illustrating a part of a configuration of the semiconductor memory device according to the seventh embodiment.

The semiconductor memory device according to the seventh embodiment is basically configured similarly to the semiconductor memory device according to the fourth embodiment. However, the semiconductor memory device according to the seventh embodiment includes conductive layers 610 instead of the conductive layers 110.

Manufacturing Method

The semiconductor memory device according to the seventh embodiment is basically manufactured similarly to the semiconductor memory device according to the fourth embodiment.

However, in the manufacture of the semiconductor memory device according to the seventh embodiment, after performing the process described with reference to FIG. 34, the sacrifice layers 110A are partially removed before performing the process described with reference to FIG. 35. This process is performed by, for example, wet etching.

Eighth Embodiment

Configuration

Figure 42:
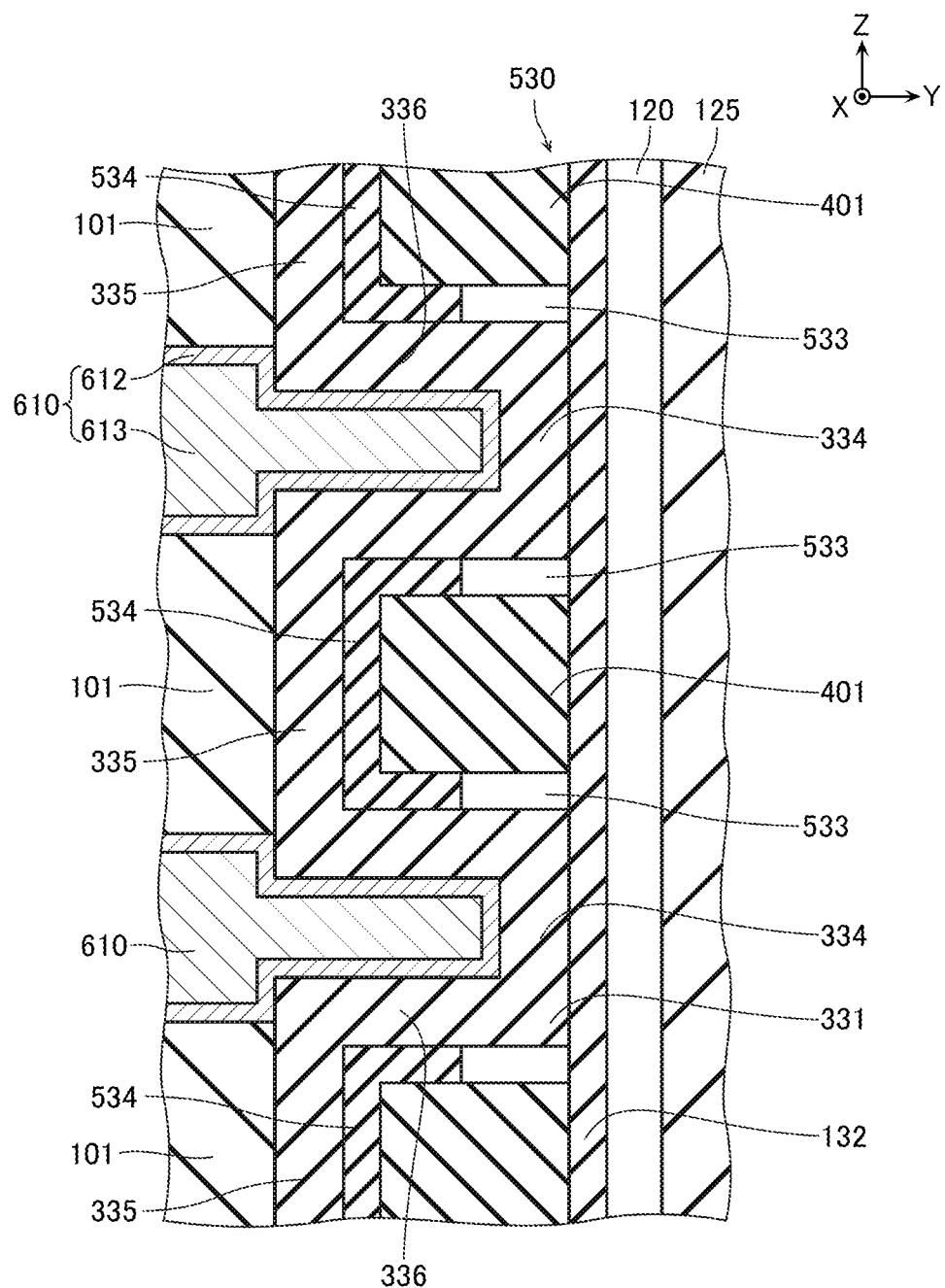
FIG. 42 is a schematic cross-sectional view illustrating a part of a configuration of a semiconductor memory device according to an eighth embodiment.

Next, with reference to FIG. 42, a semiconductor memory device according to the eighth embodiment will be described. FIG. 42 is a schematic cross-sectional view illustrating a part of a configuration of the semiconductor memory device according to the eighth embodiment.

The semiconductor memory device according to the eighth embodiment is basically configured similarly to the semiconductor memory device according to the fifth embodiment. However, the semiconductor memory device according to the eighth embodiment includes conductive layers 610 instead of the conductive layers 110.

Manufacturing Method

The semiconductor memory device according to the eighth embodiment is basically manufactured similarly to the semiconductor memory device according to the fifth embodiment.

However, in the manufacture of the semiconductor memory device according to the eighth embodiment, after performing the process described with reference to FIG. 34, the sacrifice layers 110A are partially removed before performing the process described with reference to FIG. 35. This process is performed by, for example, wet etching.

Ninth Embodiment

Configuration

Figure 43:
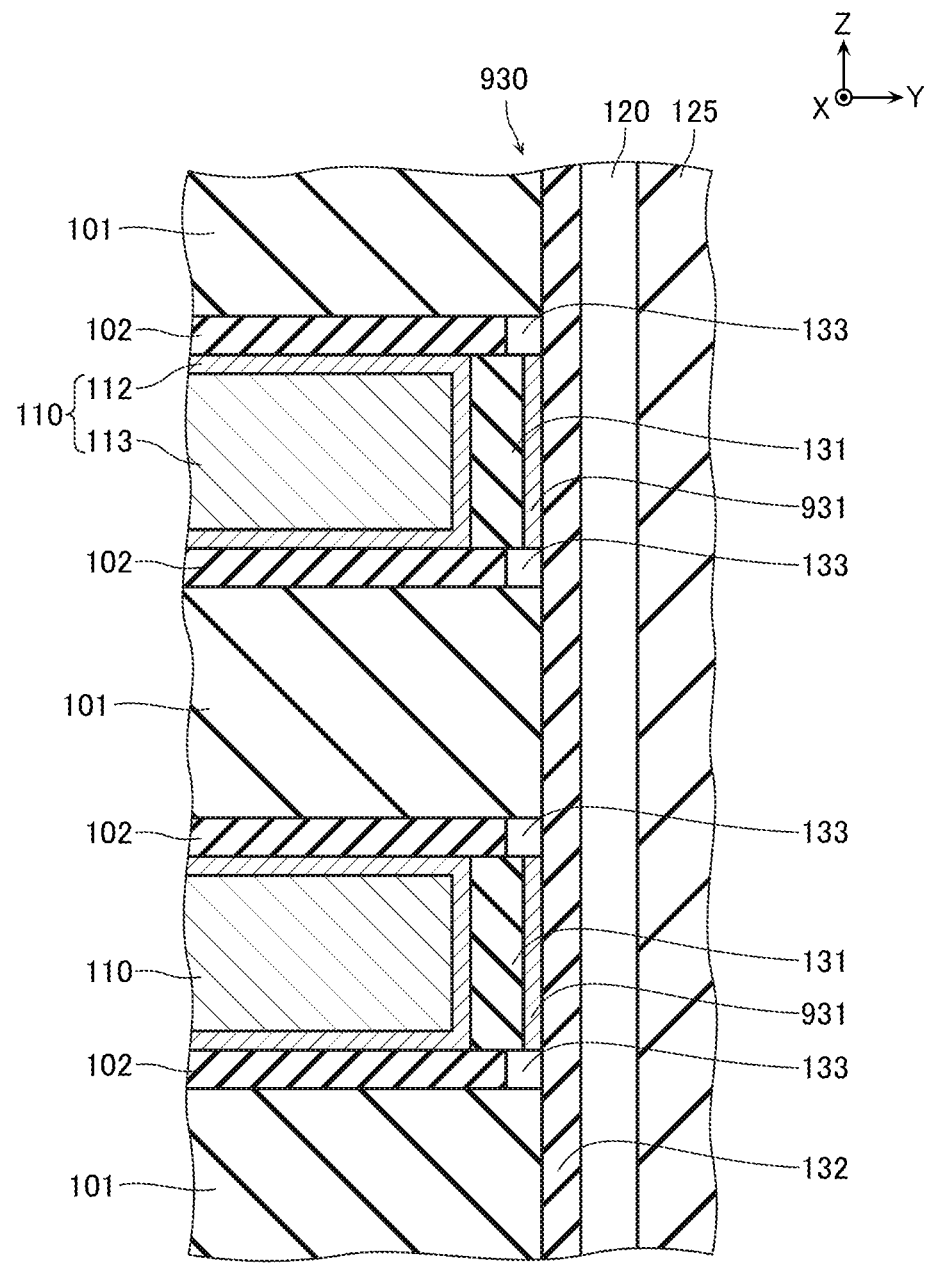
FIG. 43 is a schematic cross-sectional view illustrating a part of a configuration of a semiconductor memory device according to a ninth embodiment.

Next, with reference to FIG. 43, a semiconductor memory device according to the ninth embodiment will be described. FIG. 43 is a schematic cross-sectional view illustrating a part of a configuration of the semiconductor memory device according to the ninth embodiment.

The semiconductor memory device according to the ninth embodiment is basically configured similarly to the semiconductor memory device according to the first embodiment. However, the semiconductor memory device according to the ninth embodiment includes a gate insulating layer 930 instead of the gate insulating layer 130 (FIG. 4).

The gate insulating layer 930 is basically configured similarly to the gate insulating layer 130. However, the gate insulating layer 930 includes conductive layers 931.

In the illustrated example, the conductive layer 931 is in contact with the ferroelectric layer 131, the insulating layer 132, and the charge storage layers 133. The conductive layer 931 contains titanium nitride (TiN) or the like.

Here, the ferroelectric layer 131 contains a plurality of crystal grains in some cases. In this case, in the write operation and erase operation, the polarization inversion of the plurality of crystal grains occurs at different timings in some cases. In association with this, the tunneling current as described above is locally generated, thus storage the crystal defect in a part of the insulating layer 132 in some cases.

Therefore, in this embodiment, as described with reference to FIG. 43, the conductive layer 931 is disposed between the ferroelectric layer 131 and the insulating layer 132.

In this configuration, an equipotential surface is formed between the ferroelectric layer 131 and the insulating layer 132. Therefore, in the write operation and the erase operation, even when the polarization inversion of the plurality of crystal grains occurs at the different timings, the electrons accumulated in the charge storage layer 133 is supplied, thereby allowing reduction of locally generating the tunneling current as described above.

FIG. 43 illustrates an example in which the conductive layer 931 is disposed in the semiconductor memory device according to the first embodiment. However, this configuration is merely an example, and the conductive layer 931 can be disposed in the semiconductor memory devices according to the second embodiment to the eighth embodiment.

Figure 44:
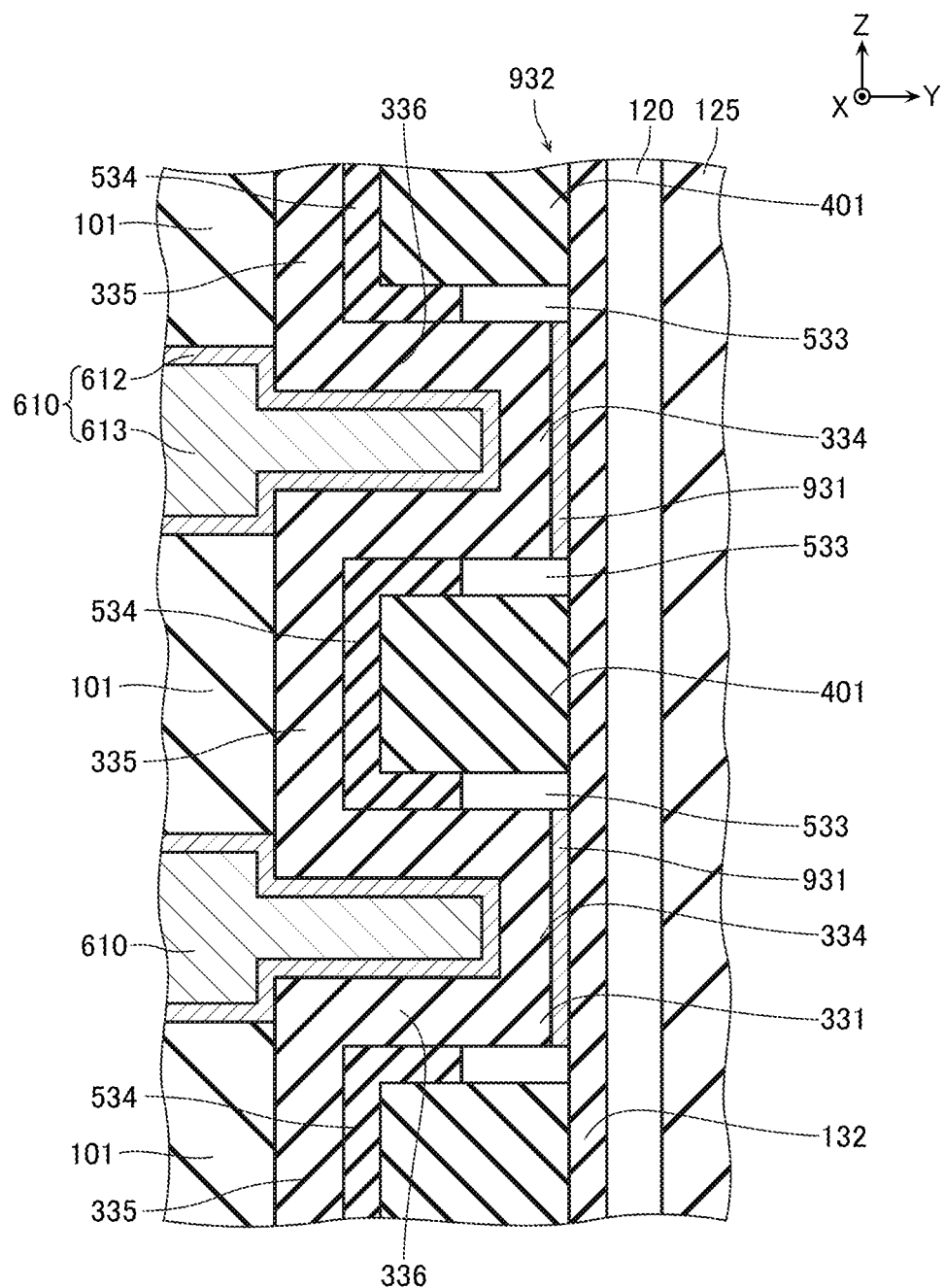
FIG. 44 is a schematic cross-sectional view illustrating a part of another exemplary configuration of the semiconductor memory device according to the ninth embodiment.

For example, FIG. 44 illustrates another exemplary configuration of the semiconductor memory device according to the ninth embodiment. The semiconductor memory device according to this exemplary configuration is basically configured similarly to the semiconductor memory device according to the eighth embodiment. However, the semiconductor memory device according to this exemplary configuration includes a gate insulating layer 932 instead of the gate insulating layer 530.

The gate insulating layer 932 is basically configured similarly to the gate insulating layer 530. However, the gate insulating layer 932 includes the conductive layers 931. In the illustrated example, the conductive layer 931 is in contact with the part 334 of the ferroelectric layer 331, the insulating layer 132, and the charge storage layers 533.

Other Embodiments

The semiconductor memory devices according to the first embodiment to the ninth embodiment have been described above. However, the above descriptions are merely examples, and the specific configuration and the like are adjustable as necessary.

For example, as described with reference to FIG. 40 to FIG. 42, the semiconductor memory devices according to the sixth embodiment to the eighth embodiment include the conductive layers 610 instead of the conductive layers 110. Here, all of these semiconductor memory devices each include the ferroelectric layer 331 extending in the Z-direction instead of the plurality of ferroelectric layers 131 (FIG. 4) arranged in the Z-direction. However, for example, as the semiconductor memory device according to the first embodiment (FIG. 4) and the semiconductor memory device according to the second embodiment (FIG. 31), also in the semiconductor memory device including the ferroelectric layers 131, the conductive layer 610 may be disposed instead of the conductive layer 110.

Figure 45:
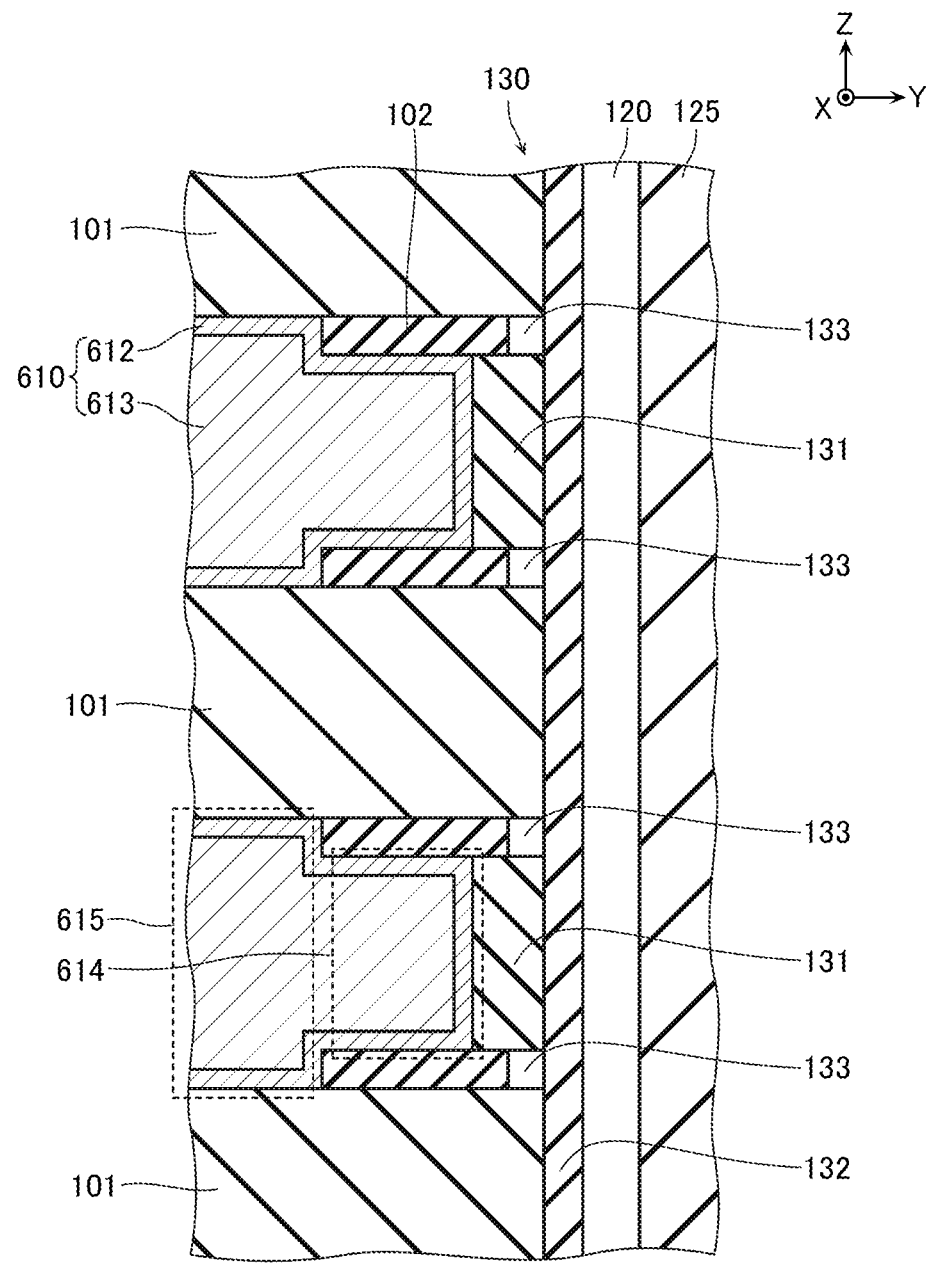
FIG. 45 is a schematic cross-sectional view illustrating a part of a configuration of a semiconductor memory device according to another embodiment.

For example, FIG. 45 illustrates an example in which the conductive layer 610 is disposed instead of the conductive layer 110 in the semiconductor memory device according to the first embodiment (FIG. 4). In the manufacture of this semiconductor memory device, for example, in the process corresponding to FIG. 14, the sacrifice layer 110A is removed up to a region corresponding to the part 614 of the conductive layer 610. Thus, in the process corresponding to FIG. 15, the ferroelectric layers 131B are formed in a region corresponding to the ferroelectric layer 131 and a region corresponding to the part 614. After the process corresponding to FIG. 23 and FIG. 24, under a condition in which the ferroelectric layer 131 is not removed, the insulating layer 102 is partially removed to expose the upper surface and the lower surface of the insulating layer 101. Thus, the cavity is formed in a region corresponding to the part 615 of the conductive layer 610. Next, a part of the ferroelectric layer 131 disposed in a region corresponding to the part 614 of the conductive layer 610 is removed. Then, by forming the conductive layer 610, the structure as illustrated in FIG. 45 can be achieved.

Figure 46:
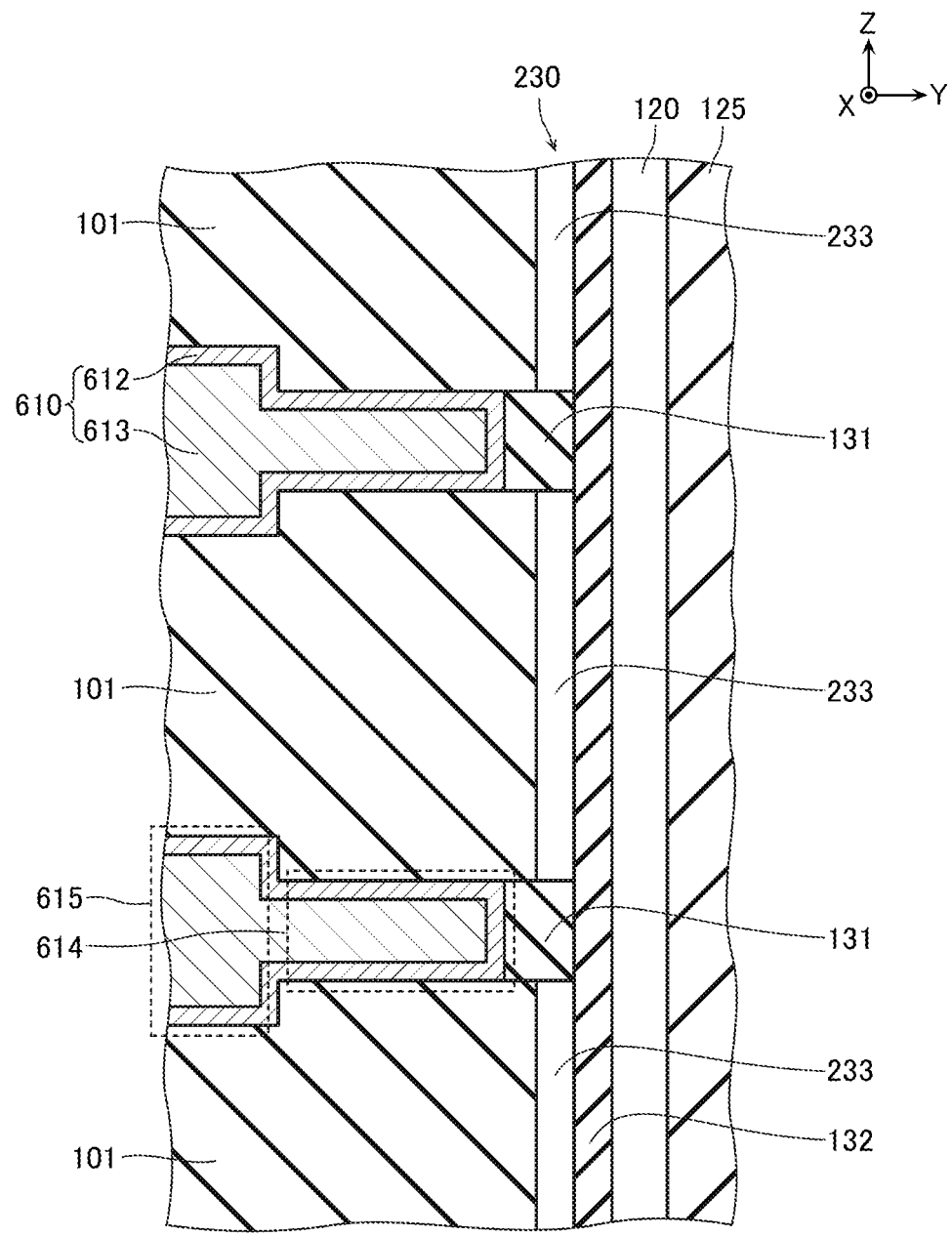
FIG. 46 is a schematic cross-sectional view illustrating a part of a configuration of a semiconductor memory device according to another embodiment.

For example, FIG. 46 illustrates an example in which the conductive layer 610 is disposed instead of the conductive layer 110 in the semiconductor memory device according to the second embodiment (FIG. 31). In the manufacture of this semiconductor memory device, for example, in the process corresponding to FIG. 14, the sacrifice layer 110A is removed up to a region corresponding to the part 614 of the conductive layer 610. Thus, in the process corresponding to FIG. 15, the ferroelectric layer 131B is formed in regions corresponding to the ferroelectric layers 131 and regions corresponding to the parts 614. After the process corresponding to FIG. 23 and FIG. 24, under a condition in which the ferroelectric layer 131 is not removed, the insulating layer 101 is partially removed. Thus, the cavity is formed in a region corresponding to the part 615 of the conductive layer 610. Next, a part of the ferroelectric layer 131 disposed in a region corresponding to the part 614 of the conductive layer 610 is removed. Then, by forming the conductive layer 610, the structure as illustrated in FIG. 46 can be achieved.

In the configurations as illustrated in FIG. 45 and FIG. 46, the conductive layer 931 as described with reference to FIG. 43 may be disposed.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first semiconductor layer extending in a first direction;
   a first conductive layer and a second conductive layer that are arranged in the first direction and each opposed to the first semiconductor layer;
   a first insulating portion disposed between the first semiconductor layer and the first conductive layer, the first insulating portion containing oxygen (O) and hafnium (Hf);

a second insulating portion disposed between the first semiconductor layer and the second conductive layer, the second insulating portion containing oxygen (O) and hafnium (Hf); and a first charge storage layer disposed between the first insulating portion and the second insulating portion, the first charge storage layer being spaced from the first conductive layer and the second conductive layer.

2. The semiconductor memory device according to claim 1, comprising:

a first insulating layer including the first insulating portion;

a second insulating layer that includes the second insulating portion and is spaced from the first insulating layer in the first direction;

a third insulating portion disposed between the first insulating layer and the first semiconductor layer; and a fourth insulating portion disposed between the second insulating layer and the first semiconductor layer.

3. The semiconductor memory device according to claim 2, comprising a second charge storage layer that is disposed between the first insulating portion and the second insulating portion, spaced from the first conductive layer and the second conductive layer, and spaced from the first charge storage layer in the first direction, wherein the first charge storage layer is in contact with the first insulating layer and the third insulating portion, and the second charge storage layer is in contact with the second insulating layer and the fourth insulating portion.

4. The semiconductor memory device according to claim 2, wherein the first charge storage layer is in contact with the first insulating layer, the second insulating layer, the third insulating portion, and the fourth insulating portion.

5. The semiconductor memory device according to claim 2, comprising:

a third conductive layer disposed between the first insulating layer and the third insulating portion; and a fourth conductive layer disposed between the second insulating layer and the fourth insulating portion.

6. The semiconductor memory device according to claim 1, comprising:

a third insulating layer including the first insulating portion and the second insulating portion;

a third insulating portion disposed between the first insulating portion and the first semiconductor layer; and a fourth insulating portion disposed between the second insulating portion and the first semiconductor layer.

7. The semiconductor memory device according to claim 6, comprising a second charge storage layer that is disposed between the first insulating portion and the second insulating portion, spaced from the first conductive layer and the second conductive layer, and spaced from the first charge storage layer in the first direction, wherein the first charge storage layer is in contact with the third insulating layer and the third insulating portion, and the second charge storage layer is in contact with the third insulating layer and the fourth insulating portion.

8. The semiconductor memory device according to claim 6, wherein the first charge storage layer is in contact with the third insulating layer, the third insulating portion, and the fourth insulating portion.

9. The semiconductor memory device according to claim 6, comprising:

a third conductive layer disposed between the third insulating layer and the third insulating portion; and a fourth conductive layer disposed between the third insulating layer and the fourth insulating portion.

10. The semiconductor memory device according to claim 1, wherein the first conductive layer includes:

a first part having a distance from the first semiconductor layer smaller than a predetermined amount; and a second part having a distance from the first semiconductor layer larger than the predetermined amount, wherein a thickness of the first part in the first direction is smaller than a thickness of the second part in the first direction.

11. The semiconductor memory device according to claim 1, comprising a substrate, wherein the first direction intersects with a surface of the substrate.

12. The semiconductor memory device according to claim 1, wherein the first insulating portion and the second insulating portion include a orthorhombic crystal as a crystalline structure.

13. The semiconductor memory device according to claim 1, wherein the first charge storage layer includes a floating gate.

14. The semiconductor memory device according to claim 1, wherein the first charge storage layer is an insulating charge storage layer.

15. The semiconductor memory device according to claim 1, comprising a first wiring electrically connected to the first semiconductor layer, wherein the semiconductor memory device is configured to be able to perform a read operation, a write operation, an erase operation, and a first operation, in the erase operation, a first voltage is applied to the first conductive layer, and an erase voltage larger than the first voltage is applied to the first wiring, in the first operation, the first voltage is applied to the first conductive layer, and a second voltage larger than the first voltage and smaller than the erase voltage is applied to the first wiring, and the first operation is executed after executing the write operation to a memory cell corresponding to the first conductive layer before executing the read operation to the memory cell.

* * * * *